United States Patent
Tanaka et al.

(10) Patent No.: US 9,318,706 B2
(45) Date of Patent: Apr. 19, 2016

(54) LAMINATED STRUCTURE, METHOD FOR PRODUCING SAME, AND ELECTRONIC ELEMENT COMPRISING SAME

(75) Inventors: Kenta Tanaka, Tsukuba (JP); Rui Ishikawa, Chikusei (JP); Tomohisa Temma, Shibukawa (JP); Hideyuki Higashimura, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 1081 days.

(21) Appl. No.: 13/056,475

(22) PCT Filed: Jul. 29, 2009

(86) PCT No.: PCT/JP2009/063458
§ 371 (c)(1),
(2), (4) Date: Jan. 28, 2011

(87) PCT Pub. No.: WO2010/013725
PCT Pub. Date: Feb. 4, 2010

(65) Prior Publication Data
US 2011/0177312 A1 Jul. 21, 2011

(30) Foreign Application Priority Data

Jul. 30, 2008 (JP) .................... 2008-195760
Oct. 29, 2008 (JP) .................... 2008-278618

(51) Int. Cl.
| | | |
|---|---|---|
| B32B 15/08 | (2006.01) |
| B05D 5/12 | (2006.01) |
| H01L 51/00 | (2006.01) |
| H01M 4/137 | (2010.01) |
| H01M 4/1399 | (2010.01) |
| H01M 4/60 | (2006.01) |
| H05B 33/26 | (2006.01) |
| H01L 51/50 | (2006.01) |
| H01L 51/52 | (2006.01) |

(52) U.S. Cl.
CPC ........ *H01L 51/0039* (2013.01); *H01L 51/0035* (2013.01); *H01L 51/0067* (2013.01); *H01M 4/137* (2013.01); *H01M 4/1399* (2013.01); *H01M 4/60* (2013.01); *H01M 4/606* (2013.01); *H05B 33/26* (2013.01); *H01L 51/5048* (2013.01); *H01L 51/5088* (2013.01); *H01L 51/5203* (2013.01); *Y02E 60/122* (2013.01); *Y02P 70/54* (2015.11); *Y10T 428/24975* (2015.01); *Y10T 428/31692* (2015.04); *Y10T 428/31855* (2015.04)

(58) Field of Classification Search
USPC .................. 428/216, 500, 461
See application file for complete search history.

(56) References Cited

U.S. PATENT DOCUMENTS

| 3,444,142 A | 5/1969 | Kolyer et al. | |
|---|---|---|---|
| 3,478,025 A | 11/1969 | Kolyer et al. | |
| 6,456,003 B1 | 9/2002 | Mori et al. | |
| 6,569,544 B1* | 5/2003 | Alain et al. | 428/690 |
| 2002/0193532 A1* | 12/2002 | Ikehira | C08G 61/02 525/333.3 |
| 2004/0109955 A1* | 6/2004 | Kitano | C08G 61/12 428/1.1 |
| 2006/0158106 A1 | 7/2006 | Morii | |
| 2007/0195576 A1 | 8/2007 | Imada et al. | |
| 2007/0289628 A1 | 12/2007 | Sohn et al. | |
| 2009/0091249 A1* | 4/2009 | Yamaguchi et al. | 313/504 |
| 2010/0069603 A1 | 3/2010 | Tanaka et al. | |

FOREIGN PATENT DOCUMENTS

| GB | 1183946 A | 3/1970 |
|---|---|---|
| JP | 02-293181 A | 12/1990 |
| JP | 08-279626 A | 10/1996 |

(Continued)

OTHER PUBLICATIONS

Machine_English_Translation_JP_2006344741_A; Tamura, Tatsuhiko; Organic Solar Cell and Its Manufacturing Method; Dec. 21, 2006; JPO; whole document.*

Int'l Search Report issued on Oct. 27, 2009 in Int'l Application No. PCT/JP2009/063458.

(Continued)

*Primary Examiner* — Tahseen N Khan
(74) *Attorney, Agent, or Firm* — Panitch Schwarze Belisario & Nadel LLP

(57) ABSTRACT

A laminated structure comprising an electrode, a polymer binding layer arranged on the electrode, and an electrically conductive organic material layer arranged on the polymer binding layer, wherein the polymer binding layer comprises an aromatic polymeric compound which has a structure represented by formula (I) [wherein Ar represents a conjugated divalent group which may have a substituent, provided that when there are multiple Ar's, the Ar's may be the same as or different from each other; and n represents an integer of 1 or greater] and has a number average molecular weight of $1\times10^3$ to $1\times10^8$ inclusive in terms of polystyrene content, the polymer binding layer is bonded to the electrode via a chemical bond between the aromatic polymeric compound and the surface of the electrode, and an electrically conductive organic material that composes a layer included in the electrically conductive organic material layer and arranged adjacent to the polymer binding layer has a number average molecular weight of $3\times10^2$ to $1\times10^8$ inclusive in terms of polystyrene content.

$$-\!\!\left(\mathrm{Ar}\right)_{\!n}\!\!- \qquad\qquad (\mathrm{I})$$

18 Claims, No Drawings

(56) References Cited

FOREIGN PATENT DOCUMENTS

| | | | |
|---|---|---|---|
| JP | 09-324176 A | | 12/1997 |
| JP | 2000-223278 A | | 8/2000 |
| JP | 2001-512145 A | | 8/2001 |
| JP | 2004-307740 A | | 11/2004 |
| JP | 2005-216677 A | | 8/2005 |
| JP | 2005-310469 A | | 11/2005 |
| JP | 2005-353401 A | | 12/2005 |
| JP | 2006-013478 A | | 1/2006 |
| JP | 2006-032689 A | | 2/2006 |
| JP | 2006-196376 A | | 7/2006 |
| JP | 2006-294933 A | | 10/2006 |
| JP | 2006-344741 A | | 12/2006 |
| JP | 2006344741 A | * | 12/2006 |
| JP | 2007-103174 A | | 4/2007 |
| JP | 2008-004550 A | | 1/2008 |
| JP | 2009-019186 A | | 1/2009 |
| WO | 2005/117157 A1 | | 12/2005 |

OTHER PUBLICATIONS

Beinhoff et al, "Patterned polyfluorene Surfaces by Functionalization of Nanoimprinted Polymeric Features", Langmuir, vol. 22, No. 6, pp. 2411-2414, (2006).

Hanson et al, "Advanced Surface Modification of indium Tin Oxide for Improved Charge Injection in Organic Devices", J. Am. Chem. Soc., vol. 127, pp. 10058-10062, (2005).

Hatton et al., "Enhanced holeinjection in organic light-emitting diodes using a SAM-derivatised ultra-thin gold anode supported on ITO glass", J. Mater. Chem., vol. 13, pp. 38-43, (2003).

Office Action issued Aug. 29, 2012 in CN Application No. 200980133486.3.

Office Action issued Aug. 26, 2014 in JP Application No. 2009-172943.

Yoshino et al, "Polymer Electronics—Conducting Polymer and Electronic Optical Functional Device using it," Corona Publishing Co., Ltd., 1st Ed., pp. 9-10 (1996).

* cited by examiner

LAMINATED STRUCTURE, METHOD FOR PRODUCING SAME, AND ELECTRONIC ELEMENT COMPRISING SAME

CROSS-REFERENCE TO RELATED APPLICATION

This application is a Section 371 of International Application No. PCT/JP2009/063458, filed Jul. 29, 2009, which was published in the Japanese language on Feb. 4, 2010, under International Publication No. WO 2010/013725 A1, and the disclosure of which is incorporated herein by reference.

TECHNICAL FIELD

The present invention relates to a laminated structure used in electroluminescent devices, photoelectric conversion devices and the like.

BACKGROUND ART

In order to improve the characteristics of an electroluminescent device comprising a laminated structure, the insertion of a binding layer of an aromatic organic compound chemically bonded to the surface of an electrode into a conductive organic material layer and the electrode has been studied. For example, there has been known a laminated structure, in which a binding layer having a triphenylamine skeleton or a thiophene skeleton, which has a group capable of being chemically bonded to a reactive group which is present on the surface of an anode, has been inserted between the anode and a conductive organic material layer (Patent Literature 1, Non Patent Literature 1, and Non Patent Literature 2).

However, these aromatic organic compounds are all low molecular weight compounds or oligomeric compounds each having a polystyrene equivalent number average molecular weight of less than 1000, and their molecular chain length is 5 nm or less. Thus, in a case in which such a compound having a small degree of polymerization is used, since the compound becomes crystallized when a binding layer chemically bonded to the surface of an electrode is produced, it is difficult to produce a uniform binding layer with good reproducibility. Accordingly, the above-mentioned aromatic organic compounds have been problematic in that it requires a high voltage for driving electroluminescent devices and high power consumption.

CITATION LIST

Patent Literature

Patent Literature 1: JP 2005-310469 A

Non Patent Literatures

Non Patent Literature 1: J. Am. Chem. Soc., 2005, vol. 127, pp. 10058-10062
Non Patent Literature 2: J. Mater. Chem., 2003, vol. 13, pp. 38-43

SUMMARY OF INVENTION

Problem to the Solved by the Invention

The present invention has been made to solve the aforementioned problems of the prior art, and thus, it is an object of the present invention to provide a laminated structure, which realizes a low voltage for driving electroluminescent devices and low power consumption.

Means for Solving the Problem

As a result of intensive studies directed towards achieving the aforementioned object, the present inventors have found that a polymer binding layer composed of an aromatic polymer compound having a specific number average molecular weight and being capable of being chemically bonded to the surface of an electrode can be inserted between the electrode and a conductive organic material layer in a laminated structure so that the obtained laminated structure may improve the characteristics of electroluminescent devices or photoelectric conversion devices, thereby completing the present invention.

Specifically, the laminated structure of the present invention comprises an electrode, a polymer binding layer disposed on the electrode, and a conductive organic material layer disposed on the polymer binding layer, wherein the polymer binding layer is composed of an aromatic polymer compound having a structure represented by the following formula (I):

wherein Ar is a conjugated divalent group optionally having a substituent, and if a plurality of Ar are present, the Ar may be identical to or different from one another; and n is an integer of 1 or greater, and having a polystyrene equivalent number average molecular weight of $1 \times 10^3$ or more and $1 \times 10^8$ or less, the polymer binding layer is connected to the electrode via a chemical bond between the aromatic polymer compound and the surface of the electrode (hereinafter also referred to as "Electrode Surface"), and a conductive organic material which constitutes a layer in the conductive organic material layer adjacent to the polymer binding layer has a polystyrene equivalent number average molecular weight of $3 \times 10^2$ or more and $1 \times 10^8$ or less.

In the laminated structure of the present invention, it is preferable that the film thickness of the polymer binding layer be from 0.1 nm to 100 μm, and that the film thickness of the layer in the conductive organic material layer adjacent to the polymer binding layer be from 0.1 nm to 1 cm.

In addition, it is preferable that the orbital energy of the lowest unoccupied molecular orbital (LUMO) of the aromatic polymer compound be −4.0 eV or more and −0.5 eV or less, and/or that the orbital energy of the highest occupied molecular orbital (HOMO) of the aromatic polymer compound be −6.0 eV or more and −4.0 eV or less; and it is also preferable that the difference between the orbital energy of the LUMO of the aromatic polymer compound and the orbital energy of the LUMO of the conductive organic material which constitutes the layer in the conductive organic material layer adjacent to the polymer binding layer be −2.5 eV or more and +2.5 eV or less, and/or that the difference between the orbital energy of the HOMO of the aromatic polymer compound and the orbital energy of the HOMO of the conductive organic material which constitutes the layer in the conductive organic material layer adjacent to the polymer binding layer be −1.5 eV or more and +1.5 eV or less.

In the laminated structure of the present invention, preferably, the terminal group of the aromatic polymer compound is chemically bonded to a reactive group which is present on the Electrode Surface, and the above described electrode preferably comprises at least one electroconductive compound selected from the group consisting of a base metal, a noble metal and an oxide thereof.

The polymer binding layer is preferably formed by immersing the electrode in a solution containing a conjugated polymer represented by the following formula (II) at a concentration of 0.0001% by mass or more, and/or by coating the electrode with the solution:

(II)

wherein $Ar^1$ is a divalent group having an aromatic ring; G is an r+p valent group having an aromatic ring; r is a terminal group; r is an integer of 1 or greater and 10 or smaller, n and p are each independently an integer of 1 or greater, and if r is 2 or greater, the plurality of $E^a$ present may be identical to or different from one another, and if n is 2 or greater, the plurality of $Ar^1$ present may be identical to or different from one another, and if p is 2 or greater, the plurality of $X^1$ present may be identical to or different from one another, wherein $E^a$ is a monovalent group selected from the group consisting of a mercapto group, a hydroxy group, a carboxyl group, a sulfonic acid group, a phosphonic acid group, a trialkoxysilyl group, a trihydroxysilyl group, a chlorocarbonyl group, a chlorophosphonic acid group, a chlorosulfonic acid group, a cyanate group, an isocyanate group, an amino group, a substituted amino group, and a substituted disulfide group.

Moreover, it is also preferable that, in a solution, in the presence of the electrode, to the surface of which a group represented by the following formula (III) is bonded:

(III)

wherein G is an r+p valent group having an aromatic ring; $X^a$ is a halogen atom or a group represented by $—SO_3Q^a$ (wherein $Q^a$ represents an alkyl group or an aryl group, and the alkyl group and the aryl group may optionally have a substituent); r is an integer of 1 or greater and 10 or smaller, p is an integer of 1 or greater, and if p is 2 or greater, the plurality of $X^a$ present may be identical to or different from one another; E is a binding group formed by the chemical bond between a monovalent group selected from the group consisting of a mercapto group, a hydroxy group, a carboxyl group, a sulfonic acid group, a phosphonic acid group, a trialkoxysilyl group, a trihydroxysilyl group, a chlorocarbonyl group, a chlorophosphonic acid group, a chlorosulfonic acid group, a cyanate group, an isocyanate group, an amino group, a substituted amino group and a substituted disulfide group, and a reactive group which is present on the Electrode Surface, the polymer binding layer be formed by polycondensing an aromatic compound represented by the following formula (IV):

$M-Ar^1-M$ (IV)

wherein $Ar^1$ is a divalent group having an aromatic ring; M is a halogen atom, a hydrogen atom, or a group represented by $—B(OQ^1)_2$ (wherein $Q^1$ are each independently a hydrogen atom, an alkyl group or an aryl group, or may be bonded to each other to form a ring, and the alkyl group and the aryl group may optionally have a substituent), $—Si(Q^2)_3$ (wherein $Q^2$ is an alkyl group or an alkoxy group, and the alkyl group and the alkoxy group may optionally have a substituent), $—Sn(Q^3)_3$ (wherein $Q^3$ is an alkyl group optionally having a substituent) or $—Z^1(Z^2)_m$ (wherein $Z^1$ is a metallic atom or a metallic ion, $Z^2$ is a counteranion), wherein the two M present may be identical to or different from each other, using a polymerization catalyst or an equivalently reactive reactant.

Furthermore, it is also preferable that the polymer binding layer have a structure represented by the following formula (V):

(V)

wherein $Ar^1$ is a divalent group having an aromatic ring; G is an r+p valent group having an aromatic ring; $X^1$ is a terminal group; r is an integer of 1 or greater and 10 or smaller, n and p are each independently an integer of 1 or greater, and if r is 2 or greater, the plurality of E present may be identical to or different from one another, and if n is 2 or greater, the plurality of $Ar^1$ present may be identical to or different from one another, and if p is 2 or greater, the plurality of $X^1$ present may be identical to or different from one another, wherein E is a binding group formed by the chemical bond between a monovalent group selected from the group consisting of a mercapto group, a hydroxy group, a carboxyl group, a sulfonic acid group, a phosphonic acid group, a trialkoxysilyl group, a trihydroxysilyl group, a chlorocarbonyl group, a chlorophosphonic acid group, a chlorosulfonic acid group, a cyanate group, an isocyanate group, an amino group, a substituted amino group and a substituted disulfide group, and a reactive group which is present on the Electrode Surface.

The binding group E in the formula (V) is preferably a binding group formed by at least one selected from the group consisting of a covalent bond, a coordinate bond, a hydrogen bond and an ionic bond, which are formed between the monovalent group and the reactive group which is present on the Electrode Surface; and the monovalent group is preferably a monovalent group selected from the group consisting of a mercapto group, a carboxyl group, a sulfonic acid group, a phosphonic acid group, a chlorocarbonyl group, a chlorophosphonic acid group and a chlorosulfonic acid group.

G in the formula (V) is preferably at least one r+p valent group selected from the group consisting of a monocycle optionally having a substituent, a condensed ring optionally having a substituent, a ring assembly optionally having a substituent, and a bridged polycycle optionally having a substituent; and the r+p valent group more preferably comprises at least one from among heterocyclic rings and aromatic rings represented by the following formulae (1) to (16):

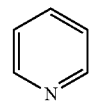
1

2 

3 

4 

5 

6 

7 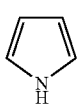

8 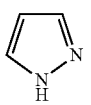

9 

10 

11 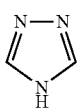

12 

13 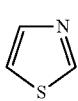

14 

15 

16 

and the r+p valent group particularly preferably comprises one heterocyclic ring represented by the formula (5).

In the laminated structure of the present invention, r in the formula (V) is preferably an integer of 1 or greater and 3 or smaller (provided that if G in the formula (V) is a monocyclic aromatic ring structure and the number of carbon atoms that constitute the ring structure is 2, r is 1, and if the number of the carbon atoms is 3, r is 1 or 2).

It is preferable that $Ar^1$ in the formula (V) comprise a repeating unit represented by the following formula (VI):

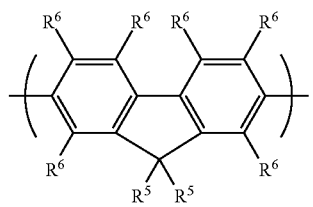

(VI)

wherein $R^5$ is a hydrogen atom, an alkyl group, an aryl group, an arylalkyl group or a monovalent heterocyclic group, wherein the alkyl group, the aryl group, the arylalkyl group and the monovalent heterocyclic group each may optionally have a substituent; and $R^6$ is a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, a carbamoyl group, an imide residue, a monovalent heterocyclic group, a carboxyl group, a substituted carboxyl group or a cyano group, wherein the alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the acyl group, the acyloxy group, the carbamoyl group and the monovalent heterocyclic group each may optionally have a substituent, wherein the plurality of $R^5$ and $R^6$ present may be identical to or different from one another, and if $R^5$ and $R^6$, which are alkyl groups optionally having a substituent, are each present in a plural number, they may be bonded to each other to form a ring in an amount of 0.1% by mass or more with respect to the total mass of the number of all repeating units in the aromatic polymer compound which constitutes the polymer binding layer, and/or that comprise a repeating unit represented by the following formula (VII):

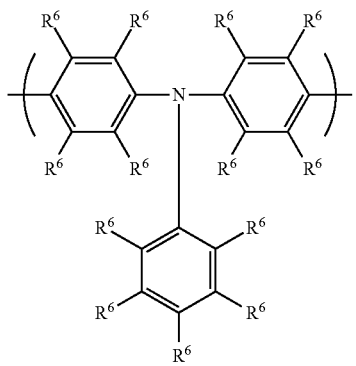

(VII)

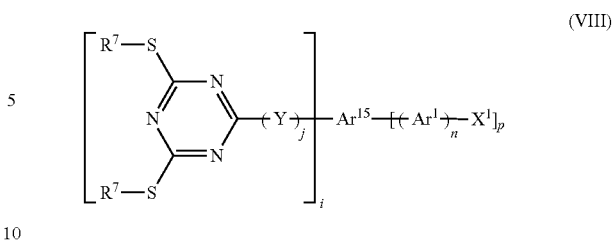

(VIII)

wherein R⁶ has the same definitions as those of R⁶ in the formula (VI):

in an amount of 0.1% by mass or more with respect to the total mass of the number of all repeating units in the aromatic polymer compound which constitutes the polymer binding layer.

In the laminated structure of the present invention, a total of the molar percentage of the repeating unit represented by the formula (VI) and the molar percentage of the repeating unit represented by the formula (VII) is preferably 10 mole % or more and 100 mole % or less, with respect to a total of all repeating units in the aromatic polymer compound which constitutes the polymer binding layer.

The method for producing a laminated structure of the present invention comprises:

a step of forming, on an electrode, a polymer binding layer, which is composed of an aromatic polymer compound having a structure represented by the following formula (I):

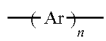

(I)

wherein Ar is a conjugated divalent group optionally having a substituent, and if a plurality of Ar are present, the Ar may be identical to or different from one another; and n is an integer of 1 or greater and having a polystyrene equivalent number average molecular weight of $1\times10^3$ or more and $1\times10^8$ or less, wherein the aromatic polymer compound is chemically bonded to the Electrode Surface, and a step of forming a layer composed of a conductive organic material having a polystyrene equivalent number average molecular weight of $3\times10^2$ or more and $1\times10^8$ or less on the polymer binding layer.

The electronic device of the present invention comprises the laminated structure of the present invention, and it is used, for example, as an electroluminescent device or a photoelectric conversion device.

The conjugated polymer of the present invention is represented by the following formula (VIII):

wherein Ar¹ is a divalent group having an aromatic ring; X¹ is a terminal group; n represents an integer of 1 or greater; Ar¹⁵ is an i+p valent group having an aromatic ring, wherein i and p are each independently an integer of 1 or greater, and i+p is 2 or greater and 20 or smaller; Y is an oxygen atom, a sulfur atom, an imino group, a substituted imino group, an ethenylene group, a substituted ethenylene group or an ethynylene group; j is 0 or 1; and R⁷ is a hydrogen atom, an alkyl group, an alkylthio group, an aryl group, an arylthio group, an arylalkyl group, an arylalkylthio group, an arylalkenyl group, an arylalkynyl group, a silyl group, a substituted silyl group, an acyl group or a monovalent heterocyclic group, wherein the alkyl group, the alkylthio group, the aryl group, the arylthio group, the arylalkyl group, the arylalkylthio group, the arylalkenyl group, the arylalkynyl group, the acyl group and the monovalent heterocyclic group each may optionally have a substituent, wherein two R⁷ may be identical to or different from each other, or may be bonded to each other to form a ring; and it can be preferably used to form the polymer binding layer in the laminated structure of the present invention.

In addition, the conjugated compound of the present invention is represented by the following formula (IX):

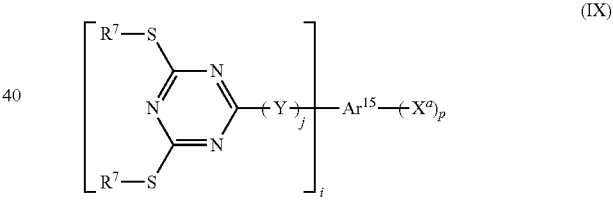

(IX)

wherein Ar¹⁵ is an i+p valent group having an aromatic ring, wherein i and p are each independently an integer of 1 or greater, and i+p is 2 or greater and 20 or smaller; $X^a$ is a halogen atom or a group represented by $-SO_3Q^a$ (wherein $Q^a$ is an alkyl group optionally having a substituent); Y is an oxygen atom, a sulfur atom, an imino group, a substituted imino group, an ethenylene group, a substituted ethenylene group or an ethynylene group; j is 0 or 1; and R⁷ is a hydrogen atom, an alkyl group, an alkylthio group, an aryl group, an arylthio group, an arylalkyl group, an arylalkylthio group, an arylalkenyl group, an arylalkynyl group, a silyl group, a substituted silyl group, an acyl group or a monovalent heterocyclic group, wherein the alkyl group, the alkylthio group, the aryl group, the arylthio group, the arylalkyl group, the arylalkylthio group, the arylalkenyl group, the arylalkynyl group, the acyl group and the monovalent heterocyclic group each may optionally have a substituent, wherein two R⁷ may be identical to or different from each other, or may be bonded to each other to form a ring; and it can be preferably used to form the polymer binding layer in the laminated structure of the present invention, and it is particularly effectively used as a raw material substance of the conjugated polymer represented by the formula (II). Moreover, it is also effective to bond the conjugated compound represented by the formula (IX) onto the surface of an electrode, and using this compound as a starting point, to polycondense the aromatic compound represented by the formula (IV) using a polymerization catalyst or an equivalently reactive reactant.

Advantages of the Invention

Using the laminated structure of the present invention, an electroluminescent device, which requires a low voltage for driving it and low power consumption can be obtained. In addition, using the conjugated polymer or conjugated compound of the present invention, a polymer binding layer, which constitutes such a laminated structure, can be formed.

Mode For Carrying Out The Invention

Hereinafter, the present invention will be described in detail in the following preferred embodiments.

First, the laminated structure of the present invention will be described. The laminated structure of the present invention comprises an electrode, a polymer binding layer, which is disposed on the electrode, is composed of an aromatic polymer compound having a specific molecular weight and is connected via a chemical bond between the aromatic polymer compound and the surface of the electrode, and a layer consisting of a conductive organic material having a specific molecular weight, which is disposed on the polymer binding layer.

<Electrode>

The electrode used in the present invention includes those comprising an electroconductive compound such as a metal, an alloy, a metal oxide, a metal sulfide or a metal halide. The aforementioned metal includes a base metal, a noble metal, an alkaline metal and an alkaline-earth metal. An example of the aforementioned alloy is an alloy containing one or more of the above described metals. The aforementioned metal oxide, metal sulfide and metal halide include the oxide, carbonate, complex oxide, sulfide and halide of the above described metals. These electroconductive compounds may be used singly or in combination of two or more. Among others, a base metal, a noble metal and an oxide thereof are preferable; aluminum, chromium, copper, gold, silver, platinum and indium tin oxide (ITO), indium zinc oxide, molybdenum oxide and aluminum oxide are more preferable; and aluminum, silver and indium tin oxide (ITO) are further preferable. Moreover, the above described electrode may have a monolayer structure consisting of one or two or more materials, or a multilayer structure consisting of multiple layers having a single composition or a heterogeneous composition.

<Conductive Organic Material Layer>

The conductive organic material layer used in the present invention includes a hole injection layer, a hole transport layer, an interlayer, a luminescent layer, an electron transport layer, a hole-blocking layer, an electron injection layer, a layer containing an electron-donating compound and a layer containing an electron-accepting compound, which will be described later. Such a conductive organic material layer is composed of a conductive organic material.

As such a conductive organic material, there is an aromatic polymer compound having a structure represented by the following formula (X):

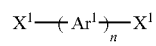

In the laminated structure of the present invention, the conductive organic material layer may have a monolayer structure consisting of one or two or more such conductive organic materials, or a multilayer structure consisting of multiple layers having a single composition or a heterogeneous composition.

In the formula (X), $Ar^1$ is a divalent group having an aromatic ring; $X^1$ is a terminal group, and the two $X^1$ present may be identical to or different from each other; n is an integer of 1 or greater, preferably an integer of 1 or greater and $1 \times 10^6$ or smaller, and more preferably an integer of 1 or greater and $1 \times 10^5$ or smaller. In addition, the aforementioned $X^1$ is bonded to carbon atoms which constitute the aromatic ring in the $Ar^1$. Examples of such $X^1$ include a halogen atom, a nitro group, a group represented by $-SO_3Q^a$ (wherein $Q^a$ represents an alkyl group optionally having a substituent or an aryl group optionally having a substituent), an alkyl group optionally having a substituent, and an aryl group optionally having a substituent.

In the laminated structure of the present invention, the polystyrene equivalent number average molecular weight of a conductive organic material which constitutes a layer in the conductive organic material layer adjacent to the polymer binding layer is $3 \times 10^2$ or more and $1 \times 10^8$ or less. If this number average molecular weight becomes less than the above described lower limit, the crystallinity of the conductive organic material becomes high, and thus it becomes difficult to form a uniform layer with good reproducibility. On the other hand, if the number average molecular weight exceeds the above described upper limit, the conductive organic material is hardly dissolved in an organic solvent, and thus, it becomes difficult to handle it. In the present invention, from the aforementioned viewpoints, the polystyrene equivalent number average molecular weight of the conductive organic material is preferably $5 \times 10^2$ or more and $1 \times 10^8$ or less, and more preferably $1 \times 10^3$ or more and $1 \times 10^7$ or less.

In the present invention, when the conductive organic material layer has a monolayer structure, the description "a layer in the conductive organic material layer adjacent to the polymer binding layer" means the conductive organic material layer itself. On the other hand, when the conductive organic material layer has a multilayer structure, the above description means a layer in the conductive organic material layer disposed at a position closest to the polymer binding layer.

Moreover, as a film thickness of such a layer in the conductive organic material layer adjacent to the polymer binding layer, an optimal film thickness can be adopted depending on a material used. For example, such a film thickness can be selected so that a driving voltage and luminous efficiency become appropriate values. A specific film thickness is preferably from 0.1 nm to 1 cm, more preferably from 1 nm to 100 µm, and particularly preferably from 5 nm to 10 µm. If the film thickness of the conductive organic material layer becomes less than the above described lower limit, pinhole tends to be easily generated. On the other hand, if the film thickness exceeds the above described upper limit, a voltage for driving the device tends to become high. It is to be noted that the film thickness of such a layer in the conductive organic material layer adjacent to the polymer binding layer was a mean value measured using a high-precision microfigure measuring instrument (for example, the device manufactured by Kosaka Laboratory Ltd.; trade name: Surfcorder ET3000).

<Polymer Binding Layer>

The polymer binding layer used in the present invention is a layer disposed between the above described electrode and the above described conductive organic material layer, and it is composed of an aromatic polymer compound having a structure represented by the following formula (I):

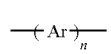
(I)

wherein Ar is a conjugated divalent group optionally having a substituent, and if a plurality of Ar are present, the Ar may be identical to or different from one another; and n is an integer of 1 or greater, preferably an integer of 1 or greater and $1\times10^6$ or smaller, more preferably an integer of 1 or greater and $1\times10^5$ or smaller, and further preferably 1 or greater and $1\times10^4$ or smaller. In addition, in the laminated structure of the present invention, the polymer binding layer is connected to the above described electrode via a chemical bond between the aforementioned aromatic polymer compound (preferably, a terminal group thereof) and the surface of the electrode (preferably, a reactive group which is present thereon).

In the present invention, the polystyrene equivalent number average molecular weight of the aromatic polymer compound is $1\times10^3$ or more and $1\times10^8$ or less. If this number average molecular weight becomes less than the above described lower limit, it becomes difficult to form a polymer binding layer with good reproducibility. On the other hand, if the number average molecular weight exceeds the above described upper limit, the aromatic polymer compound is hardly dissolved in an organic solvent, and thus, it becomes difficult to handle it. In the present invention, from the aforementioned viewpoints, the polystyrene equivalent number average molecular weight of the aromatic polymer compound is preferably $1\times10^3$ or more and $1\times10^7$ or less, more preferably $2\times10^3$ or more and $1\times10^7$ or less, and particularly preferably $4\times10^3$ or more and $1\times10^6$ or less.

When the polymer binding layer used in the present invention is formed by immersing an electrode in a solution containing the conjugated polymer represented by the formula (II) at a concentration of 0.0001% by mass or more, and/or coating the electrode with the solution, the polystyrene equivalent number average molecular weight of an aromatic polymer compound which constitutes the polymer binding layer is a value, which is obtained by subjecting the solution containing the conjugated polymer at a concentration of 0.0001% by mass or more to gel permeation chromatography (GPC) (the chromatography manufactured by Tosoh Corporation; trade name: ULC-8220GPC) to measure a polystyrene equivalent molecular weight, and then obtaining a number average molecular weight thereof. On the other hand, when the polymer binding layer is formed by polycondensing the aromatic compound represented by the formula (IV) using a polymerization catalyst or an equivalently reactive reactant in the solution in the presence of the electrode, to the surface of which the group represented by the formula (III) is bonded, the polymer binding layer formed on the electrode is immersed in a suitable solvent, and after confirming that the aromatic compound which constitutes the polymer binding layer has been dissolved in this solvent, the solution is subjected to GPC (the chromatography manufactured by Shimadzu Corporation; LC-10 series) equipped with a fluorescent detector (the detector manufactured by Agilent Technologies; trade name: Agilent1100 series) to measure an elution time, and a polystyrene equivalent molecular weight is a value calculated from a calibration curve obtained using known polymers.

Moreover, from the viewpoint of producibility and the functionality of the structure, in general, the film thickness of the polymer binding layer is preferably from 0.1 nm to 100 µm, more preferably from 0.2 nm to 10 µm, further preferably from 0.2 nm to 1 µm and particularly preferably from 0.2 nm to 500 nm.

The film thickness of the polymer binding layer is a thickness from the position of the Electrode Surface to the highest position of the polymer binding layer, which is measured using a high-precision microfigure measuring instrument (for example, the device manufactured by Kosaka Laboratory Ltd.; trade name: Surfcorder ET3000).

In the laminated structure of the present invention, from the viewpoint of the suppliability of the charge from the electrode to the polymer binding layer or from the polymer binding layer to the conductive organic material layer, the orbital energy of the lowest unoccupied molecular orbital (LUMO) of the above described aromatic polymer compound is preferably –4.0 eV or more and –0.5 eV or less, more preferably –3.7 eV or more and –0.5 eV or less, and particularly preferably –3.5 eV or more and –0.5 eV or less. On the other hand, the orbital energy of the highest occupied molecular orbital (HOMO) of the aromatic polymer compound is preferably –6.0 eV or more and –4.0 eV or less, more preferably –5.7 eV or more and –4.0 eV or less, and particularly preferably –5.5 eV or more and –4.0 eV or less. In the present invention, the orbital energy of at least one of the LUMO and HOMO of the aromatic polymer compound is preferably within the above described range, and the orbital energies of both the LUMO and HOMO of the aromatic polymer compound are particularly preferably within the above described ranges.

Moreover, in the laminated structure of the present invention, from the viewpoint of the suppliability of the charge from the polymer binding layer to the conductive organic material layer, the difference between the orbital energy of the LUMO of the aromatic polymer compound which constitutes the polymer binding layer and the orbital energy of the LUMO of the conductive organic material which constitutes a layer in the conductive organic material layer adjacent to the polymer binding layer is preferably –2.5 eV or more and +2.5 eV or less, more preferably –2.3 eV or more and +2.3 eV or less, and further preferably –2.0 eV or more and +2.0 eV or less. Furthermore, the difference between the orbital energy of the HOMO of the aromatic polymer compound and the orbital energy of the HOMO of the conductive organic material which constitutes a layer in the conductive organic material layer adjacent to the polymer binding layer is preferably –1.5 eV or more and +1.5 eV or less, more preferably –1.3 eV or more and +1.3 eV or less, and further preferably –1.2 eV or more and +1.2 eV or less.

In the present invention, the orbital energy values of the LUMO and HOMO of both the aromatic polymer compound and the conductive organic material can be calculated by a theoretical chemical approach using similar polymers. Similar polymers in the present invention are polymer compounds wherein, in the above formulae (V) and (X), $Ar^1$ is represented by the same structural formula.

The theoretical chemical approach is formed by combining B3LYP density functional with a 6-31G* basis function (hereinafter referred to as a "B3LYP/6-31G* method"). By applying the aforementioned method, the stable molecular structure and molecular orbital energy of a similar polymer were calculated (see Chem. Phys. Lett. 2007, 439, pp. 35-39). The calculation can be carried out using quantum chemical calculation program such as Gaussian 03.

For instance, in a polymer compound represented by the following formula:

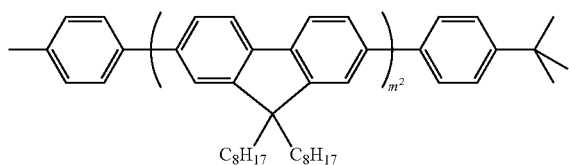

wherein $m^2$ represents the degree of polymerization, a similar polymer is a compound represented by the following formula:

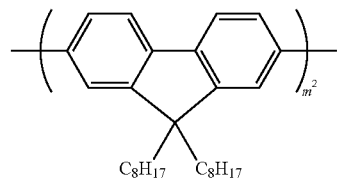

wherein $m^2$ represents the degree of polymerization wherein $Ar^1$ in the above formulae (V) and (X) is represented by the same structural formula.

For the similar polymer, the stable molecular structure and molecular orbital energy of this similar polymer were calculated by using the B3LYP/6-31G* method, and the orbital energies of the LUMO and HOMO thereof were then calculated. As a result, the LUMO and HOMO were found to be −1.70 eV and −4.97 eV, respectively. Table 1 shows the orbital energies of the LUMO and HOMO of other similar polymers. It is to be noted that the symbol $m^1$ in the structural formulae in Table 1 indicates the degree of polymerization.

TABLE 1

| Structure of similar polymer | Orbital energy (eV) | |
| --- | --- | --- |
| | LUMO | HOMO |
| | −1.70 | −4.97 |
| | −0.89 | −4.37 |
| | −2.01 | −4.82 |
| | −1.66 | −5.06 |
| | −2.71 | −5.17 |

<Aromatic Polymer Compound>
The aromatic polymer compound used in the present invention has the structure represented by the formula (I).
Examples of a divalent group having an aromatic ring represented by Ar in the formula (I) include divalent groups represented by the following formulae (C-1) to (C-22), (D-1) to (D-24), (E-1) to (E-26), (G-1) to (G-8), and (J-1) to (J-22).
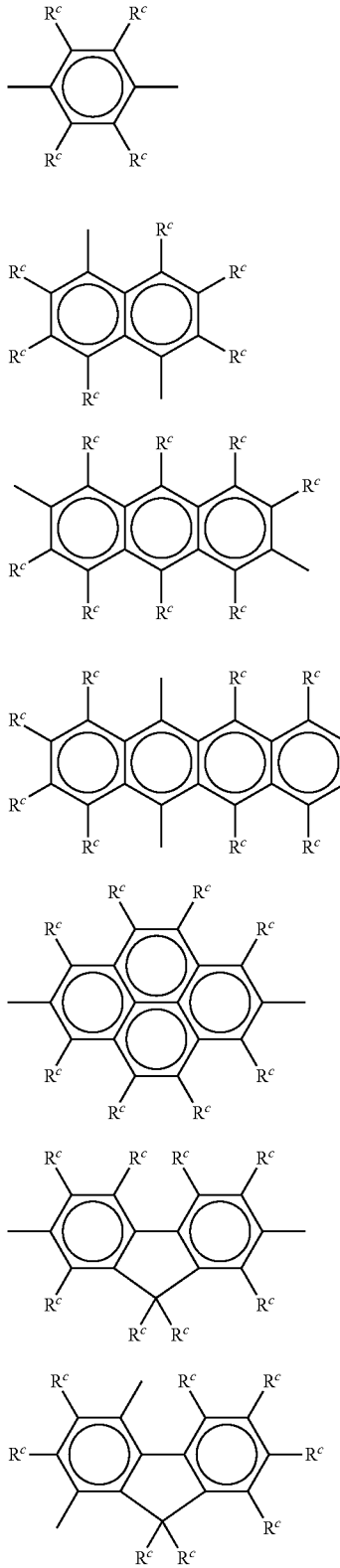
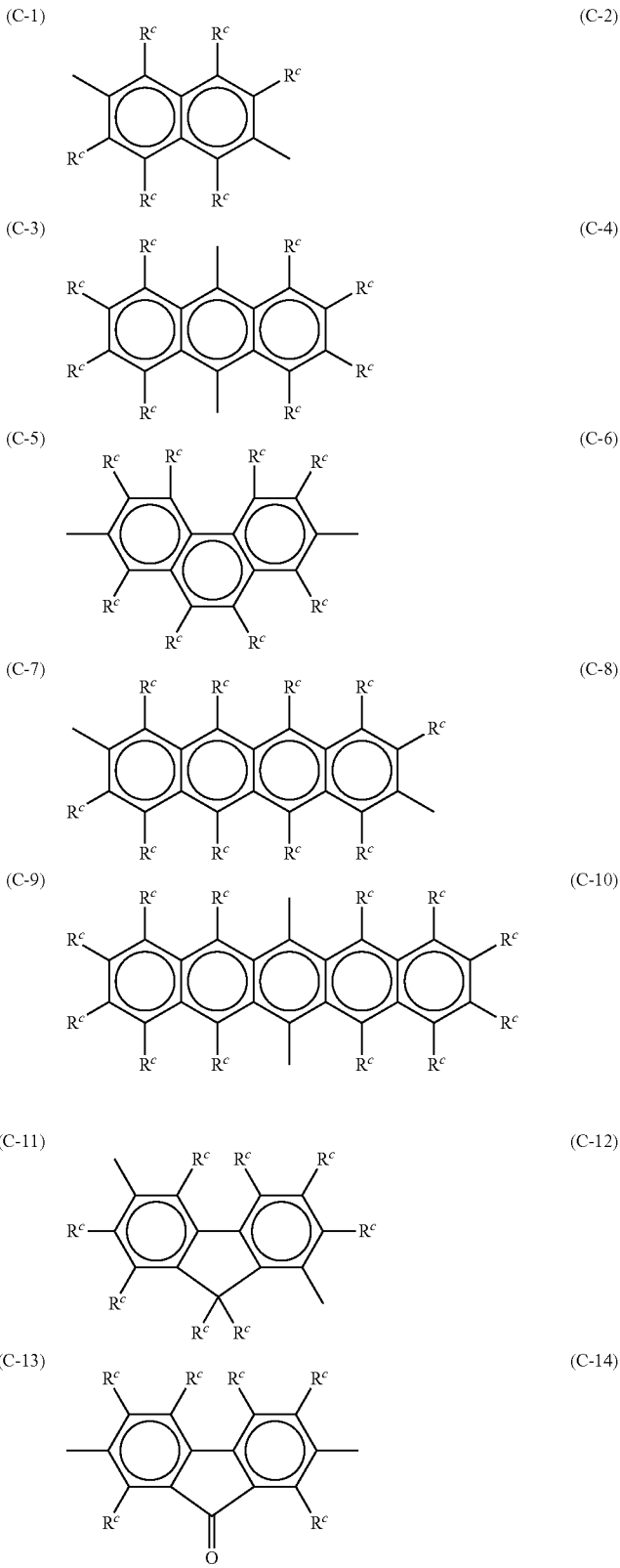

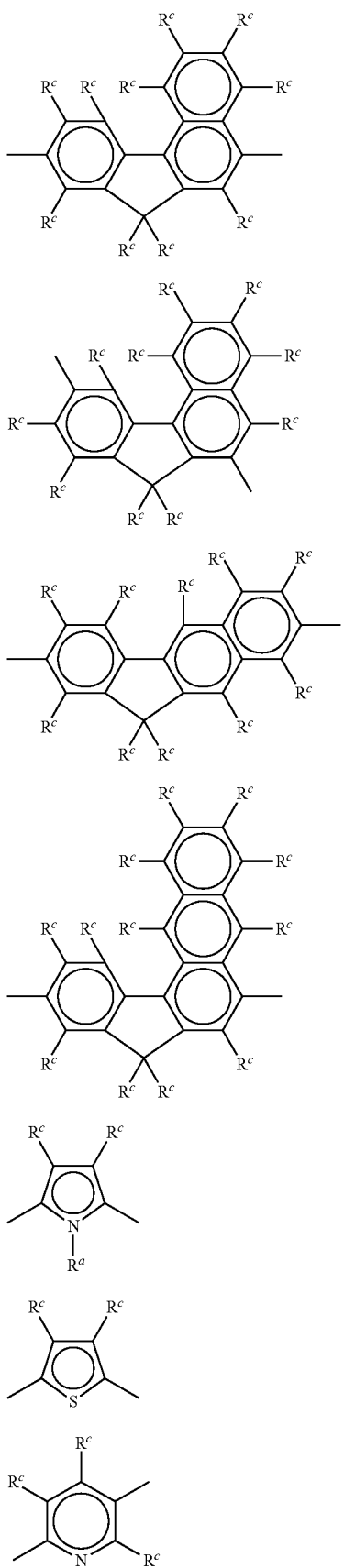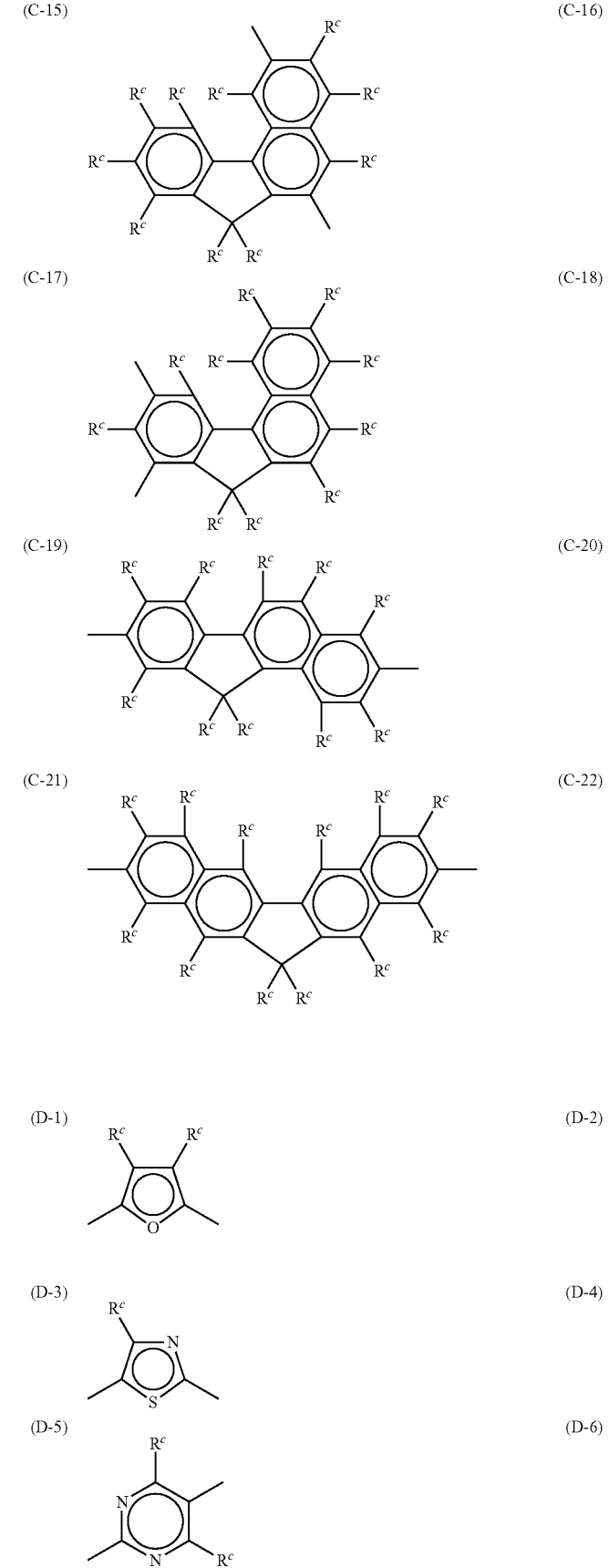

-continued
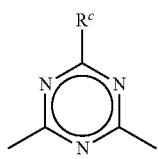
(D-7)
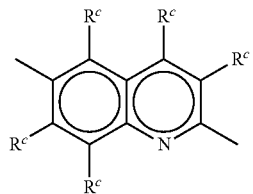
(D-8)
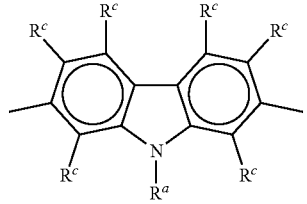
(D-9)
(D-10)
(D-11)
(D-12)
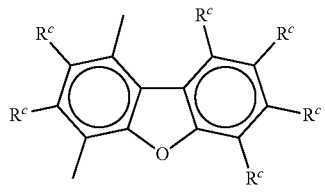
(D-13)
(D-14)
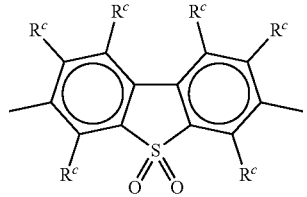
(D-15)
(D-16)
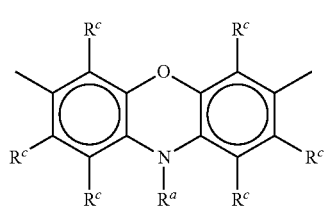
(D-17)
(D-18)
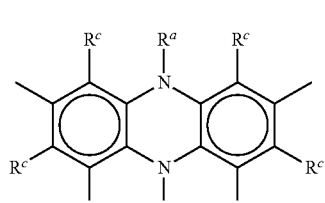
(D-19)
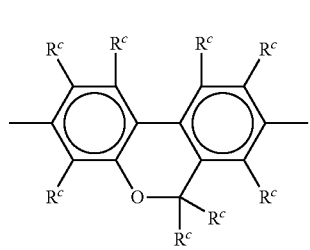
(D-20)

-continued
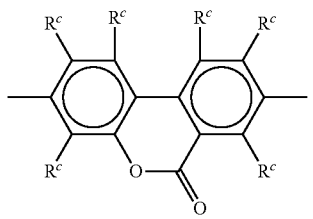
(D-21)
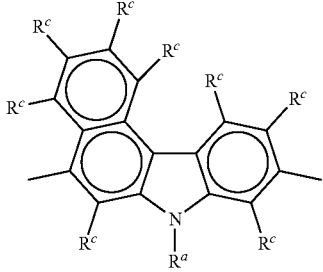
(D-22)
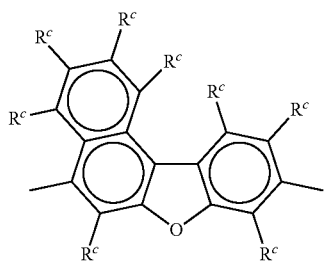
(D-23)
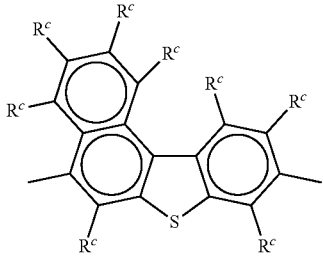
(D-24)
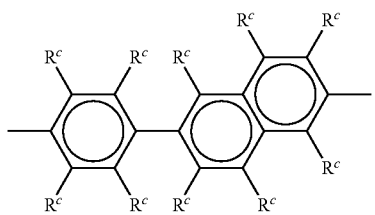
(E-1)
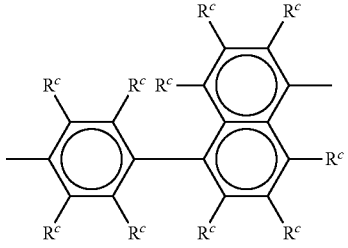
(E-2)
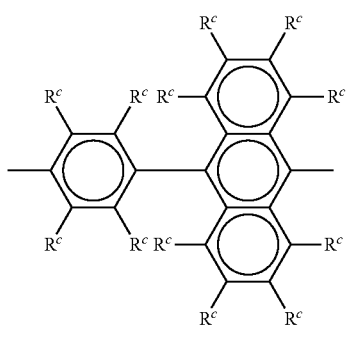
(E-3)
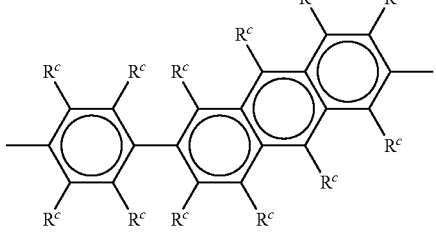
(E-4)
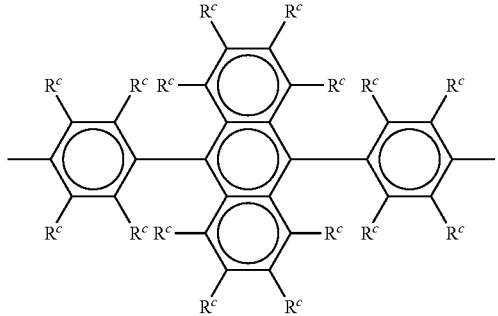
(E-5)
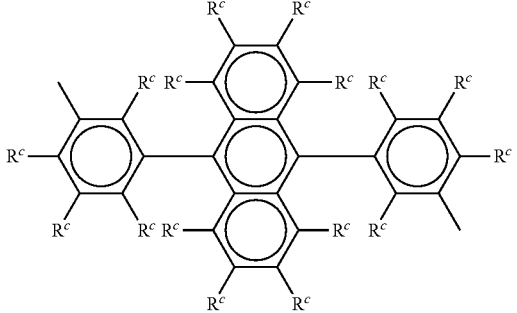
(E-6)
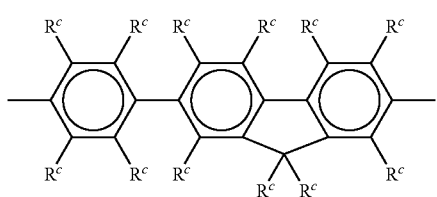
(E-7)
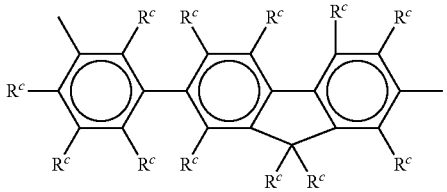
(E-8)

-continued
(E-9)
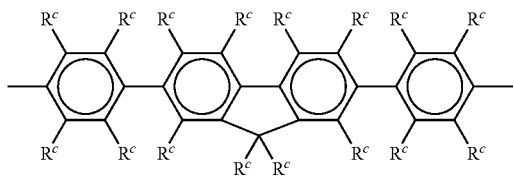
(E-10)
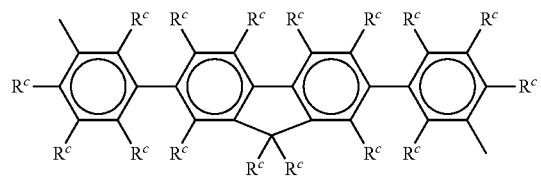
(E-11)
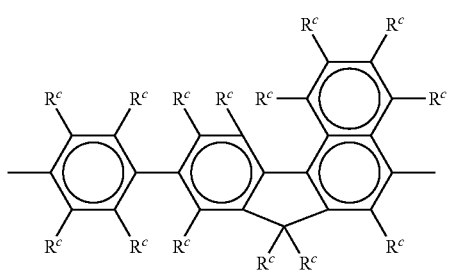
(E-12)
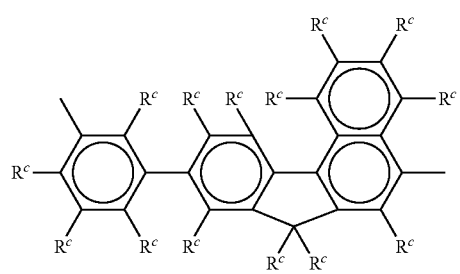
(E-13)
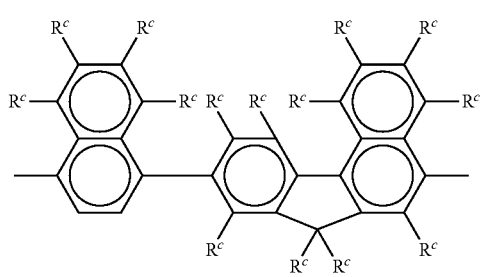
(E-14)
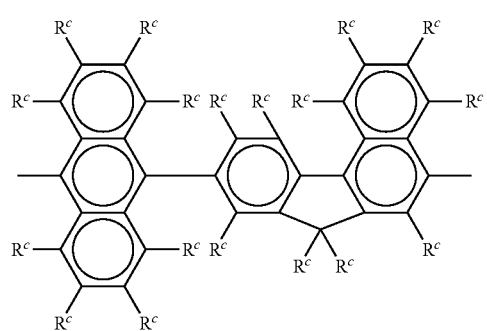
(E-15)
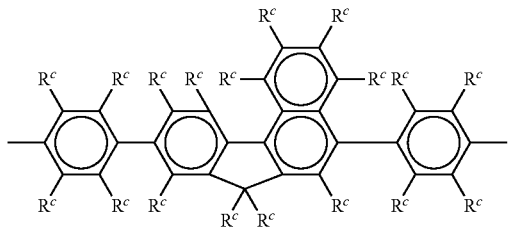
(E-16)
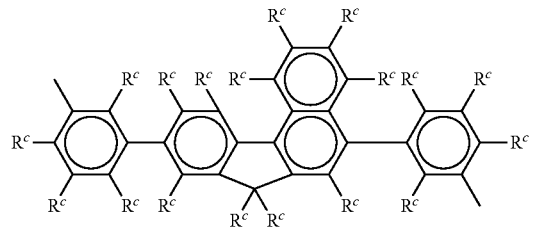
(E-17)
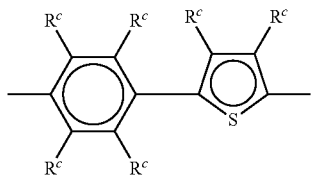
(E-18)
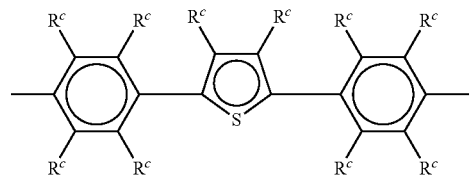
(E-19)
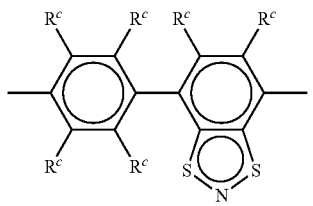
(E-20)
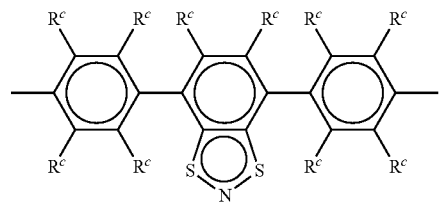

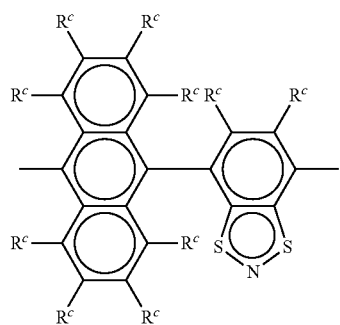
(E-21)
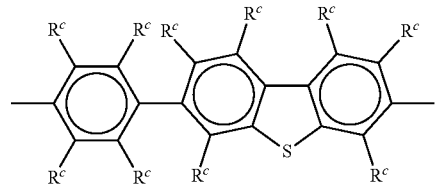
(E-22)
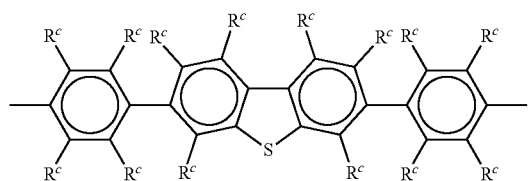
(E-23)
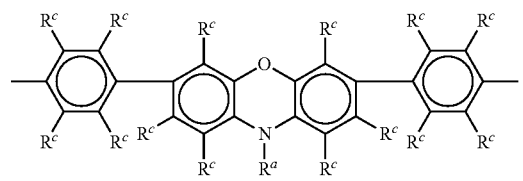
(E-24)
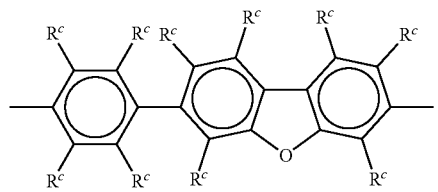
(E-25)
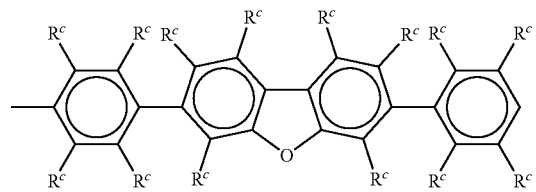
(E-26)
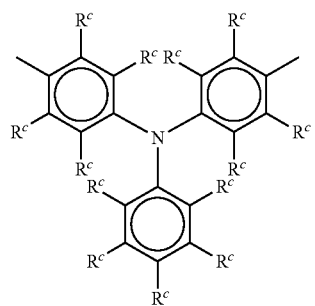
(G-1)
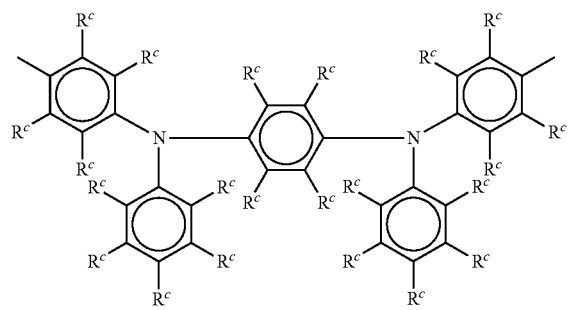
(G-2)
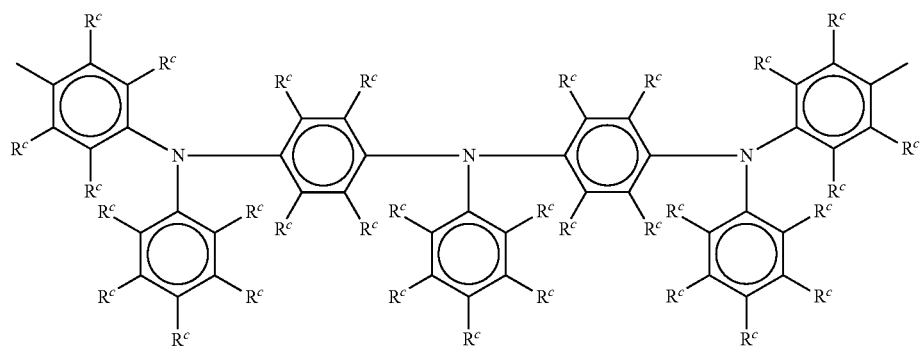
(G-3)

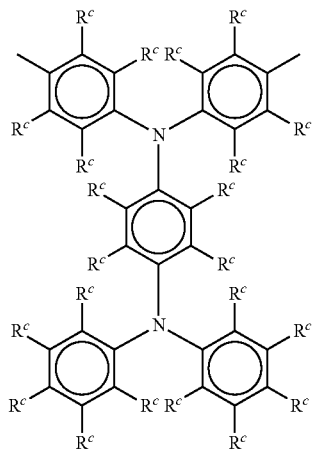 (G-4)
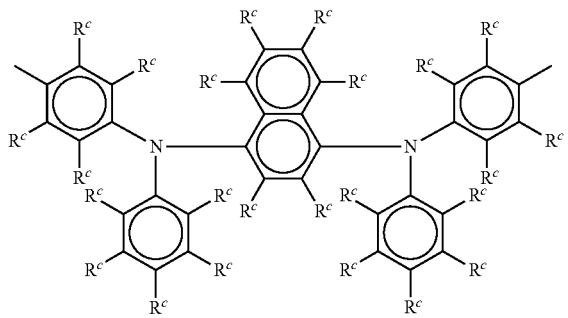 (G-5)
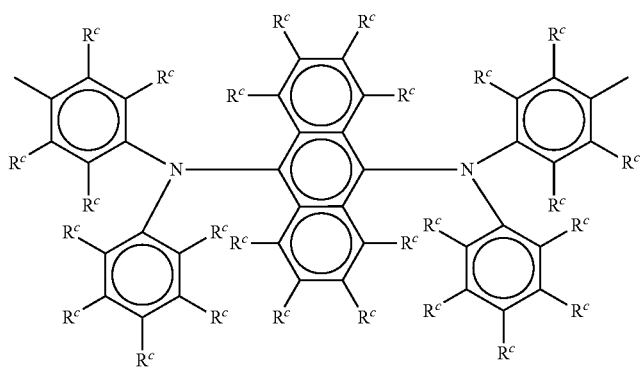 (G-6)
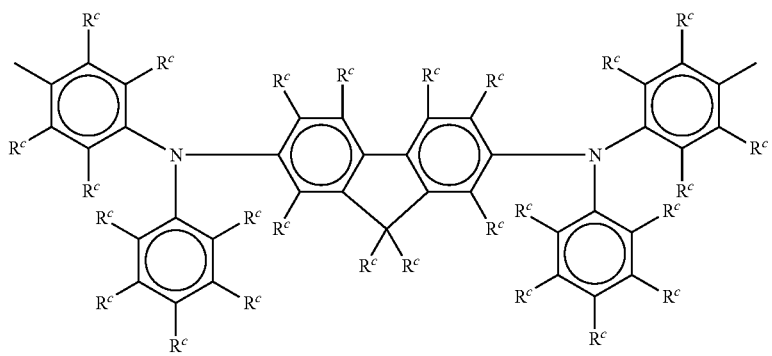 (G-7)
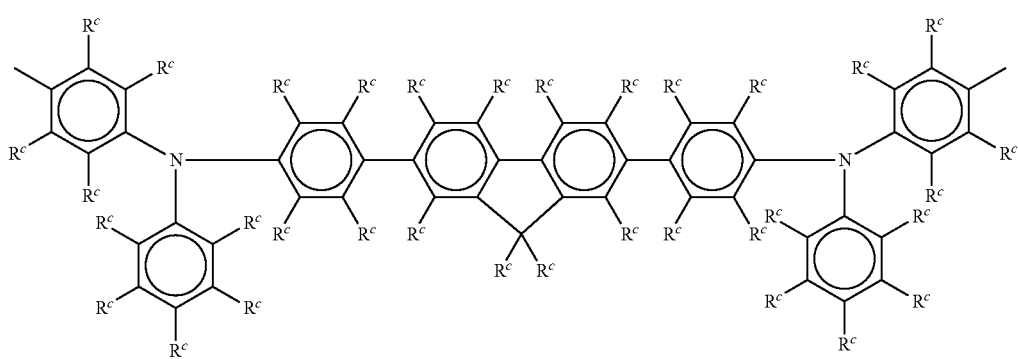 (G-8)

-continued
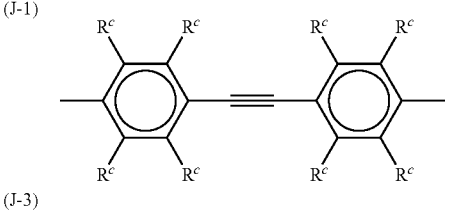
(J-1)
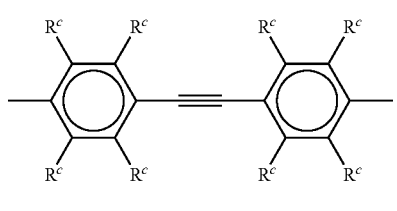
(J-2)
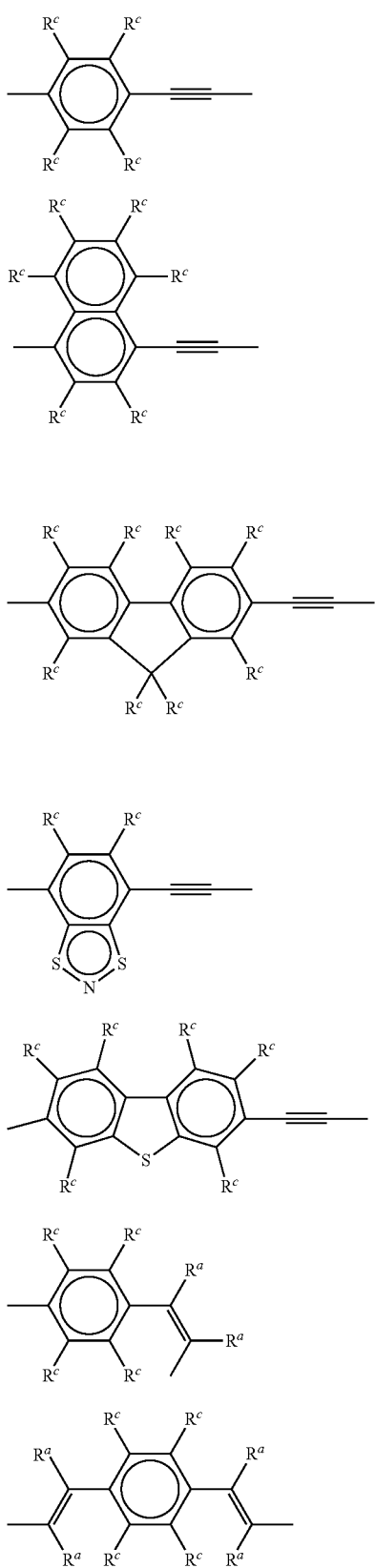
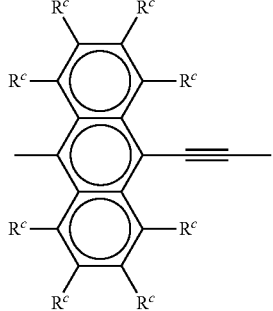
(J-3)
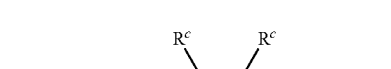
(J-4)
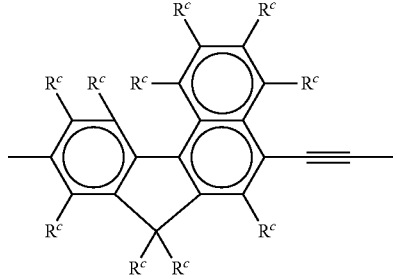
(J-5)
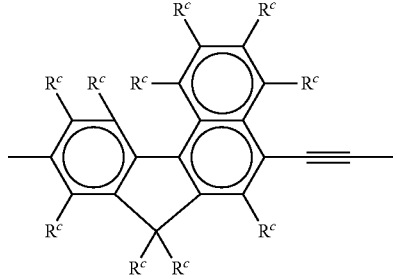
(J-6)
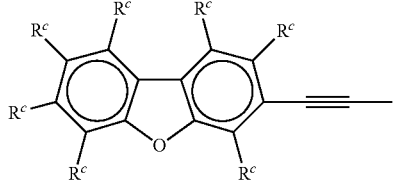
(J-7)
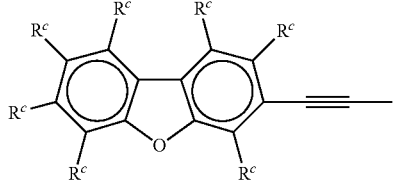
(J-8)
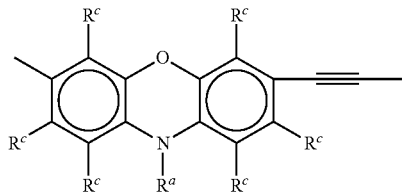
(J-9), (J-10)
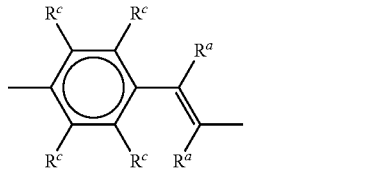
(J-11), (J-12)
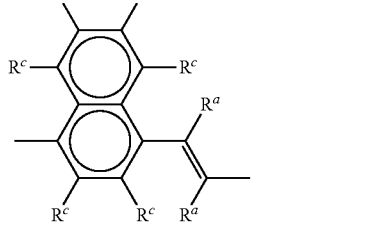
(J-13), (J-14)

-continued
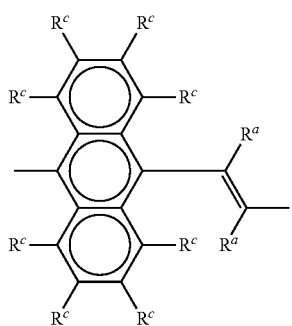
(J-15)
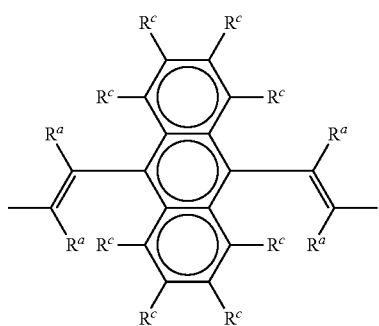
(J-16)
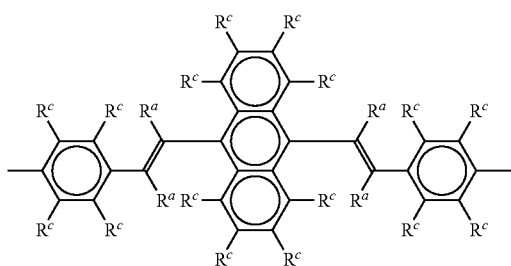
(J-17)
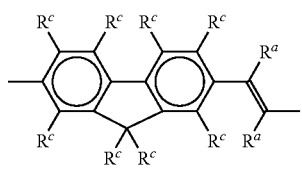
(J-18)
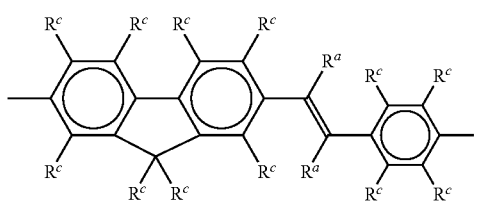
(J-19)
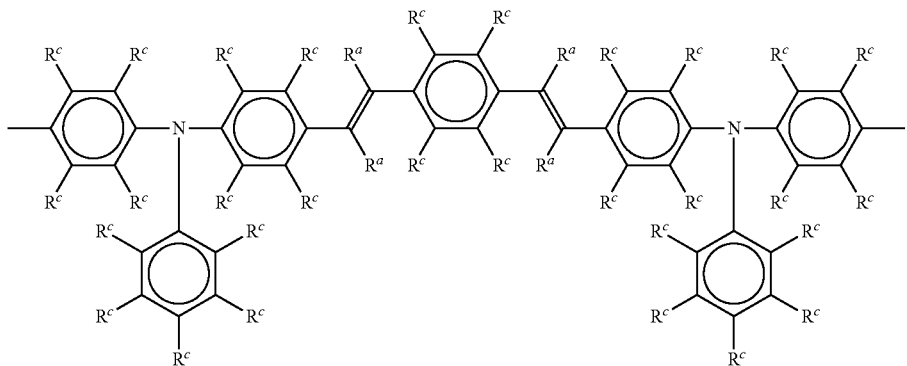
(J-20)
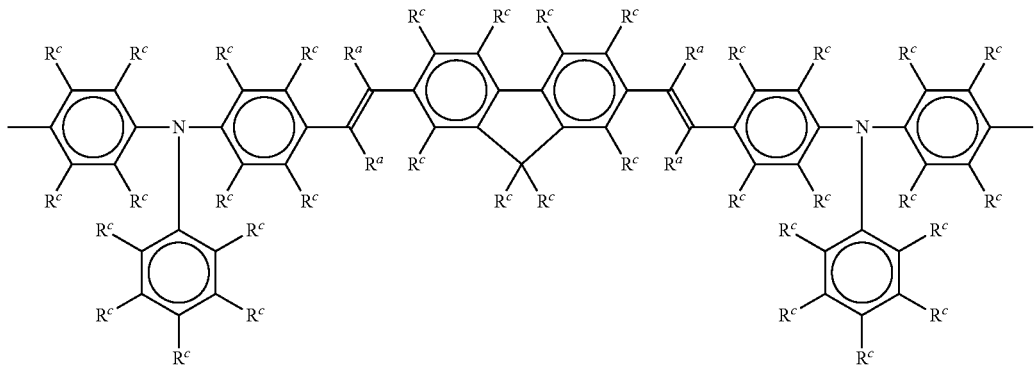
(J-21)

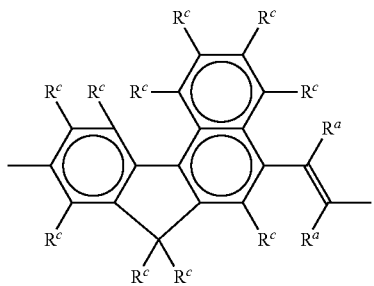

(J-22)

Among these compounds, from the viewpoint of stability and the easiness of synthesis, the divalent groups represented by the above described formulae (C-1) to (C-20), (D-1) to (D-20), (E-1) and (E-2), (E-7) to (E-13), (E-15) to (E-20), (E-22) to (E-26), (G-1) to (G-8), (J-1) to (J-3), (J-5) to (J-14), and (J-18) to (J-22) are preferable; the divalent groups represented by the above described formulae (C-1) to (C-6), (C-10), (C-11), (C-15), (D-16) to (D-20), (E-17) to (E-20), (G-1) to (G-8), and (J-1) to (J-3) are more preferable; the divalent groups represented by the above described formulae (C-1) to (C-3), (C-10), (C-11), (C-15), (D-16) to (D-19), (E-17) to (E-20), and (G-1) to (G-6) are further preferable; and the divalent groups represented by the above described formulae (C-1), (C-11), (C-15), (D-16), (E-20), (G-1), and (G-2) are particularly preferable.

$R^c$ in the above formulae represents a hydrogen atom or a substituent. From the viewpoint of the stability of a copolymer or the easiness of synthesis, the $R^c$ is preferably a hydrogen atom, an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, an arylalkyl group optionally having a substituent, an arylalkoxy group optionally having a substituent, an arylalkylthio group optionally having a substituent, an arylalkenyl group optionally having a substituent, an arylalkynyl group optionally having a substituent, an amino group, a substituted amino group, a silyl group, a substituted silyl group, a halogen atom, an acyl group optionally having a substituent, an acyloxy group optionally having a substituent, a carbamoyl group optionally having a substituent, an imide residue, a monovalent heterocyclic group optionally having a substituent, a carboxyl group, a substituted carboxyl group or a cyano group; more preferably, a hydrogen atom, an alkyl group optionally having a substituent, an alkoxy group optionally having a substituent, an aryl group optionally having a substituent, an aryloxy group optionally having a substituent, an arylalkyl group optionally having a substituent, an arylalkoxy group optionally having a substituent, a substituted amino group, a substituted silyl group, an acyl group optionally having a substituent, a substituted carboxyl group or a cyano group; further preferably, a hydrogen atom, an alkyl group optionally having a substituent, an alkoxy group optionally having a substituent, an aryl group optionally having a substituent, an aryloxy group optionally having a substituent, an arylalkyl group optionally having a substituent, an arylalkoxy group optionally having a substituent or a substituted carboxyl group; particularly preferably, a hydrogen atom, an alkyl group optionally having a substituent, an alkoxy group optionally having a substituent, or an aryl group optionally having a substituent; and most preferably, a hydrogen atom or an alkyl group optionally having a substituent. In addition, in the above formulae, the plurality of $R^c$ present may be identical to or different from one another.

Herein, the alkyl group optionally having a substituent may be any of linear, branched and cyclic alkyl groups, and the number of carbon atoms is generally 1 to 20, preferably 1 to 15, and more preferably 1 to 10. Specific examples of such an alkyl group include a methyl group, an ethyl group, a propyl group, an isopropyl group, a butyl group, an isobutyl group, an s-butyl group, a t-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a lauryl group, a 1-adamantyl group, a 2-adamantyl group, a trifluoromethyl group, a pentafluoroethyl group, a perfluorobutyl group, a perfluorohexyl group, a perfluorooctyl group, a methoxymethyl group, a 2-methoxyethyl group, and a 2-ethoxyethyl group. Base on the balance between viewpoints such as the characteristics of a device and the easiness of synthesis, and heat resistance, a methyl group, an ethyl group, a propyl group, an isopropyl group, a butyl group, an isobutyl group, a t-butyl group, a pentyl group, an isoamyl group, a hexyl group, an octyl group, a 2-ethylhexyl group, a decyl group, and a 3,7-dimethyloctyl group are preferable. When a plurality of $R^c$ which are alkyl groups optionally having a substituent are present, two alkyl groups may be bonded to each other to form a ring.

The alkoxy group optionally having a substituent may be any of linear, branched and cyclic alkoxy groups, and the number of carbon atoms is generally 1 to 20, and preferably 1 to 15. Specific examples of an alkoxy group include a methoxy group, an ethoxy group, a propyloxy group, an isopropyloxy group, a butoxy group, an isobutoxy group, an s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyl group, a perfluorooctyl group, a methoxymethyloxy group, a 2-methoxyethyloxy group, and a 2-ethoxyethyloxy group. Base on the balance between viewpoints such as solubility in an organic solvent and the easiness of synthesis, and heat resistance, a pentyloxy group, a hexyloxy group, an octyloxy group, a 2-ethylhexyloxy group, a decyloxy group, and a 3,7-dimethyloctyloxy group are preferable.

The alkylthio group optionally having a substituent may be any of linear, branched and cyclic alkylthio groups, and the number of carbon atoms is generally 1 to 20, and preferably 3 to 20. An example of the aforementioned substituent is an alkoxy group.

The aryl group optionally having a substituent is an atomic group formed by removing one hydrogen atom from aromatic hydrocarbon, and it includes a group having a condensed ring and a group, to which two or more independent benzene rings or condensed rings are bonded directly or via vinylene groups or the like. Such an aryl group has a total number of carbon atoms of generally 6 to 60, and preferably 7 to 48. Specific examples of such an aryl group include a phenyl group, a 1-naphthyl group, a 2-naphthyl group, a 1-anthracenyl group, a 2-anthracenyl group, a 9-anthracenyl group, and a pentafluorophenyl group. These groups may further have substituents such as an alkyl group, an alkoxy group, an alkyloxycarbonyl group and a substituted amino group. From the viewpoints of the solubility of these groups in an organic solvent, the characteristics of a device, the easiness of synthesis, etc., a phenyl group having one or more substituents selected from the group consisting of an alkyl group containing 1 to 12 carbon atoms, an alkoxy group containing 1 to 12 carbon atoms and an alkyloxycarbonyl group is preferable. Specific examples of such a phenyl group include a 3-methylphenyl group, a 4-methylphenyl group, a 3,5-dimethylphenyl group, a 4-propylphenyl group, a mesityl group, a 4-isopropylphenyl group, a 4-butylphenyl group, a 4-isobutylphenyl group, a 4-s-butylphenyl group, a 4-t-butylphenyl group, a 4-pentylphenyl group, a 4-isoamylphenyl group, a 4-hexylphenyl group, a 2,6-dimethyl-4-t-butylphenyl group, a 4-heptylphenyl group, a 4-octylphenyl group, a 4-nonylphenyl group, a 4-decylphenyl group, a 4-dodecylphenyl group, a 3-methyloxyphenyl group, a 4-methyloxyphenyl group, a 3,5-dimethyloxyphenyl group, a 4-propyloxyphenyl group, a 4-isopropyloxyphenyl group, a 4-butyloxyphenyl group, a 4-isobutyloxyphenyl group, a 4-s-butyloxyphenyl group, a 4-t-butyloxyphenyl group, a 4-hexyloxyphenyl group, a 3,5-dihexyloxyphenyl group, a 4-heptyloxyphenyl group, a 4-octyloxyphenyl group, a 4-nonyloxyphenyl group, a 4-(methoxymethoxy)phenyl group, a 3-(methoxymethoxy)phenyl group, a 4-(2-ethoxy-ethoxy)phenyl group, a 3-(2-ethoxy-ethoxy)phenyl group, a 3,5-bis(2-ethoxy-ethoxy)phenyl group, a 3-methoxycarbonylphenyl group, a 4-methoxycarbonylphenyl group, a 3,5-dimethoxycarbonylphenyl group, a 3-ethoxycarbonylphenyl group, a 4-ethoxycarbonylphenyl group, a 3-ethyloxycarbonyl-4-methoxyphenyl group, a 3-ethyloxycarbonyl-4-ethoxyphenyl group, a 3-ethyloxycarbonyl-4-hexyloxyphenyl group, and a 4-diphenylaminophenyl group.

The aryloxy group optionally having a substituent contains generally 6 to 60 carbon atoms, and preferably 7 to 48 carbon atoms. Specific examples of such an aryloxy group include a phenoxy group, a $C_1$-$C_{12}$ alkoxyphenoxy group (wherein $C_1$-$C_{12}$ means that the group contains 1 to 12 carbon atoms, and the same applies below), a $C_1$-$C_{12}$ alkylphenoxy group, a 1-naphthyloxy group, a 2-naphthyloxy group, and a pentafluorophenyloxy group. From the viewpoints of solubility in an organic solvent and the easiness of synthesis, a $C_1$-$C_{12}$ alkoxyphenoxy group and a $C_1$-$C_{12}$ alkylphenoxy group are preferable.

The arylthio group optionally having a substituent contains generally 6 to 60 carbon atoms. Specific examples of such an arylthio group include a phenylthio group, a $C_1$-$C_{12}$ alkoxyphenylthio group, a $C_1$-$C_{12}$ alkylphenylthio group, a 1-naphthylthio group, a 2-naphthylthio group, and a pentafluorophenylthio group.

The arylalkyl group optionally having a substituent contains generally 7 to 60 carbon atoms, and preferably 7 to 48 carbon atoms. Specific examples of such an arylalkyl group include a phenyl-$C_1$-$C_{12}$ alkyl group, a $C_1$-$C_{12}$ alkoxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group, and a 2-naphthyl-$C_1$-$C_{12}$ alkyl group. From the viewpoints of solubility in an organic solvent, the characteristics of a device, and the easiness of synthesis, a $C_1$-$C_{12}$ alkoxyphenyl-$C_1$-$C_{12}$ alkyl group and a $C_1$-$C_{12}$ alkylphenyl-$C_1$-$C_{12}$ alkyl group are preferable.

The arylalkoxy group optionally having a substituent contains generally 7 to 60 carbon atoms, and preferably 7 to 48 carbon atoms. Specific examples of such an arylalkoxy group include a phenyl-$C_1$-$C_{12}$ alkoxy group, a $C_1$-$C_{12}$ alkoxyphenyl-$C_1$-$C_{12}$ alkoxy group, a $C_1$-$C_{12}$ alkylphenyl-$C_1$-$C_{12}$ alkoxy group, a 1-naphthyl-$C_1$-$C_{12}$ alkoxy group and a 2-naphthyl-$C_1$-$C_{12}$ alkoxy group, such as a phenylmethoxy group, a phenylethoxy group, a phenylbutoxy group, a phenylpentyloxy group, a phenylhexyloxy group, a phenylheptyloxy group and a phenyloctyloxy group.

The arylalkylthio group optionally having a substituent contains generally 7 to 60 carbon atoms, and preferably 7 to 48 carbon atoms. Examples of the aforementioned substituent include an alkyl group and an alkoxy group.

The arylalkenyl group optionally having a substituent contains generally 8 to 60 carbon atoms. Specific examples of such an arylalkenyl group include a phenyl-$C_2$-$C_{12}$ alkenyl group (wherein "$C_2$-$C_{12}$ alkenyl" means the number of carbon atoms in an alkenyl portion is 2 to 12, and the same applies below), a $C_1$-$C_{12}$ alkoxyphenyl-$C_2$-$C_{12}$ alkenyl group, a $C_1$-$C_{12}$ alkylphenyl-$C_2$-$C_{12}$ alkenyl group, a 1-naphthyl-$C_2$-$C_{12}$ alkenyl group, and a 2-naphthyl-$C_2$-$C_{12}$ alkenyl group.

The arylalkynyl group optionally having a substituent contains generally 8 to 60 carbon atoms. Specific examples of such an arylalkynyl group include a phenyl-$C_2$-$C_{12}$ alkynyl group (wherein "$C_2$-$C_{12}$ alkynyl" means that the number of carbon atoms in an alkynyl portion is 2 to 12, and the same applies below), a $C_1$-$C_{12}$ alkoxyphenyl-$C_2$-$C_{12}$ alkynyl group, a $C_1$-$C_{12}$ alkylphenyl-$C_2$-$C_{12}$ alkynyl group, a 1-naphthyl-$C_2$-$C_{12}$ alkynyl group, and a 2-naphthyl-$C_2$-$C_{12}$ alkynyl group.

An example of the substituted amino group is an amino group substituted with one or two groups selected from among an alkyl group, an aryl group, an arylalkyl group and a monovalent heterocyclic group. The alkyl group, aryl group, arylalkyl group and monovalent heterocyclic group may optionally have a substituent. The substituted amino group contains generally 1 to 60 carbon atoms, and preferably 2 to 48, without including the number of carbon atoms of the aforementioned substituent. Specific examples of such a substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, an s-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a cyclopentylamino group, a cyclohexylamino group, a cyclohexylamino group, a pyrrolidyl group, a piperidyl group, a ditrifluoromethylamino group, a phenylamino group, a diphenylamino group, a $C_1$-$C_{12}$ alkoxyphenylamino group, a di($C_1$-$C_{12}$ alkoxyphenyl)amino group, a di($C_1$-$C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl-$C_1$-$C_{12}$ alkylamino group, a $C_1$-$C_{12}$ alkoxyphenyl-$C_1$-$C_{12}$ alkylamino group, a $C_1$-$C_{12}$ alkylphenyl-$C_1$-$C_{12}$ alkylamino group, a di($C_1$-$C_{12}$ alkoxyphenyl-$C_1$-$C_{12}$ alkyl)amino group, a di($C_1$-$C_{12}$ alkylphenyl-$C_1$-$C_{12}$ alkyl)amino group, a 1-naphthyl-$C_1$-$C_{12}$ alkylamino group, and a 2-naphthyl-$C_1$-$C_{12}$ alkylamino group.

An example of the substituted silyl group is a silyl group substituted with one or two or three groups selected from among an alkyl group, an aryl group, an arylalkyl group and a monovalent heterocyclic group. The substituted silyl group contains generally 1 to 60 carbon atoms, and preferably 3 to 48 carbon atoms. The aforementioned alkyl group, aryl group, arylalkyl group and monovalent heterocyclic group may optionally have a substituent.

The acyl group optionally having a substituent contains generally 2 to 20 carbon atoms, and preferably 2 to 18 carbon atoms. Specific examples of such an acyl group include an acetyl group, a propionyl group, a butyryl group, an isobutyryl group, a pivaloyl group, a benzoyl group, a trifluoroacetyl group, and a pentafluorobenzoyl group. Moreover, examples of the aforementioned substituent include an alkyl group and an alkoxy group.

The acyloxy group optionally having a substituent contains generally 2 to 20 carbon atoms, and preferably 2 to 18 carbon atoms. Specific examples of such an acyloxy group include an acetoxy group, a propionyloxy group, a butyryloxy group, an isobutyryloxy group, a pivaloyloxy group, a benzoyloxy group, a trifluoroacetyloxy group, and a pentafluorobenzoyloxy group. Moreover, examples of the aforementioned substituent include an alkyl group and an alkoxy group.

The carbamoyl group optionally having a substituent contains generally 2 to 20 carbon atoms, and preferably 2 to 18 carbon atoms. Specific examples of such a carbamoyl group include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group, and a dipentafluorobenzamide group. Moreover, examples of the aforementioned substituent include an alkyl group and an alkoxy group.

The monovalent heterocyclic group optionally having a substituent is an atomic group formed by removing one hydrogen atom from a heterocyclic compound, and it contains generally 4 to 60 carbon atoms, and preferably 4 to 20 carbon atoms. It is to be noted that the number of carbon atoms of the aforementioned monovalent heterocyclic group does not include the number of carbon atoms of a substituent that is substituted for the heterocyclic ring. The term "heterocyclic compound" is used herein to mean not only organic compounds having a cyclic structure, in which the elements constituting the ring are only carbon atoms, but also organic compounds containing heteroatoms such as oxygen, sulfur, nitrogen, phosphorus and boron, in the ring thereof. Specific examples of such a monovalent heterocyclic group include a thienyl group, a $C_1$-$C_{12}$ alkylthienyl group, a pyrrolyl group, a furyl group, a pyridyl group, a $C_1$-$C_{12}$ alkylpyridyl group, a piperidyl group, a quinolyl group, and an isoquinolyl group. Of these, a thienyl group, a $C_1$-$C_{12}$ alkylthienyl group, a pyridyl group and a $C_1$-$C_{12}$ alkylpyridyl group are preferable.

<Method for Forming Polymer Binding Layer>

An example of the polymer binding layer used in the present invention is a polymer binding layer having a structure represented by the following formula (XI):

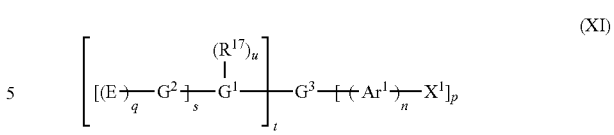

$G^1$ in the above formula (XI) is an s+u+1 valent group, an atom, a cation, an anion or a single bond. Among others, $G^1$ is preferably an atom from group 14 of the periodic table, an anion generated from an atom from group 13 of the periodic table, a cation generated from an atom from group 15 of the periodic table, a quadrivalent adamantyl group or a single bond; more preferably, a carbon atom, a silicon atom, a boron anion, a nitrogen cation, a quadrivalent adamantly group or a single bond; and particularly preferably, a carbon atom, a silicon atom or a single bond. $G^2$ in the formula is a q+1 valent group or a single bond. Among others, it is preferably a q+1 valent group having an aromatic ring optionally having a substituent or a single bond. $G^3$ in the formula is a t+p valent group. Among others, a t+p valent group having an aromatic ring optionally having a substituent is preferable. In the above formula, $R^{17}$ is a group defined in the same manner as that for the above described $R^c$, and the preferred range is also the same.

In the above formula (XI), q is an integer of 1 or greater, preferably an integer of 1 or greater and 10 or smaller, more preferably an integer of 1 or greater and 5 or smaller, further preferably an integer of 1 or greater and 3 or smaller, and particularly preferably 1 or 2. In the formula, s is an integer of 1 or greater, preferably an integer of 1 or greater and 10 or smaller, more preferably an integer of 1 or greater and 5 or smaller, further preferably an integer of 1 or greater and 3 or smaller, and particularly preferably 1 or 2. In the formula, u is an integer of 0 or greater, preferably an integer of 0 or greater and 5 or smaller, more preferably an integer of 0 or greater and 2 or smaller, and further preferably 0. In the formula, t is an integer of 1 or greater, preferably an integer of 1 or greater and 10 or smaller, more preferably an integer of 1 or greater and 5 or smaller, further preferably an integer of 1 or greater and 3 or smaller, and particularly preferably 1 or 2. When the $G^1$ is an atom from group 14 of the periodic table, an anion generated from an atom from group 13 of the periodic table, a cation generated from an atom from group 15 of the periodic table or a quadrivalent adamantyl group, s+u=3. When the $G^1$ is a single bond, s=1 and u=0. When the $G^2$ is a single bond, q=1. It is to be noted that E, $Ar^1$, $X^1$, p and n in the above formula (XI) will be described later in the section <Method (A) of binding conjugated polymer>.

Among polymer binding layers having the structure represented by the above formula (XI), a polymer binding layer having a structure represented by the following formula (V) is preferable:

Herein, r=q×s×t, and G is a structure represented by the following formula (XII):

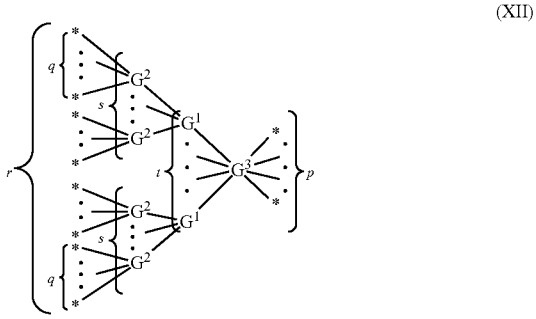

(XII)

The symbols $G^1$, $G^2$, $G^3$, p, q, s and t in the above formula (XII) have the same definitions as those of $G^1$, $G^2$, $G^3$, p, q, s and t in the above formula (XI). The symbol * indicates a binding portion with E or $Ar^1$. It is to be noted that, in the above formula (XII), $R^{17}$ that is bonded to $G^2$ is omitted.

Such a method for forming a polymer binding layer is not particularly limited, as long as it is a method capable of forming the above described polymer binding layer on the above described electrode. Examples of such a method include a method of chemically bonding a conjugated polymer as described later onto the surface of the electrode [method (A)] and a method of polycondensing an aromatic compound onto a functional group which is present on the surface of the electrode [method (B)].

<Method (A) of Bonding Conjugated Polymer>

First, a method (A) of bonding a conjugated polymer to the surface of an electrode will be described, using the case of forming the polymer binding layer represented by the above formula (V) as an example. This method (A) can be carried out in a gas phase, a liquid phase or a solid phase, although it depends on the type and molecular weight of a conjugated polymer represented by the following formula (II):

(II)

From the viewpoint of handlability, the method (A) is preferably carried out in a liquid phase. When the method (A) is carried out in a gas phase, the polymer binding layer can be formed by accumulating a conjugated polymer on a clean electrode in a vacuum according to a method such as evaporation. When the method (A) is carried out in a solid phase, the polymer binding layer can be formed by rubbing the conjugated polymer represented by the formula (II) on a clean electrode. When the method is carried out in a liquid phase, the polymer binding layer can be formed by immersing the above described electrode in a solution containing 0.0001% by mass or more of the conjugated polymer represented by the formula (II), or by applying this solution to the above described electrode, or by immersing the above described electrode in this solution and then further applying this solution onto the electrode. The above formula (II) will be described in detail later.

Moreover, in all these methods, the surface of the electrode has been preferably washed. If dirt or a contaminant is attached on the Electrode Surface, there may be a case in which defects are formed on the polymer binding layer. Thus, a step of forming a polymer binding layer on the electrode is preferably carried out immediately after washing the electrode. The washing method can be selected depending on the type of the electrode, and each electrode can be washed according to a known method. In order to form a polymer binding layer having a few defects, the electrode is preferably treated with ozone, plasma or the like in the final step of washing, it is more preferably treated with an active oxygen species such as ozone, oxygen plasma or the like, and from the viewpoint of simplicity, it is particularly preferably treated with ozone.

From the viewpoint of the stable obtainment of the polymer binding layer composed of the aromatic polymer compound having the structure represented by the formula (I), the concentration of a solution containing the conjugated polymer represented by the formula (II) is preferably from 0.0001% by mass to 50% by mass, more preferably from 0.001% by mass to 10% by mass, and particularly preferably from 0.005% by mass to 1% by mass. The immersion time required when the polymer binding layer is formed by immersion depends on the type of the above described conjugated polymer, and it is generally within 100 hours.

A solution from which impurities are reduced to the minimum can be preferably used as the above describe solution. In particular, if contaminants, or other molecules having the property of adsorbing on the Electrode Surface, are mixed into the solution, defects may be formed on the obtained polymer binding layer. The thus formed polymer binding layer has the structure represented by the formula (V).

$Ar^1$ in each of the above formulae (III), (V) and (XI) has the same definitions as those of Ar in the above formula (I). G is an r+p valent group having an aromatic ring; $X^1$ is a terminal group; r is an integer of 1 or greater and 10 or smaller; and n and p are each independently an integer of 1 or greater. If r is an integer of 2 or greater, the plurality of $E^a$ or E present may be identical to or different from one another. If n is an integer of 2 or greater, the plurality of $Ar^1$ present may be identical to or different from one another. If p is an integer of 2 or greater, the plurality of $X^1$ present may be identical to or different from one another. Moreover, the $X^1$ is bonded to a carbon atom which constitutes the aromatic ring in $Ar^1$.

The terminal group $X^1$ in each of the above formulae (II), (V) and (XI) is a hydrogen atom, a halogen atom, a nitro group, a group represented by $-SO_3Q^a$ (wherein $Q^a$ represents an alkyl group optionally having a substituent or an aryl group optionally having a substituent), an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, an arylalkyl group optionally having a substituent, an arylalkoxy group optionally having a substituent, an arylalkylthio group optionally having a substituent, an arylalkenyl group optionally having a substituent, an arylalkynyl group optionally having a substituent, an amino group, a substituted amino group, a silyl group, a substituted silyl group, a halogen atom, an acyl group optionally having a substituent, an acyloxy group optionally having a substituent, a carbamoyl group, an imide residue, a monovalent heterocyclic group optionally having a substituent, a carboxyl group, a substituted carboxyl group, a hydroxy group, a sulfonic acid group, a cyano group, a phosphoric acid group or a mercapto group; preferably, a hydrogen atom, an alkyl group optionally having a substituent, an alkoxy group optionally having a substituent, an aryl group optionally having a substituent, an aryloxy group optionally having a substituent, an arylalkyl group optionally having a substituent, an arylalkoxy group optionally having a substituent, a halogen atom or a sulfonic acid group; more preferably, a hydrogen atom, an aryl group optionally having a substituent, an aryloxy group optionally having a substituent or an arylalkyl group optionally having a substituent. When a plurality of terminal groups $X^1$ are present, they may be identical to or different from one another.

$E^a$ in the above formula (II) is preferably a monovalent group selected from the group consisting of a mercapto group, a hydroxy group, a carboxyl group, a sulfonic acid group, a phosphonic acid group, a trialkoxysilyl group, a trihydroxysilyl group, a chlorocarbonyl group(—COCl), a chlorophosphonic acid group (—POCl$_2$), a chlorosulfonic acid group (—SO$_2$Cl), a cyanate group, an isocyanate group, an amino group, a substituted amino group and a substituted disulfide group; more preferably, a monovalent group selected from the group consisting of a mercapto group, a hydroxy group, a carboxyl group, a sulfonic acid group, a phosphonic acid group, a chlorocarbonyl group, a chlorophosphonic acid and a chlorosulfonic acid group; further preferably, a monovalent group selected from the group consisting of a mercapto group, a carboxyl group, a sulfonic acid group, a phosphonic acid group, a chlorocarbonyl group, a chlorophosphonic acid group and a chlorosulfonic acid group; and particularly preferably, a monovalent group selected from the group consisting of a mercapto group and a carboxyl group. A substituted disulfide group is often generated as a result of the bonding of two mercapto groups, and as with a mercapto group, such a substituted disulfide group has a function of causing at least one interaction selected from the group consisting of a covalent bond, a coordinate bond, a hydrogen atom and an ionic bond.

Herein, the substituted disulfide group is a group represented by —SS—$R^D$, wherein $R^D$ is preferably an alkyl group, an aryl group, an arylalkyl group, an arylalkenyl group or an arylalkynyl group, and more preferably, an alkyl group or an aryl group.

E in each of the above formulae (V) and (XI) is a group generated as a result of the chemical bond of $E^a$ in the above formula (II) with a reactive group which is present on the Electrode Surface, and it is preferably a binding group formed as a result of at least one interaction selected from the group consisting of a covalent bond, a coordinate bond, a hydrogen atom and an ionic bond, which is caused by the reaction of the $E^a$ in the above formula (II) with a reactive group which is present on the Electrode Surface. Examples of such $E^a$, which forms such a binding group E, are the same monovalent groups as those exemplified as $E^a$ in the formula (II).

The state of the binding group (E) in the above formulae (V) and (XI), namely, the bonding state of $E^a$ with a reactive group which is present on the Electrode Surface has not been clarified. A case in which $E^a$ in the above formula (II) is a mercapto group (—SH) will be explained as an example. When such a mercapto group forms a covalent bond with a reactive group which is present on the Electrode Surface, it can be expressed as a structure in which a hydrogen atom of the mercapto group is substituted with an atom on the Electrode Surface. When such a mercapto group forms a coordinate bond with a reactive group which is present on the Electrode Surface, it can be expressed in a state in which an unshared electron pair on a sulfur atom of the mercapto group is donated to an atom on the Electrode Surface and it is bonded thereto. When such a mercapto group forms a hydrogen bond with a reactive group which is present on the Electrode Surface, it can be expressed in a state in which a hydrogen atom or a sulfur atom of the mercapto group is bonded to an atom on the Electrode Surface via a hydrogen bond. When such a mercapto group is bonded to a reactive group which is present on the Electrode Surface via an ionic bond, it can be expressed in a state in which a hydrogen atom of the mercapto group is dissociated as a proton, and in which the generated mercapto ion electrostatically interacts with a cationic species on the Electrode Surface.

The reactive group which is present on the Electrode Surface is defined as an atom or an atomic group on the Electrode Surface, which is capable of reacting with $E^a$ in the above formula (II). For example, when the electrode is made of aluminum, the reactive group can be an aluminum atom present on the surface or an aluminum ion reactive group generated from the aluminum atom. When the electrode is made of silver, the reactive group can be a silver atom present on the surface or a silver ion generated from the silver atom. When the surface of such a metal electrode has been oxidized, a metallic ion or an atomic group such as an oxygen atom, an oxygen ion and a hydroxy group, which exist on the surface, may serve as a reactive group. When the electrode is an oxide such as ITO, an atomic group such as an oxygen atom, an oxygen ion and a hydroxy group, a metallic atom, and a metallic ion, which exist on the surface, may serve as a reactive group.

Such a reactive group exists on the surface of an electrode, and the reactivity of the electrode with $E^a$ in the above formula (II) can be improved by a washing treatment, an activation treatment, and the like.

G in the above formulae (II) and (V) is an r+p valent group having an aromatic ring. Accordingly, at least one of $G^1$, $G^2$ and $G^3$ in the above formula (XI) (provided that r=q×s×t) is a group having an aromatic ring. Moreover, G in the above formulae (II) and (V) is preferably an r+p valent group, which is a monocycle, a condensed ring, a ring assembly or a bridged polycycle. Furthermore, the r+p valent group is preferably a monocycle, a condensed ring, a ring assembly or a bridged polycycle, comprising at least one of heterocyclic rings and aromatic rings represented by the following formulae (1) to (16):

1

2

3

4

5

6

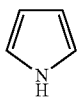
7

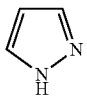
8

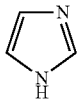
9

10

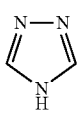
11

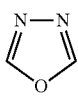
12

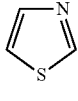
13

14

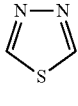
15

16 and is more preferably a monocycle, a condensed ring, a ring assembly or a bridged polycycle, comprising one heterocyclic ring represented by the above formula (5). The above described monocycle, condensed ring, ring assembly and bridged polycycle may optically have a substituent. It is to be noted that binding portions and substituents are omitted from the above formulae (1) to (16). Moreover, in the present invention, the "group having an aromatic ring" includes aromatic hydrocarbon groups and heterocyclic aromatic hydrocarbon groups. When G in the above formula (V) is an r+p valent group, which is a monocycle, a condensed ring, a ring assembly or a bridged polycycle, $G^1$ and $G^2$ in the above formula (XI) (provided that r=q×s×t) are both single bonds; $G^3$ is G; q=1; s=1; t=r; and u=0.

Examples of such a group having an aromatic ring include: monocyclic aromatic rings such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, a thiazole ring, an oxadiazole ring, a thiadiazole and an azadiazole ring; condensed aromatic rings, which are formed by the condensation of two or more independent rings selected from among the above described monocyclic aromatic rings; aggregates of aromatic rings, which are formed by ligating two or more independent rings selected from among the above described monocyclic aromatic rings and/or the above described condensed polycyclic aromatic rings, with divalent atoms or groups, such as a single bond, a methylene group, an ethylene group, an ethenylene group, an ethynylene group, an oxygen atom, a sulfur atom, an imino group, a carbonyl group and a sulfonyl group; and bridged polycyclic aromatic rings having one or more bridges, wherein two adjacent aromatic rings in the above described condensed polycyclic aromatic rings or the above described aggregates of aromatic rings are bridged using divalent groups such as a methylene group, an ethylene group, a carbonyl group and a sulfonyl group. Moreover, the number of monocyclic aromatic rings, which are condensed in the above described condensed aromatic rings, is preferably 2 to 4, more preferably 2 or 3, and further preferably 2. The number of monocyclic aromatic rings and/or condensed aromatic rings, which are ligated in the above described aggregates of aromatic rings, is preferably 2 to 4, more preferably 2 or 3, and further preferably 2. The number of monocyclic aromatic rings and/or condensed aromatic rings, which are bridged in the above described bridged polycyclic aromatic rings, is preferably 2 to 4, more preferably 2 or 3, and further preferably 2.

Hereinafter, specific examples of groups having such aromatic rings are given with their basic strictures (which are therefore in non-substituted states). It is to be noted that binding portions are omitted from the chemical formulae as shown below. Examples of the above described monocyclic aromatic ring are as follows:

20

21

22

23

24

25

26

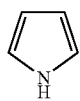
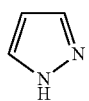
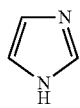
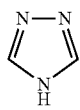
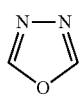
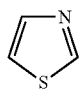
Examples of the above described condensed aromatic ring are as follows:
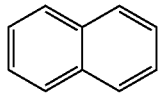
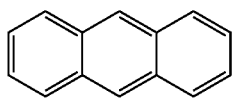
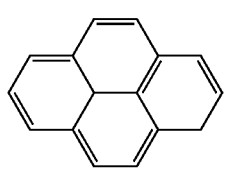
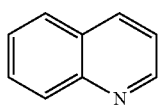
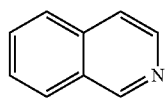
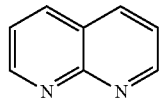
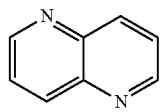
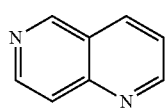
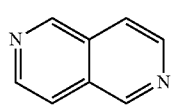
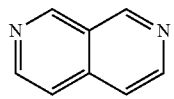
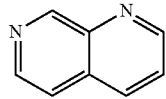
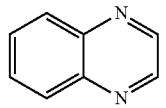
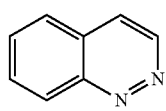
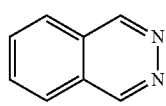
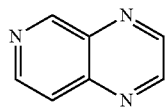
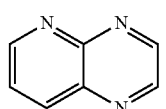
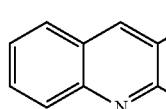
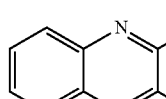

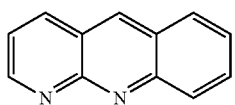
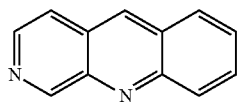
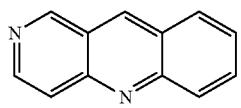
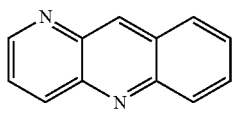
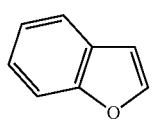
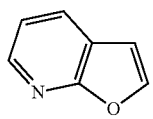
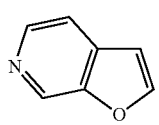
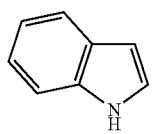
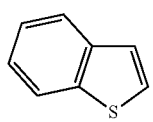
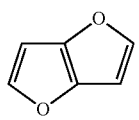
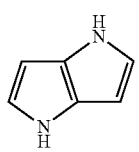
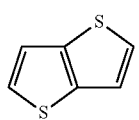
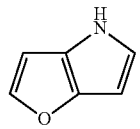
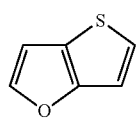
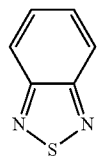
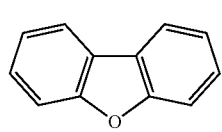
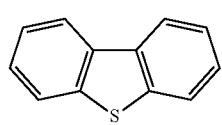
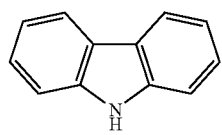
Examples of the above described aggregate of aromatic rings are as follows:
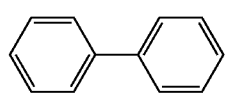
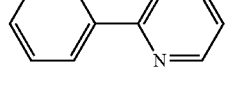
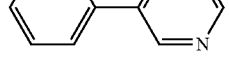
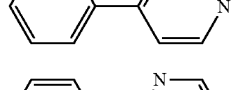
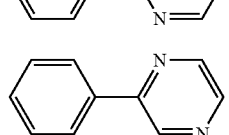

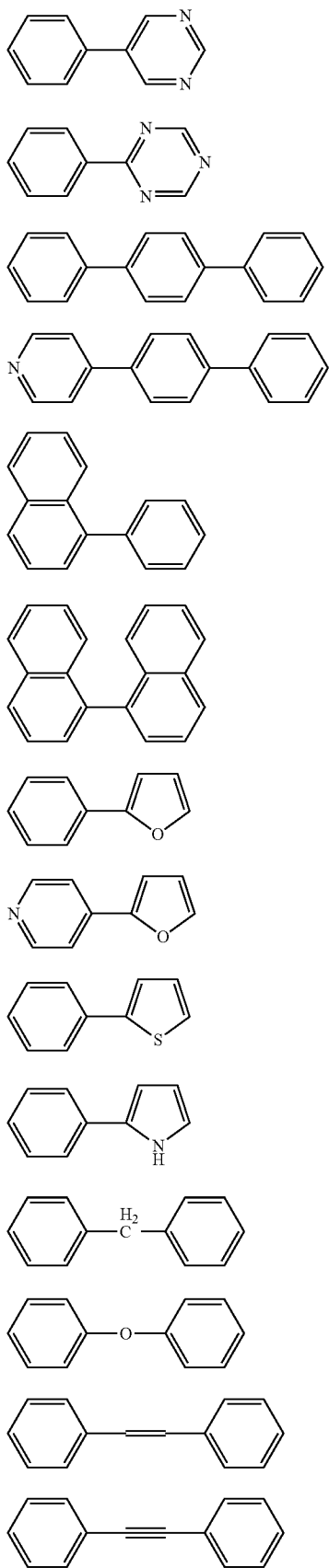
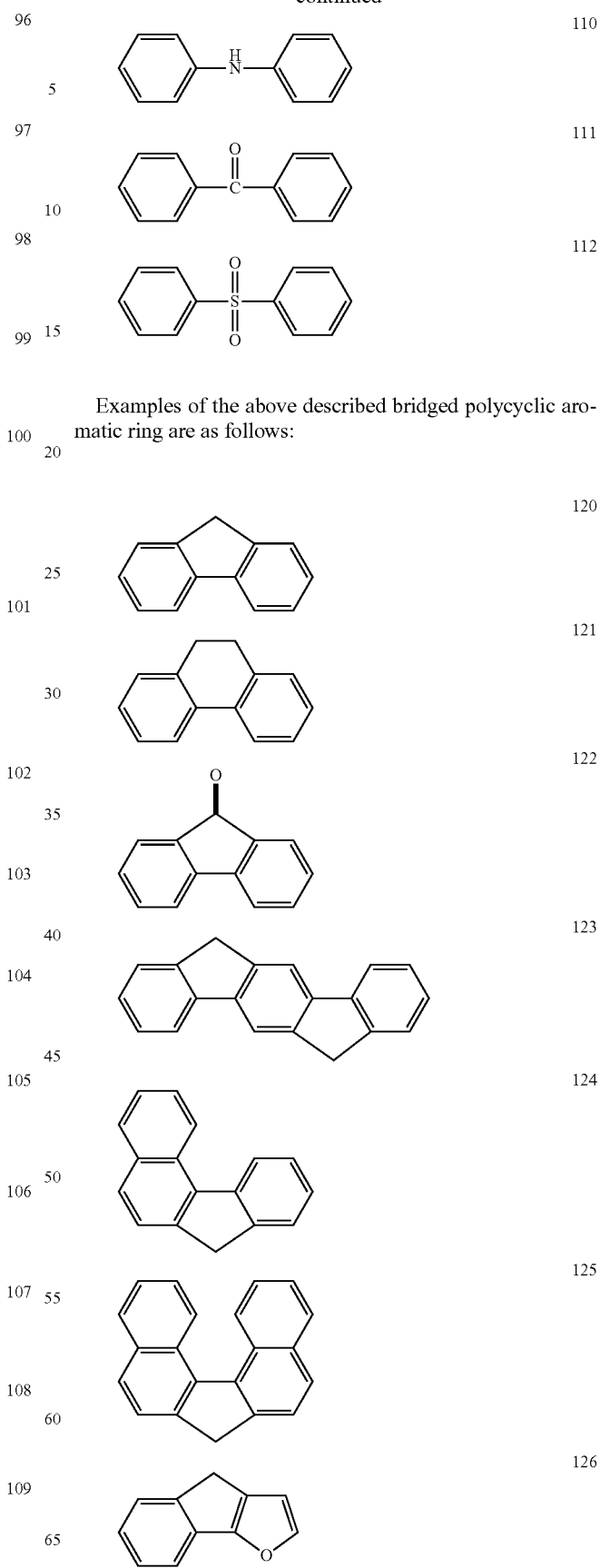
Examples of the above described bridged polycyclic aromatic ring are as follows:
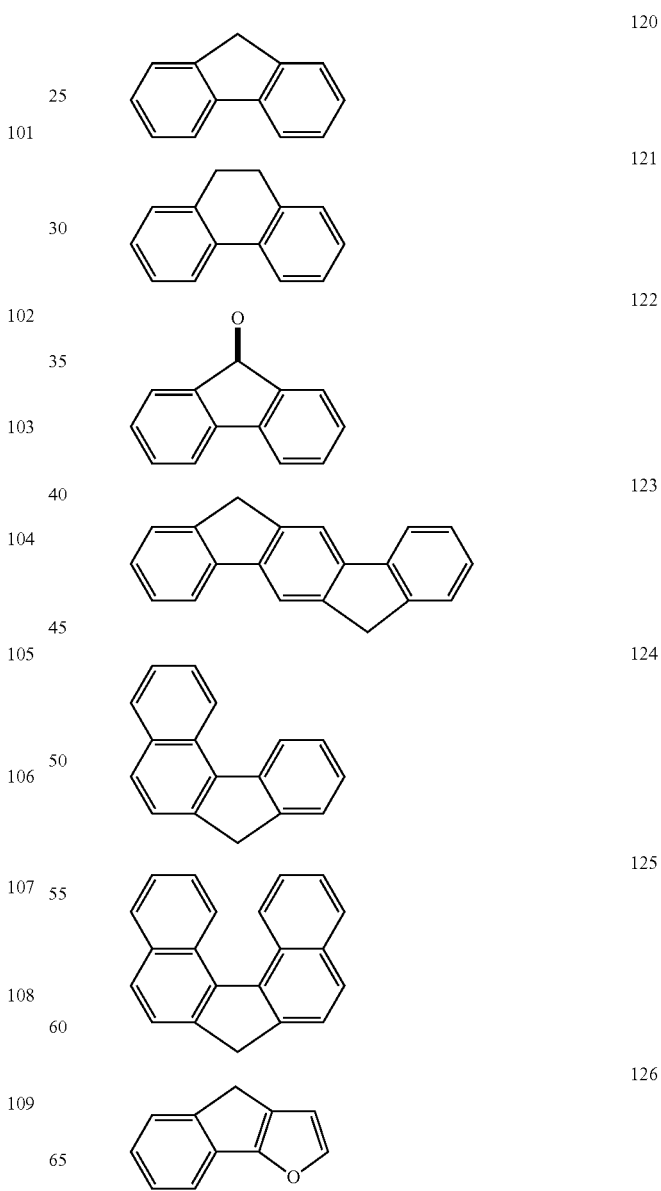

-continued

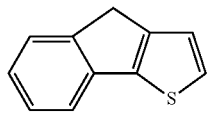
127

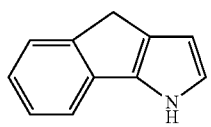
128

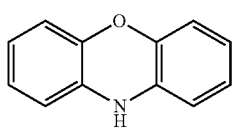
129

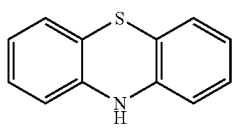
130

Among groups having these aromatic rings, groups having the aromatic rings represented by the above formulae 20, 21, 23, 24, 25, 26, 29, 30, 33, 34, 50, 51, 53, 54, 56, 58, 66, 67, 72, 75, 76, 80, 81, 82, 90, 91, 92, 93, 94, 96, 97, 98, 99, 100, 101, 106, 107, 108, 109, 110, 111, 112, 120, 124, 129 and 130 are preferable; groups having the aromatic rings represented by the above formulae 20, 21, 23, 24, 25, 26, 50, 53, 80, 82, 90, 91, 92, 93, 94, 96, 97, 106, 107, 108, 109, 110, 111, 120 and 124 are more preferable; groups having the aromatic rings represented by the above formulae 20, 21, 23, 24, 25, 26, 80, 90, 94, 96, 97, 107, 111, 120 and 124 are further preferable; groups having the aromatic rings represented by the above formulae 20, 21, 25, 26, 90, 97, 120 and 124 are particularly preferable; and groups having the aromatic rings represented by the above formulae 20, 25, 90, 97 and 120 are most preferable.

Furthermore, in the present invention, the group having the above described aromatic ring consists only of preferably a hydrogen atom, a carbon atom, an oxygen atom and a nitrogen atom, and more preferably, only of a hydrogen atom, a carbon atom and a nitrogen atom.

In a group having the above described aromatic ring, a hydrogen atom bonding to a carbon atom which constitutes the aromatic ring may be substituted with a hydroxy group, a fluorine atom, a nitro group, a cyano group, an alkyl group, an alkoxy group, a hydrocarbon-disubstituted amino group, an alkylthio group, a hydrocarbon carbonyl group, a hydrocarbon oxy carbonyl group, a hydrocarbon-disubstituted amino carbonyl group or a hydrocarbon sulfonyl group. Among others, as substituents, a fluorine atom, a nitro group, a cyano group, an alkyl group, an alkoxy group, a hydrocarbon-disubstituted amino group, an alkylthio group, a hydrocarbon carbonyl group and a hydrocarbon oxy carbonyl group are more preferable; and a fluorine atom, a nitro group, a cyano group, an alkyl group, an alkoxy group, and a hydrocarbon-disubstituted amino group are further preferable. Moreover, a hydrogen atom bonding to a nitrogen atom which constitutes the aromatic ring may be substituted with a hydrocarbon group. Furthermore, when two or more substituents are present on such a carbon atom and/or on a nitrogen atom, two substituents selected from such substituents may be bonded to each other to form a ring.

The above described hydrocarbon carbonyl group, hydrocarbon oxy carbonyl group and hydrocarbon sulfonyl group are groups formed by bonding one hydrocarbon group as described above to a carbonyl group, an oxy carbonyl group and a sulfonyl group, respectively. The above described hydrocarbon-disubstituted amino group and hydrocarbon-disubstituted amino carbonyl group are groups formed by bonding two hydrocarbon groups as described above to an amino group and an amino carbonyl group, respectively.

When a group having the above described aromatic ring is a di- or more functional organic group, as a substituent on the carbon atom of the group having the aromatic ring, an alkyl group, an alkoxy group, a hydrocarbon-disubstituted amino group, an alkylthio group, a hydrocarbon carbonyl group and a hydrocarbon oxy carbonyl group are preferable; an alkyl group, an alkoxy group and a hydrocarbon-disubstituted amino group are more preferable; and an alkyl group and an alkoxy group are further preferable. As a substituent on the nitrogen atom, an alkyl group is preferable.

In the above formulae (II), (V) and (XI), n is an integer of 1 or greater, preferably an integer of 1 or greater and $1 \times 10^6$ or smaller, more preferably an integer of 1 or greater and $1 \times 10^5$ or smaller, and further preferably an integer of 1 or greater and $1 \times 10^4$ or smaller. In the above formulae (II) and (V), r is an integer of 1 or greater and 10 or smaller, preferably an integer of 1 or greater and 5 or smaller, more preferably an integer of 1 or greater and 3 or smaller, and particularly preferably 1 or 2. However, when G in the above formulae (II) and (V) has a monocyclic aromatic ring structure and there are two carbon atoms which constitute the above described ring structure (for example, the above formulae 11, 12 and 15), r is 1. When there are three above carbon atoms (for example, the above formulae 5, 8 to 10 and 13), r is 1 or 2.

In the above formulae (II), (V) and (XI), p is an integer of 1 or greater, preferably an integer of 1 or greater and 10 or smaller, more preferably an integer of 1 or greater and 5 or smaller, particularly preferably an integer of 1 or greater and 3 or smaller, and most preferably 1 or 2. However, when G in the above formulae (II) and (V) has a monocyclic aromatic ring structure and there are two carbon atoms which constitute the above described ring structure (for example, the above formulae 11, 12 and 15), p is 1. When there are three above carbon atoms (for example, the above formulae 5, 8 to 10 and 13), p is 1 or 2.

Moreover, in the above formulae (II) and (V), r+p as a valence number of G is preferably an integer of 2 or greater and 20 or smaller, more preferably an integer of 2 or greater and 10 or smaller, further preferably an integer of 2 or greater and 5 or smaller, and particularly preferably 2 or 3.

In the present invention, $Ar^1$ in the above formulae (II), (V) and (XI) preferably comprises a repeating unit represented by the following formula (VI):

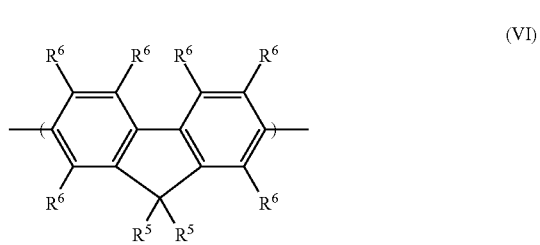

(VI)

in an amount of 0.1% by mass or more with respect to the total mass of the number of all repeating units in the aromatic polymer compound which constitutes the polymer binding layer, and/or a repeating unit represented by the following formula (VII):

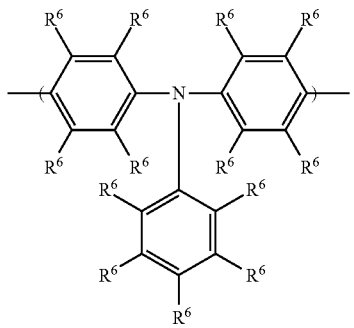

(VII)

in an amount of 0.1% by mass or more with respect to the total mass of the number of all repeating units in the aromatic polymer compound which constitutes the polymer binding layer. The content of the repeating unit represented by the above formula (VI) is more preferably 1% by mass or more, and particularly preferably 5% by mass or more. In addition, the content of the repeating unit represented by the above formula (VII) is more preferably 1% by mass or more, and particularly preferably 5% by mass or more.

In the laminated structure of the present invention, a total of the molar percentage of the repeating unit represented by the formula (VI) and the molar percentage of the repeating unit represented by the formula (WI) is preferably 10 mole % or more and 100 mole % or less, more preferably 15 mole % or more and 100 mole % or less, and further preferably 20 mole % or more and 100 mole % or less, with respect to a total of all repeating units in the aromatic polymer compound which constitutes the polymer binding layer.

$R^5$ in the above formula (VI) is a hydrogen atom, an alkyl group optionally having a substituent, an aryl group optionally having a substituent, an arylalkyl group optionally having a substituent, or a monovalent heterocyclic group optionally having a substituent. When these groups are present in a plural number, they may be identical to or different from one another.

Moreover, from the viewpoint of the stability of a copolymer, the easiness of synthesis, etc., $R^5$ is preferably a hydrogen atom, an alkyl group optionally having a substituent, an aryl group optionally having a substituent, an arylalkyl group optionally having a substituent, or a monovalent heterocyclic group optionally having a substituent; more preferably, an alkyl group optionally having a substituent, an aryl group optionally having a substituent, or an arylalkyl group optionally having a substituent; and further preferably, an alkyl group optionally having a substituent, or an aryl group optionally having a substituent. When a plurality of $R^5$, which are alkyl groups optionally having a substituent or aryl groups optionally having a substituent, are present, they may be bonded to one another to form a ring.

$R^6$ in the above formulae (VI) and (VII) is a hydrogen atom, an alkyl group optionally having a substituent, an alkoxy group optionally having a substituent, an alkylthio group optionally having a substituent, an aryl group optionally having a substituent, an aryloxy group optionally having a substituent, an arylthio group optionally having a substituent, an arylalkyl group optionally having a substituent, an arylalkoxy group optionally having a substituent, an arylalkylthio group optionally having a substituent, an arylalkenyl group optionally having a substituent, an arylalkynyl group optionally having a substituent, an amino group, a substituted amino group, a silyl group, a substituted silyl group, a halogen atom, an acyl group optionally having a substituent, an acyloxy group, a carbamoyl group, an imide residue, a monovalent heterocyclic group optionally having a substituent, a carboxyl group, a substituted carboxyl group, or a cyano group. When these groups are present in a plural number, they may be identical to or different from one another. In addition, the $R^6$ is preferably a hydrogen atom, an alkyl group optionally having a substituent, an alkoxy group optionally having a substituent, an aryl group optionally having a substituent, aryloxy group optionally having a substituent, an arylalkyl group optionally having a substituent, an arylalkoxy group optionally having a substituent, a substituted amino group, a substituted silyl group, an acyl group optionally having a substituent, a substituted carboxyl group, or a cyano group; more preferably, a hydrogen atom, an alkyl group optionally having a substituent, an alkoxy group optionally having a substituent, an aryl group optionally having a substituent, an aryloxy group optionally having a substituent, an arylalkyl group optionally having a substituent, an arylalkoxy group optionally having a substituent, or a substituted carboxyl group; further preferably, a hydrogen atom, an alkyl group optionally having a substituent, an alkoxy group optionally having a substituent, or an aryl group optionally having a substituent; and particularly preferably, a hydrogen atom or an alkyl group. When a plurality of $R^6$, which are alkyl groups optionally having a substituent, are present, they may be bonded to one another to form a ring.

Furthermore, as an aromatic polymer compound used in the laminated structure of the present invention, a conjugated polymer represented by the following formula (VIII):

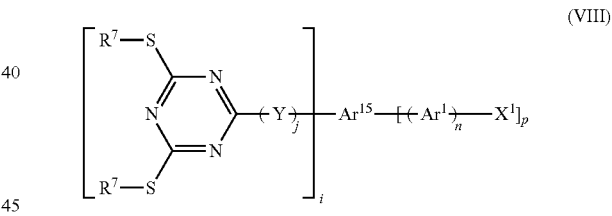

(VIII)

is also preferable.

$Ar^1$ in the above formula (VIII) has the same definitions as those of Ar in the above formulae (I) and (II); $X^1$, n and p each have the same definitions as those of $X^1$, n and p in the above formula (II). In addition, i is an integer of 1 or greater, preferably an integer of 1 or greater and 10 or smaller, more preferably an integer of 1 or greater and 5 or smaller, particularly preferably an integer of 1 or greater and 3 or smaller, and most preferably 1 or 2. I+p is an integer of 2 or greater and 20 or smaller, preferably an integer of 2 or greater and 10 or smaller, more preferably an integer of 2 or greater and 5 or smaller, and particularly preferably 2 or 3. When i is 2 or greater, the plurality of Y and $R^7$ present may be identical to or different from one another. Moreover, when p is 2 or greater, the plurality of $X^1$ present may be identical to or different from one another.

$A^{15}$ in the above formula (VIII) is an i+p valent group having an aromatic ring, and it is preferably an r+p valent group, which is a monocycle, a condensed ring, a ring assembly or a bridged polycycle. Moreover, the above described r+p valent group is preferably a monocycle, a condensed ring, a ring assembly or a bridged polycycle, comprising at least one of the heterocyclic rings and the aromatic rings represented by the above formulae (1) to (16). The above described monocycle, condensed ring, ring assembly and bridged polycycle may optionally have a substituent. Specific examples of the basic structures (which are therefore in non-substituted states) of groups having such aromatic rings include those represented by the above formulae 20 to 133 (wherein binding portions are omitted).

Among the groups having such aromatic rings, the groups represented by the above formulae 20, 21, 23-26, 50, 51, 80, 82, 90-94, 96, 97, 106-111, 120 and 124 are preferable; the groups represented by the above formulae 20, 21, 23, 24, 26, 51, 80, 90, 94, 96, 97, 107, 111, 120 and 124 are more preferable; the groups represented by the above formulae 20, 21, 23, 51, 90, 120 and 124 are further preferable; and the groups represented by the above formulae 20, 90 and 120 are particularly preferable.

j in the above formula (VIII) is 0 or 1, and is preferably 0. In addition, Y is an oxygen atom, a sulfur atom, an imino group, a substituted imino group, an ethenylene group, a substituted ethenylene group, or an ethynylene group. The substituted imino group is a group represented by —N($Q^4$)- (wherein $Q^4$ represents a substituent), and an example of $Q^4$ is an alkyl group optionally having a substituent. Specific examples of such an alkyl group are the same as those as exemplified above. The substituted ethenylene group is a group represented by —C($Q^5$)=C($Q^6$)- (wherein $Q^5$ and $Q^6$ are each independently a hydrogen atom or a substituent, and at least one of $Q^5$ and $Q^6$ is a substituent). An example of $Q^5$ and $Q^6$ as substituents is an alkyl group. Specific examples of such an alkyl group are the same as those as exemplified above. Such Y is preferably an oxygen atom, a sulfur atom, an imino group, a substituted imino group, or an ethynylene group; more preferably, an oxygen atom, a sulfur atom, an imino group, or a substituted imino group; and further preferably, an oxygen atom or an imino group.

In the above formula (VIII), $R^7$ is a hydrogen atom, an alkyl group optionally having a substituent, an alkylthio group optionally having a substituent, an aryl group optionally having a substituent, an arylthio group optionally having a substituent, an arylalkyl group optionally having a substituent, an arylalkylthio group optionally having a substituent, an arylalkenyl group optionally having a substituent, an arylalkynyl group optionally having a substituent, a silyl group, a substituted silyl group, an acyl group optionally having a substituent, or a monovalent heterocyclic group optionally having a substituent, wherein the plurality of $R^7$ present may be identical to or different from one another, and they may be bonded to one another to form a ring. Such $R^7$ is preferably a hydrogen atom, an alkyl group optionally having a substituent, an aryl group optionally having a substituent, an arylalkyl group optionally having a substituent, a silyl group, a substituted silyl group, or an acyl group optionally having a substituent; and more preferably, a hydrogen atom, an alkyl group optionally having a substituent, a substituted silyl group, or an acyl group optionally having a substituent. Specific examples of these groups are the same as those as exemplified above.

When the laminated structure of the present invention is produced, the conjugated polymer represented by the above formula (VIII), wherein $R^7$ is a hydrogen atom, an alkylthio group optionally having a substituent, an arylthio group optionally having a substituent, or an arylalkylthio group optionally having a substituent, can be directly used in the formation of the above described polymer binding layer. However, in the case of the conjugated polymer represented by the above formula (VIII), wherein $R^7$ is a group other than the above described groups, $R^7$ is converted to a hydrogen atom, an alkylthio group optionally having a substituent, an arylthio group optionally having a substituent, or an arylalkylthio group optionally having a substituent, according to the method described in PROTECTIVE GROUPS in ORGANIC SYNTHESIS THIRD EDITION, THEODORA W GREENE, PETER GM. WUTS, WILEY-INTERSCIENCE, pp. 454-493; a reaction using metallic sodium described in J. Am. Chem. Soc., 1949, pp. 1253-1257; a reaction using iodine described in J. Am. Chem. Soc., 2005, pp. 8036-8043; and other methods, and as a result, it becomes possible to use the conjugated polymer in the formation of the polymer binding layer.

There may be a case in which $R^7$ is converted to a hydrogen atom in the process of producing the conjugated polymer represented by the above formula (VIII). In this case, the aforementioned conversion of a group to a hydrogen atom, an alkylthio group optionally having a substituent, an arylthio group optionally having a substituent, or an arylalkylthio group optionally having a substituent, can be omitted.

Accordingly, the conjugated polymer represented by the above formula (VIII), wherein $R^7$ is a hydrogen atom or an alkylthio group optionally having a substituent, can be directly used, and in the case of the conjugated polymer represented by the above formula (VIII), wherein $R^7$ is a group other than a hydrogen atom or an alkylthio group optionally having a substituent, $R^7$ is converted to a hydrogen atom or an alkylthio group optionally having a substituent. The thus obtained compound corresponds to the conjugated polymer represented by the above formula (II), wherein G has a structure represented by the following formula (XIII):

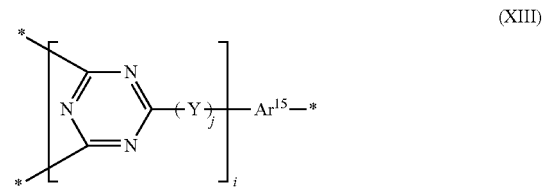

(XIII)

and $E^a$ is $R^7$—S (wherein $R^7$ is a hydrogen atom, an alkylthio group optionally having a substituent, an arylthio group optionally having a substituent, or an arylalkylthio group optionally having a substituent), and r=2×i. It is to be noted that Y, $Ar^{15}$, i and j in the above formula (XIII) have the same definitions as those of Y, $Ar^{15}$, i and j in the above formula (VIII), respectively, and the symbol * indicates a binding portion with $E^a$ or $Ar^1$.

Preferred specific examples of such a conjugated polymer represented by the above (II) will be given below.

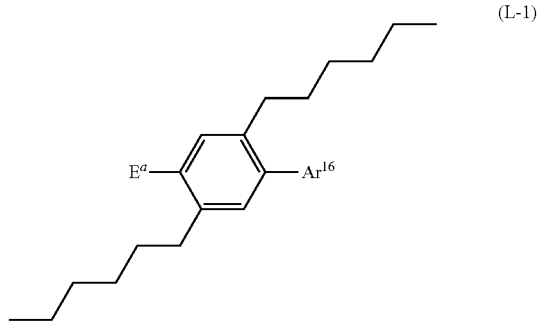

(L-1)

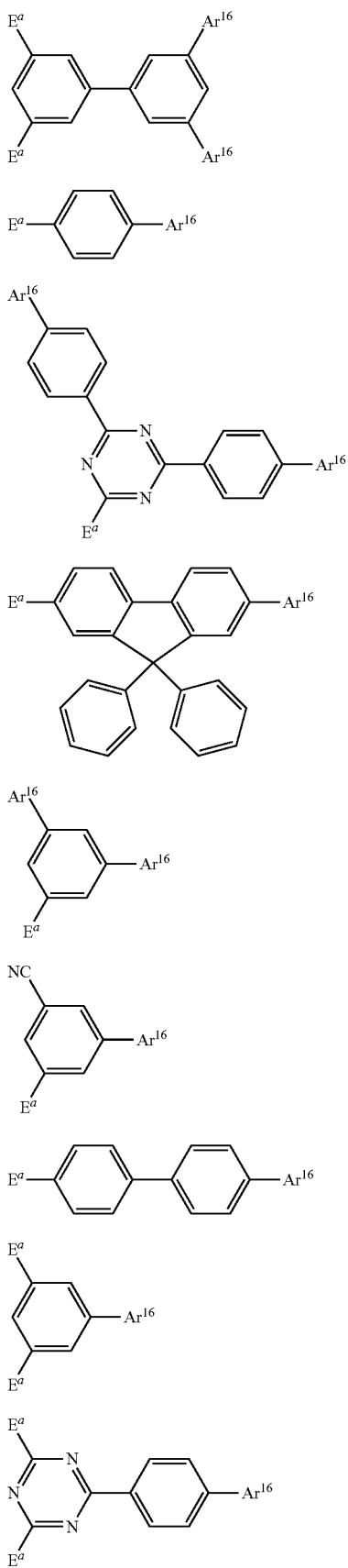
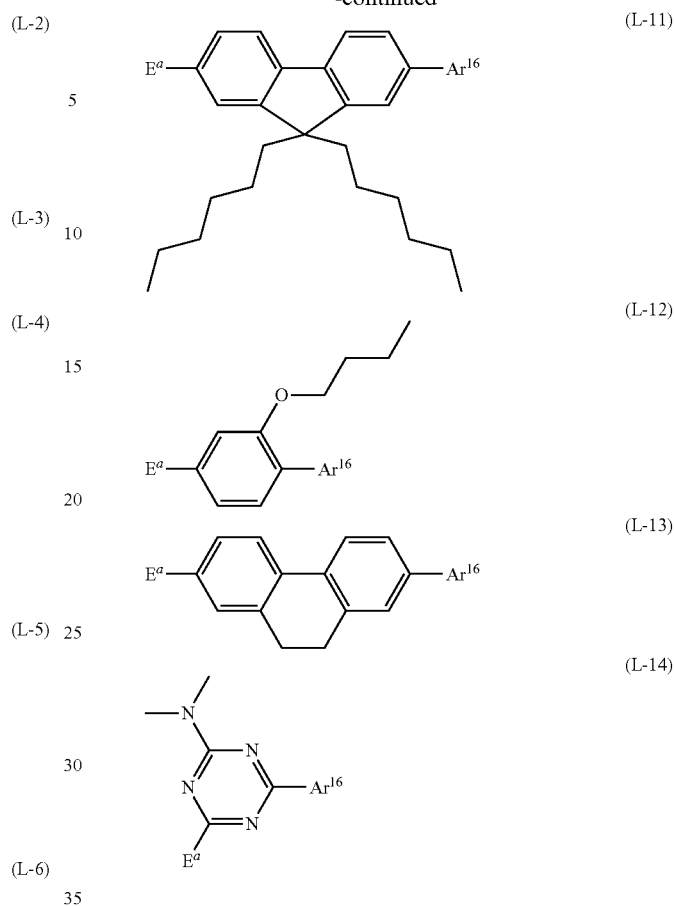

Herein, $E^a$ has the same definitions as those of $E^a$ in the above formula (II); and $Ar^{16}$ is $—(Ar^1)_n—X^1$, wherein $Ar^1$ has the same definitions as those of Ar in the above formulae (I) and (II), and X' and n have the same definitions as those of $X^1$ and n in the above formula (II), respectively.

Of these conjugated polymers, the conjugated polymers represented by the above formulae (L-2) to (L-4), (L-6), (L-9), (L-10) and (L-11) are more preferable, and the conjugated polymers represented by the above formulae (L-4), (L-9) and (L-10) are particularly preferable.

(Method for Producing Conjugated Polymer)

A method for producing the conjugated polymer used in the present invention will be described below, using the conjugated polymer represented by the above formula (II) as an example. The conjugated polymer represented by the above formula (II) can be produced by polycondensing a conjugated compound represented by the following formula (XIV):

and an aromatic compound represented by the following formula (IV):

using a polymerization catalyst or an equivalently reactive reactant.

G, r and p in the above formula (XIV) have the same definitions as those of G, r and p in the above formula (II), and $Ar^1$ in the above formula (IV) has the same definitions as those of $Ar^1$ in the above formula (II). Moreover, M in the above formula (IV) has the same definitions as those of M in the formula (IV), which will be described later in the section <Method (B) of polycondensing aromatic compound>. Furthermore, the polymerization catalyst, equivalently reactive reactant and polycondensation conditions are the same as those in the method (B) of polycondensing an aromatic compound, which will be described later.

$E^b$ in the above formula (XIV) is $E^a$ in the above formula (II), and/or a group which can be converted to $E^a$ in the above formula (II). When $E^a$ is a mercapto group or a substituted disulfide group, examples of such $E^b$ include those exemplified as $-S-R^7$ in the above formula (VIII). In addition, when $E^a$ is a carboxyl group, an example of such $E^b$ is an atomic group $-C(O)O-R$ containing an ester bond with an alkyl group R optionally having a substituent.

$X^a$ in the above formula (XIV) is a halogen atom, or a group represented by $-SO_3Q^a$ (wherein $Q^a$ represents an alkyl group optionally having a substituent, or an aryl group optionally having a substituent). Examples of the above described halogen atom include a fluorine atom, a chlorine atom, a bromine atom and an iodine atom; and a chlorine atom, a bromine atom and an iodine atom are preferable. Preferred examples of the group represented by $-SO_3Q^a$ include a methane sulfonate group, a benzene sulfonate group, a p-toluene sulfonate group, and a trifluoromethane sulfonate group.

Of these, $X^a$ is preferably a chlorine atom, a bromine atom, an iodine atom, a p-toluene sulfonate group or a trifluoromethane sulfonate group; further preferably, a bromine atom, an iodine atom, or a trifluoromethane sulfonate group; and particularly preferably, a bromine atom or an iodine atom.

As the conjugated polymer represented by the above formula (II), when the conjugated polymer of the present invention, represented by the above formula (VIII), is produced, a conjugated compound represented by the following formula (IX):

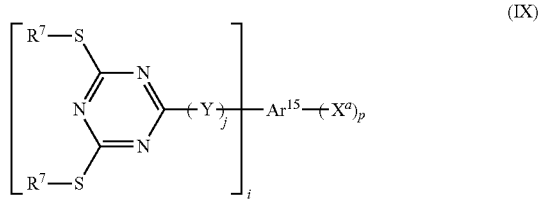

is preferably added, when the aromatic compound represented by the above formula (IV) is polycondensed. The additive amount of the compound of the above formula (IX) may be adjusted depending on the molecular weight of a polymer of interest. The additive amount of the compound of the above formula (IX) is generally 0.00001 mole % or more and 50 mole % or less, preferably 0.0001 mole % or more and 30 mole % or less, and more preferably 0.0001 mole % or more and 20 mole % or less. It is to be noted that $R^7$, Y, $Ar^{15}$, i and j in the above formula (IX) have the same definitions as those of $R^7$, Y, $Ar^{15}$, i and j in the above formula (VIII), and that $X^a$ in the above formula (IX) has the same definitions as those of $X^a$ in the above formula (XIV).

The conjugated polymer represented by the above formula (II), which has been formed by a polycondensation reaction, is composed of a linear aromatic polymer compound, if p is 1. If p is 2 or greater, the above conjugated polymer is composed of an aromatic polymer compound in which a linear polymer chain is branched to a p number of chains at G. In both cases, the formed conjugated polymer has a group capable of being chemically bonded to an electrode at either one terminus thereof.

<Method (B) of Polycondensing Aromatic Compound>

The polymer binding layer used in the present invention can also be formed by a method (B) of polycondensing an aromatic compound on an electrode, as described below. Herein, the case of forming the polymer binding layer represented by the above formula (V) will be described as an example. This method (B) is a method, which comprises, in a solution, in the presence of an electrode, to the surface of which a group represented by the following formula (III) is bonded:

polycondensing an aromatic compound represented by the following formula (IV):

using a polymerization catalyst or an equivalently reactive reactant, so as to form the above described polymer binding layer on the above described electrode. The thus formed polymer binding layer has the structure represented by the above formula (V).

$Ar^1$ in the above formula (IV) has the same definitions as those of $Ar^1$ in the above formula (II). M in the above formula (IV) represents a hydrogen atom, a halogen atom, a group represented by $-B(OQ^1)_2$, $-Si(Q^2)_3$, $-Sn(Q^3)_3$ or $-SO_3Q^a$, or $-Z^1(Z^2)_m$, and the two M may be identical to or different from each other.

$Q^1$ in the above $-B(OQ^1)_2$ are each independently a hydrogen atom, an alkyl group optionally having a substituent, or an aryl group optionally having a substituent, and they may be bonded to one another to form a ring. $Q^1$ is preferably an alkyl group optionally having a substituent; more preferably, a methyl group, an ethyl group, a propyl group, an isopropyl group, a butyl group, an isobutyl group, a pentyl group, a hexyl group, or a nonyl group; and further preferably, a methyl group, an ethyl group, a propyl group, a butyl group, a pentyl group, or a hexyl group. When $Q^1$ form a ring, preferred examples of a bifunctional hydrocarbon group consisting of two $Q^1$ include a 1,2-ethylene group, a 1,1,2,2-tetramethyl-1,2-ethylene group, a 1,3-propylene group, a 2,2-dimethyl-1,3-propylene group, and a 1,2-phenylene group.

$Q^2$ in the above $-Si(Q^2)_3$ are each independently an alkyl group optionally having a substituent, or an alkoxy group optionally having a substituent. $Q^2$ is preferably a methyl group, an ethyl group, a propyl group, an isopropyl group, a butyl group, an isobutyl group, a pentyl group, a hexyl group, a nonyl group, a methoxy group, an ethoxy group, a propyloxy group, an isopropyloxy group, a butoxy group, an isobutoxy group, a pentyloxy group, or a hexyloxy group; and more preferably, a methyl group, an ethyl group, a propyl group, a butyl group, a methoxy group, an ethoxy group, a propyloxy group, an isopropyloxy group, or a butoxy group.

$Q^3$ in the above $-Sn(Q^3)_3$ are each independently alkyl groups each optionally having a substituent. $Q^3$ is preferably a methyl group, an ethyl group, a propyl group, an isopropyl group, a butyl group, an isobutyl group, a pentyl group, a hexyl group, or a nonyl group; and more preferably, a methyl group, an ethyl group, a propyl group, a butyl group, a pentyl group, or a hexyl group.

$Q^a$ in the above —$SO_3Q^a$ is an alkyl group optionally having a substituent, or an aryl group optionally having a substituent. The group represented by —$SO_3Q^a$ is preferably a methane sulfonate group, a benzene sulfonate group, a p-toluene sulfonate group, or a trifluoromethane sulfonate group.

In the above —$Z^1(Z^2)_m$, $Z^1$ is a metallic atom or a metallic ion, $Z^2$ is a counteranion, and m is an integer of 0 or greater. Examples of $Z^1$ include the atoms or ions of Li, Na, K, Rb, Cs, Be, Mg, Ca, Sr, Ba, Al, Ga, In, Tl, Pb, Sc, Ti, V, Cr, Mn, Fe, Co, Ni, Cu, Zn, Y, Zr, Nb, Mo, Tc, Ru, Rh, Ag, Cd, La, Ce, Sm, Eu, Hf, Ta, W, Re, Os, Ir, Pt, Au, Hg and the like. $Z^1$ is preferably Li, Na, K, Rb, Cs, Be, Mg, Ca, Sr, Ba, Al, Ga, In, Ti, Pb, Sc, Ti, Cu, Zn, Y, Zr, Ag, or Hg; more preferably, Li, Na, K, Rb, Cs, Be, Mg, Ca, In, Ti, Pb, Cu, Zn, Zr, Ag, or Hg; and further preferably, Li, Na, K, Mg, Ca, Cu, or Zn.

As $Z^2$, a conjugated base such as Bronsted acid is generally used, examples of such a conjugated base include a fluoride ion, a chloride ion, a bromide ion, an iodide ion, a sulfuric acid ion, a nitric acid ion, a carbonic acid ion, a perchloric acid ion, a tetrafluoroborate ion, a hexafluorophosphate ion, a methanesulfonic acid ion, a trifluoromethanesulfonic acid ion, a toluenesulfonic acid ion, an acetic acid ion, a trifluoroacetic acid ion, a propionic acid ion, a benzoic acid ion, a hydroxide ion, an oxide ion, a methoxide ion, and an ethoxide ion. $Z^2$ is preferably a chloride ion, a bromide ion, an iodide ion, a sulfuric acid ion, a nitric acid ion, a carbonic acid ion, a methanesulfonic acid ion, a trifluoromethanesulfonic acid ion, a toluenesulfonic acid ion, an acetic acid ion, a trifluoroacetic acid ion, a propionic acid ion, or a benzoic acid ion; more preferably, a chloride ion, a bromide ion, a methanesulfonic acid ion, a trifluoromethanesulfonic acid ion, a toluenesulfonic acid ion, an acetic acid ion, a trifluoroacetic acid ion, a propionic acid ion, or a benzoic acid ion; and further preferably, a chloride ion, a bromide ion, a methanesulfonic acid ion, a trifluoromethanesulfonic acid ion, an acetic acid ion, or a trifluoroacetic acid ion.

When M is —$Z^1(Z^2)_m$, m is determined so that the aromatic compound represented by the above formula (IV) becomes electroneutral. That is to say, when the aromatic compound represented by the above formula (IV) is represented by —$Z^1(Z^2)_m$—$Ar^1$-M, the —$Z^1(Z^2)_m$ portion is considered to have a +1 valence, the $Ar^1$-M portion is considered to have a −1 valence, and the —$Z^1(Z^2)_m$ portion is preferably ionically bonded to the $Ar^1$-M portion.

M in the above formula (IV) is preferably an atomic group including a halogen atom, a boron atom, a silicon atom, a tin atom and a metallic atom, or a group represented by —$SO_3Q^a$; more preferably, an atomic group including a halogen atom, a boron atom, a tin atom, a magnesium ion and a zinc atom, or a group represented by —$SO_3Q^a$; and particularly preferably, an atomic group including a halogen atom and a boron atom.

When the two M are identical to each other in the above formula (IV), specific combinations applied to the polycondensation reaction include: a combination of dihalogenated compounds only; a combination of bis(alkylsulfonate) compounds only; and a combination of at least one selected from the group consisting of a dihalogenated compound and a bis(arylalkyl sulfonate) compound, with at least one selected from the group consisting of a diboric acid compound and a diborate compound.

On the other hand, when the two M are different from each other, from the viewpoint of the formation of a polymer binding layer with good reproducibility, the aromatic compound is preferably a halogen-boric acid compound, a halogen-borate compound, an alkyl sulfonate-boric acid compound, an alkyl sulfonate-borate compound, an aryl sulfonate-boric acid compound, an aryl sulfonate-borate compound, an arylalkyl sulfonate-boric acid compound, or an arylalkyl sulfonate-borate compound; and further preferably, a halogen-boric acid compound or a halogen-borate compound.

E, G, r and p in the above formula (III) have the same definitions as those of E, G, r and p in the above formula (V), and $X^a$ in the above formula (III) is a halogen atom, or a group represented by —$SO_3Q^a$ (wherein $Q^a$ is an alkyl group optionally having a substituent, or an aryl group optionally having a substituent).

Examples of the above described halogen atom include a fluorine atom, a chlorine atom, a bromine atom and an iodine atom. A chlorine atom, a bromine atom and an iodine atom are preferable. Preferred examples of the group represented by —$SO_3Q^a$ include a methane sulfonate group, a benzene sulfonate group, a p-toluene sulfonate group, and a trifluoromethane sulfonate group.

Of these, $X^a$ is preferably a chlorine atom, a bromine atom, an iodine atom, a p-toluene sulfonate group, or a trifluoromethane sulfonate group; further preferably, a bromine atom, an iodine atom, or a trifluoromethane sulfonate group; and particularly preferably, a bromine atom or an iodine atom.

The group represented by the above formula (III) can be formed on the surface of an electrode by immersing the electrode in a solution containing a conjugated compound represented by the following formula (XV):

(XV)

wherein $E^a$ has the same definitions as those of $E^a$ in the above formula (II); and G, $X^a$, r and p have the same definitions as those of G, $X^a$, r and p in the above formula (III), or by coating the electrode with the solution.

In addition, the group represented by the above formula (III) can also be formed on the surface of an electrode, using the conjugated compound of the present invention represented by the following formula (IX):

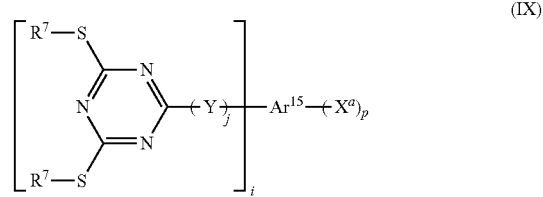
(IX)

wherein $R^7$, Y, $Ar^{15}$, i, j and p have the same definitions as those of $R^7$, Y, $Ar^{15}$, i, j and p in the above formula (III); and $X^a$ has the same definitions as those of $X^a$ in the above formula (III).

When the laminated structure of the present invention is produced, the conjugated compound represented by the above formula (IX), wherein $R^7$ is a hydrogen atom, an alkylthio group optionally having a substituent, an arylthio group optionally having a substituent, or an arylalkylthio group optionally having a substituent, can be directly used in the formation of the above described polymer binding layer. However, in the case of the conjugated polymer represented by the above formula (IX), wherein $R^7$ is a group other than the above described groups, $R^7$ is converted to a hydrogen atom, an alkylthio group optionally having a substituent, an arylthio group optionally having a substituent, or an arylalkylthio group optionally having a substituent, according to the method described in PROTECTIVE GROUPS in ORGANIC SYNTHESIS THIRD EDITION, THEODORA W. GREENE, PETER GM. WUTS, WILEY-INTERSCIENCE, pp. 454-493; a reaction using t-BuSNa described in ESI (Electronic supplementary information) S3 of Chem. Commun., 2007, 1355-1357; a reaction using iodine described in J. Am. Chem. Soc., 2005, pp. 8036-8043; and other methods, and as a result, it becomes possible to use the conjugated polymer in the formation of the polymer binding layer.

Accordingly, the conjugated polymer represented by the above formula (IX), wherein $R^7$ is a hydrogen atom or an alkylthio group optionally having a substituent, can be directly used, and in the case of the conjugated polymer represented by the above formula (IX), wherein $R^7$ is a group other than a hydrogen atom or an alkylthio group optionally having a substituent, $R^7$ is converted to a hydrogen atom or an alkylthio group optionally having a substituent. The thus obtained compound corresponds to the conjugated compound represented by the above formula (XV), wherein G has a structure represented by the following formula (XIII):

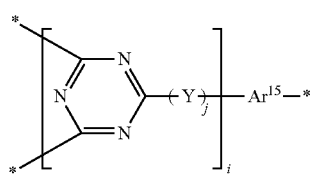

(XIII)

and $E^a$ is $R^7$—S (wherein $R^7$ is a hydrogen atom, an alkylthio group optionally having a substituent, an arylthio group optionally having a substituent, or an arylalkylthio group optionally having a substituent), and r=2×i. It is to be noted that Y, $Ar^{15}$, i and j in the above formula (XIII) have the same definitions as those of Y, $Ar^{15}$, i and j in the above formula (VIII), respectively, and the symbol * indicates a binding portion.

Specific examples of the group represented by the formula (III) in the present invention are as described below. The group may have a structure in which one or more hydrogen atoms bonding to an element constituting an aromatic ring are substituted with E. It is to be noted that E in the following formulae has the same definitions as those in the above formula (V).

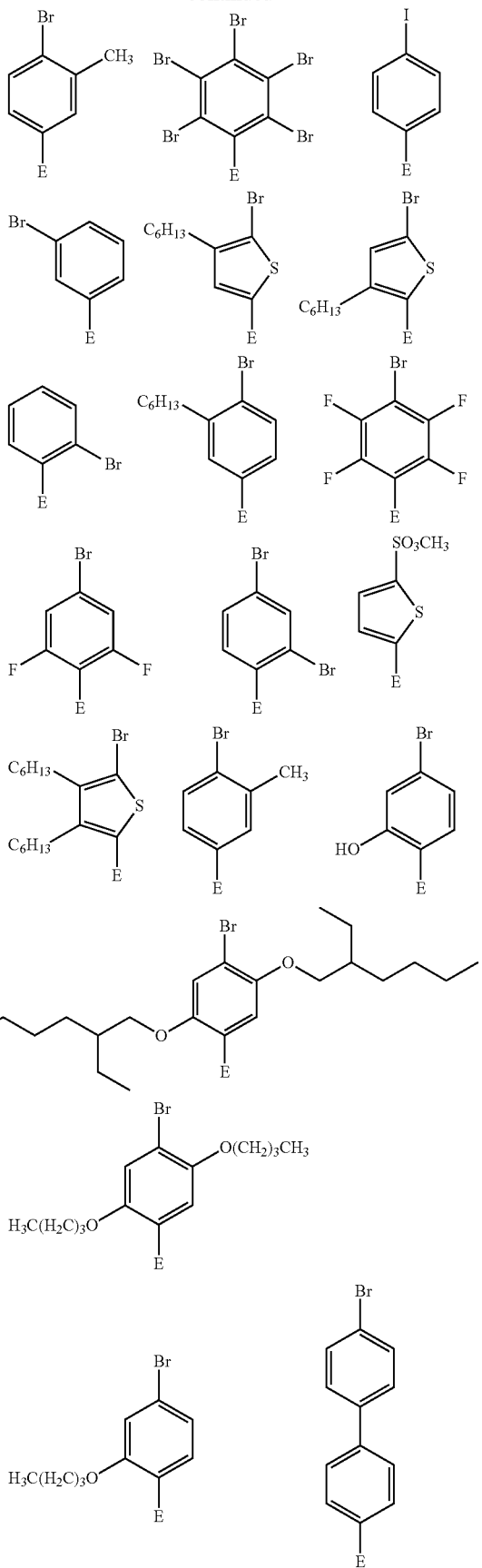

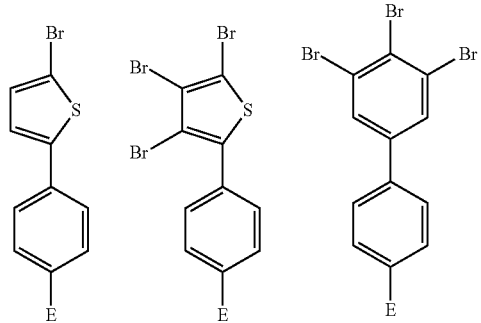
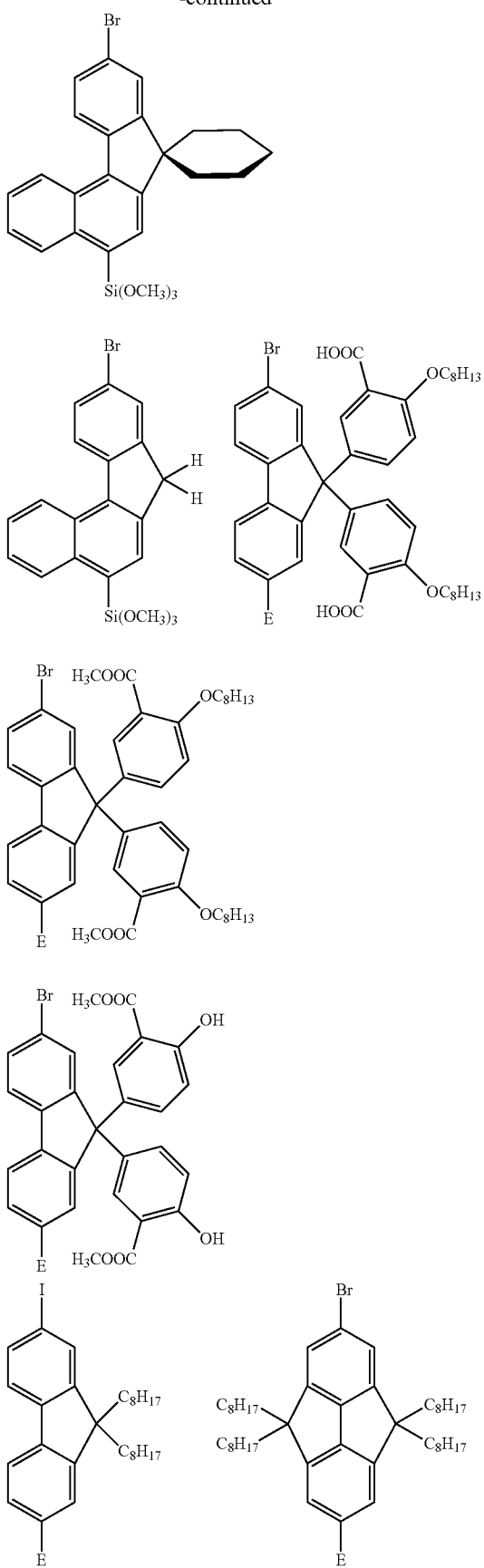

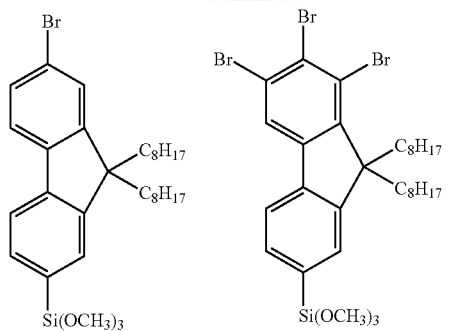
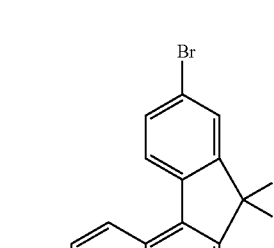
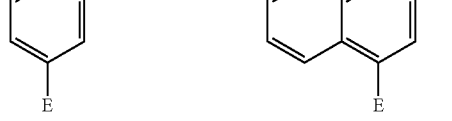
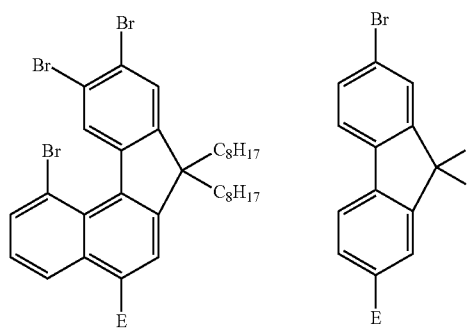
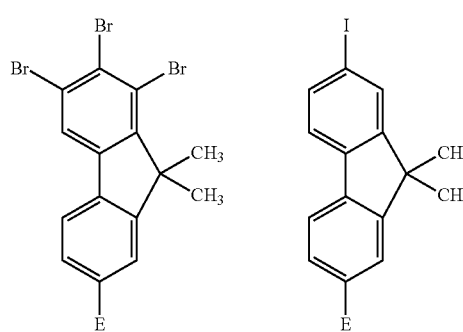
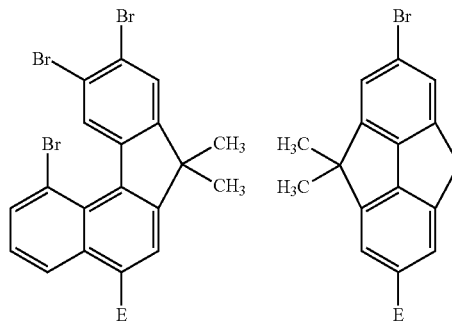
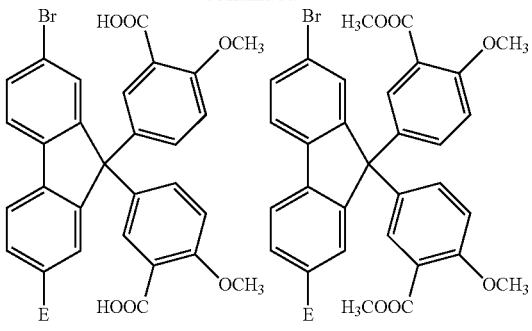
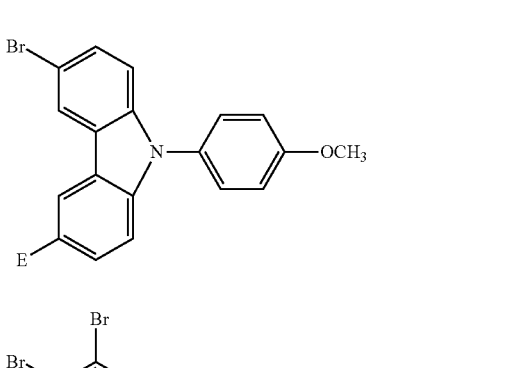
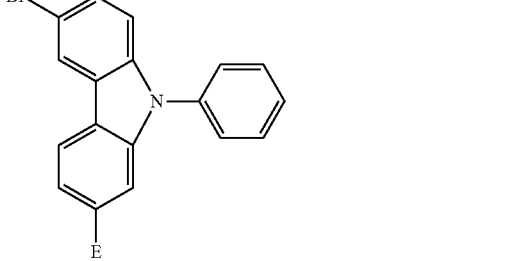
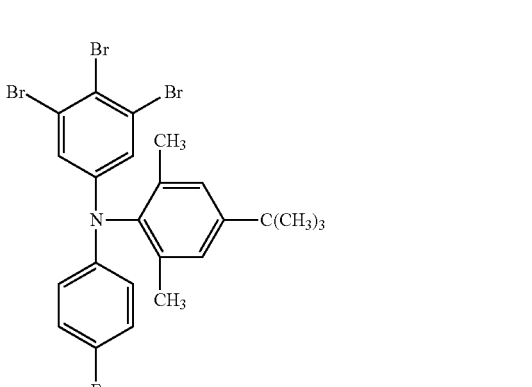
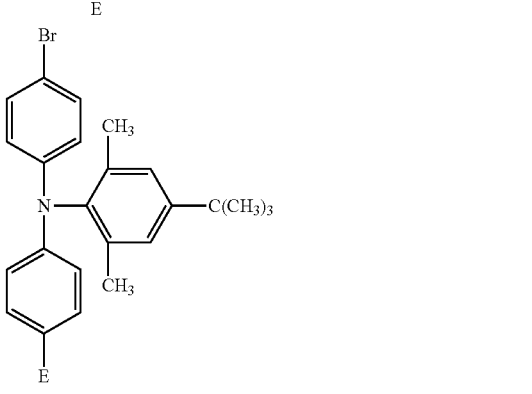

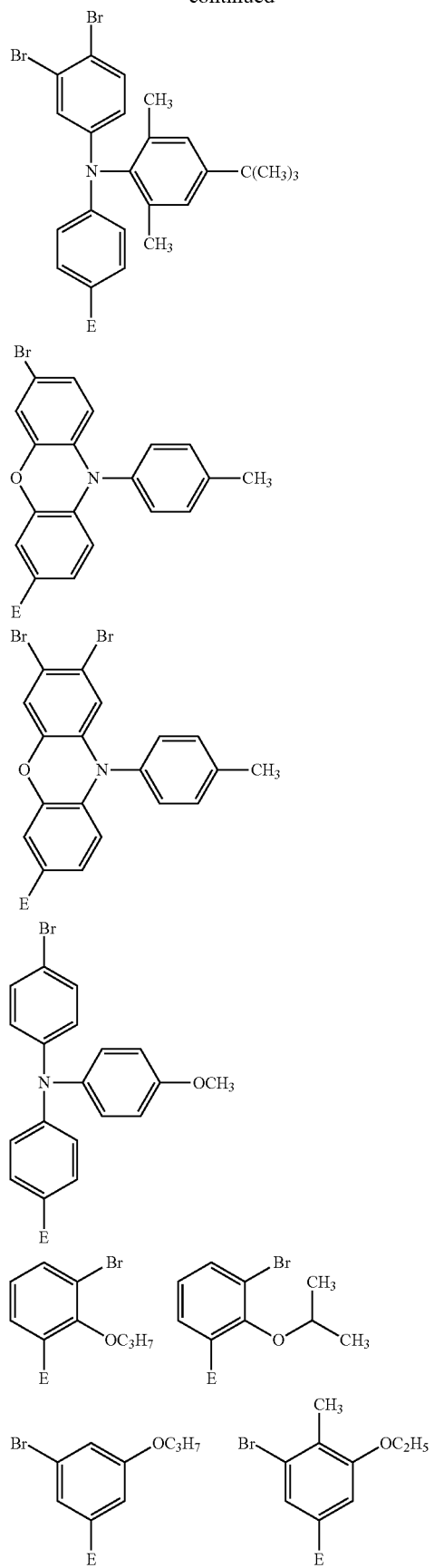
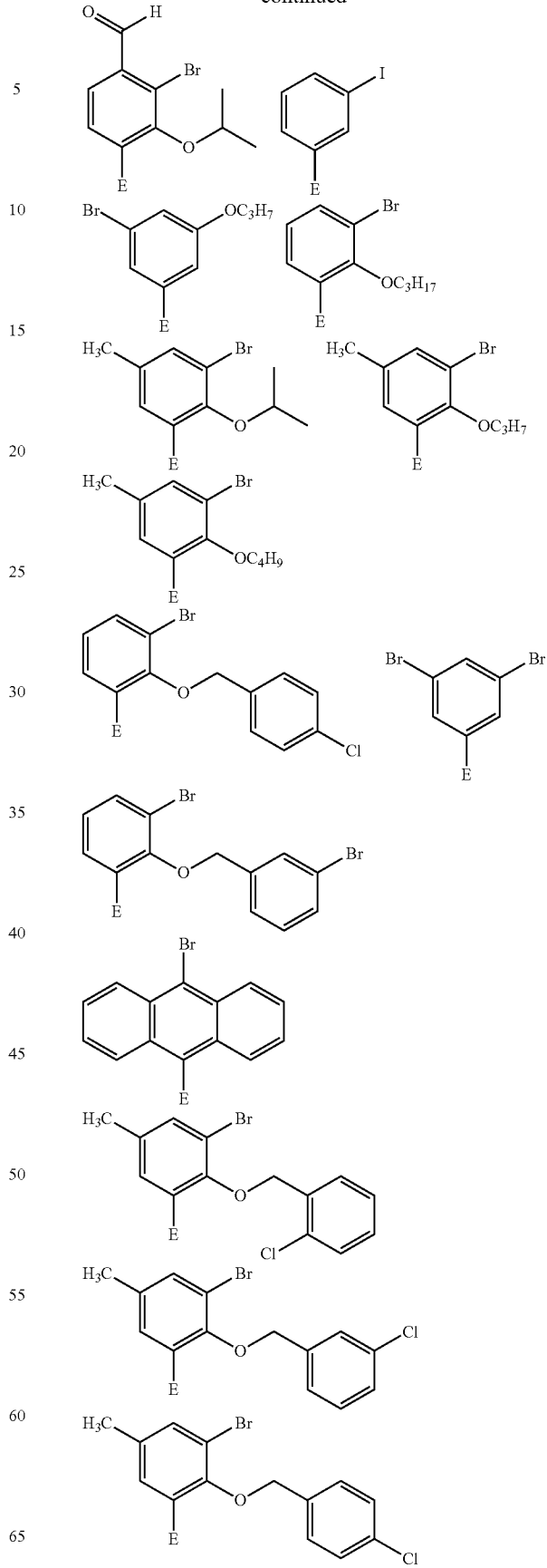

-continued
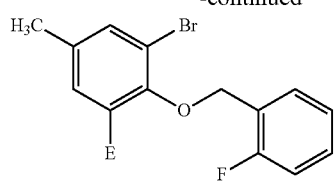
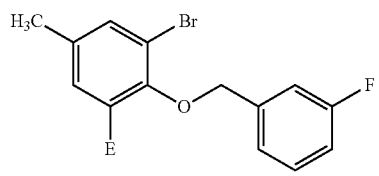
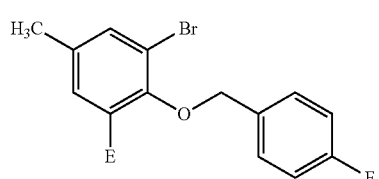
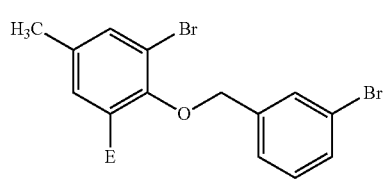
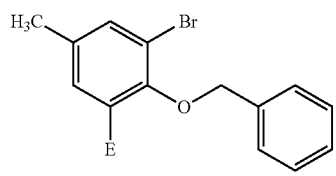
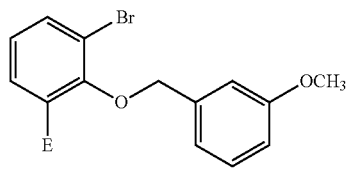
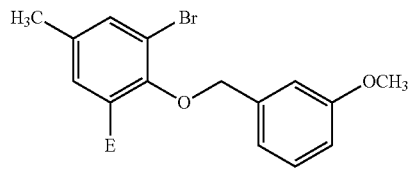
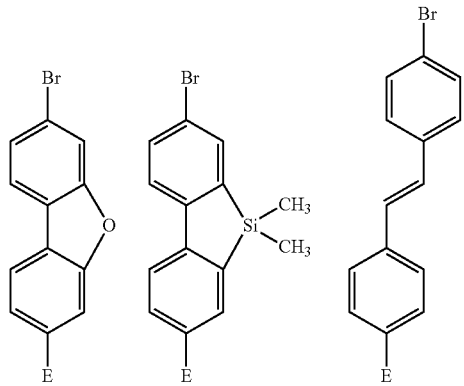
-continued
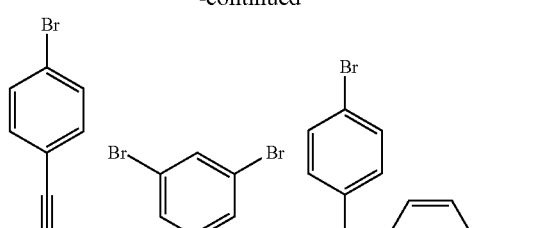
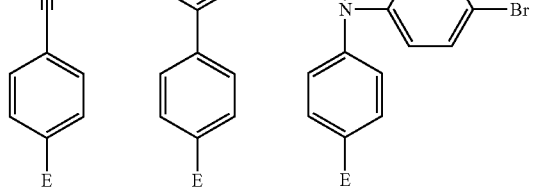
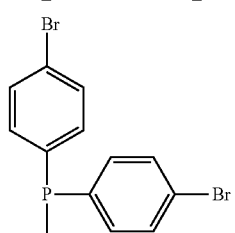
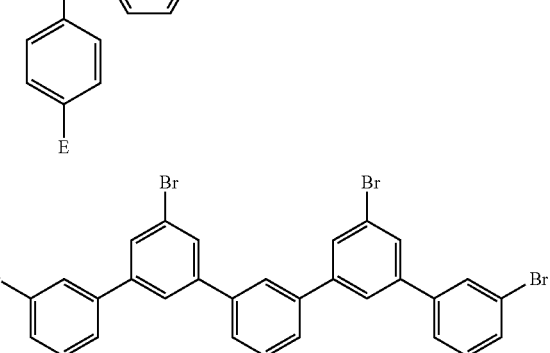
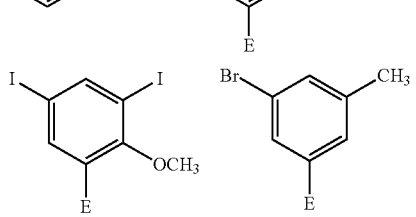
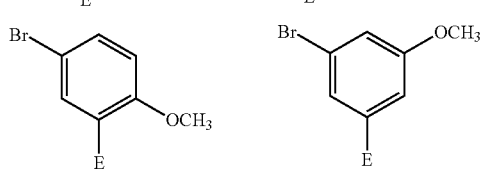
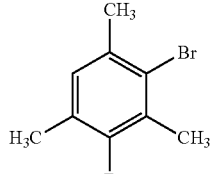
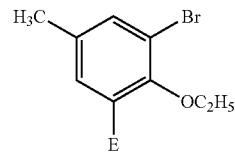
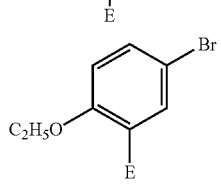
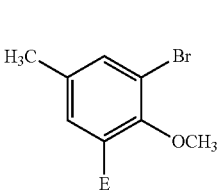

73
-continued
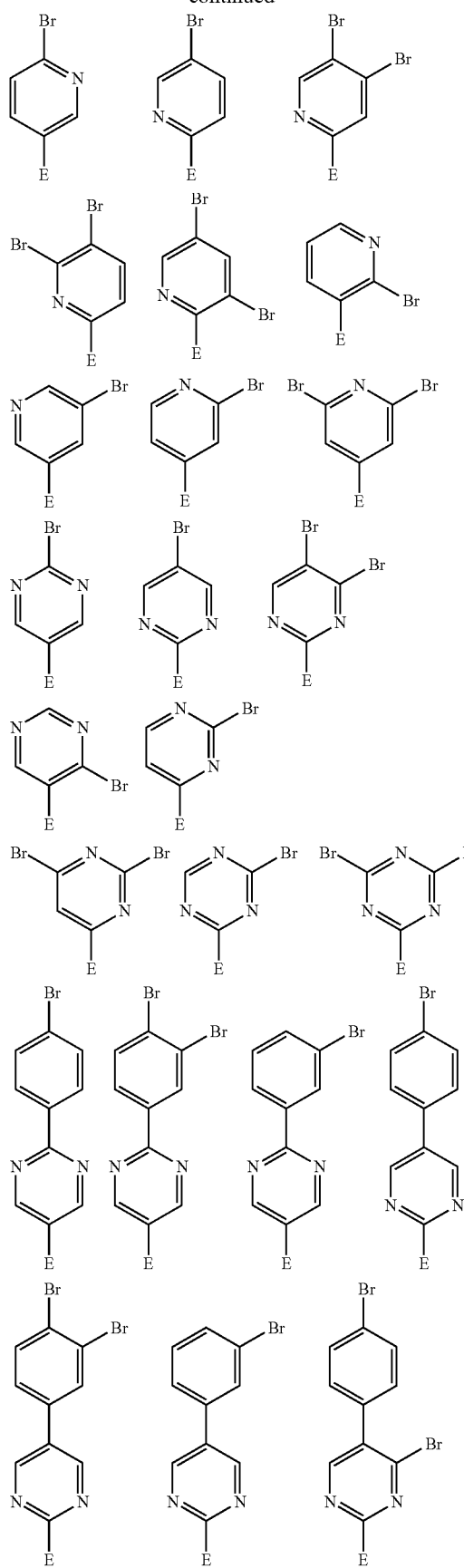
74
-continued
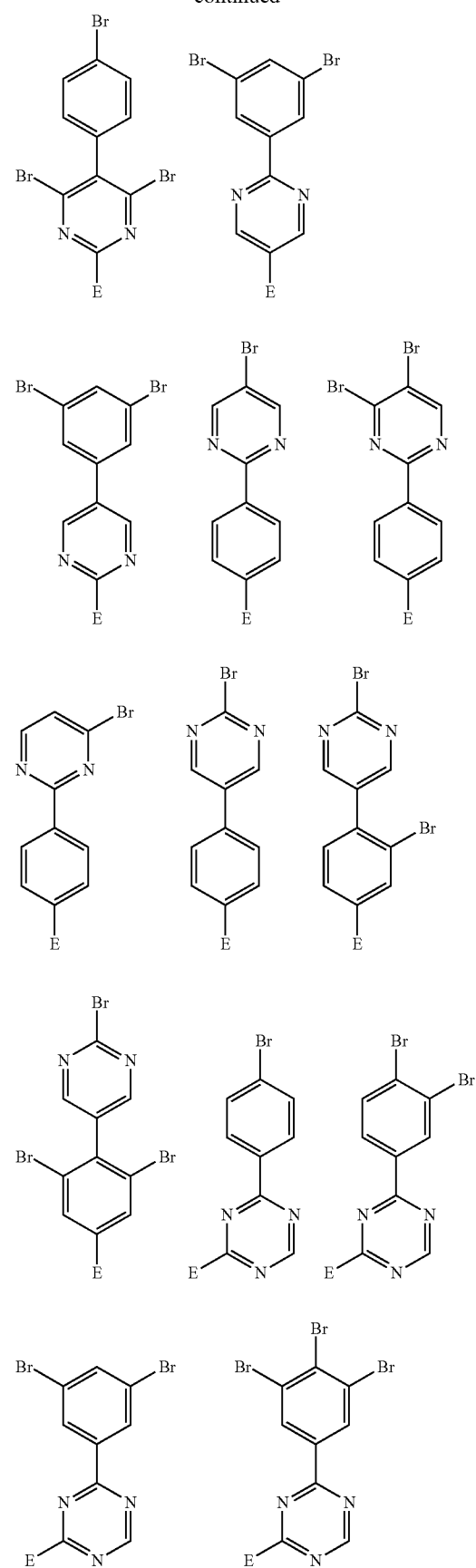

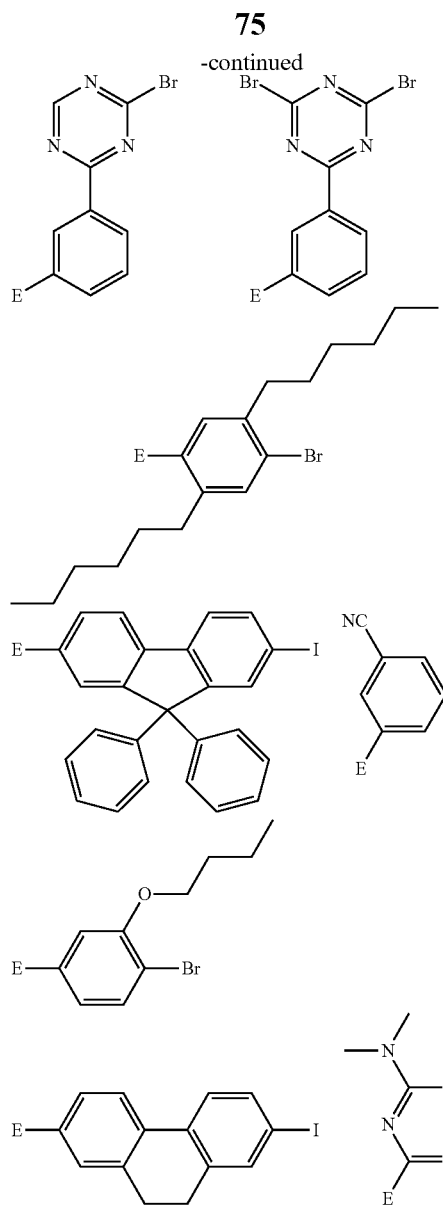
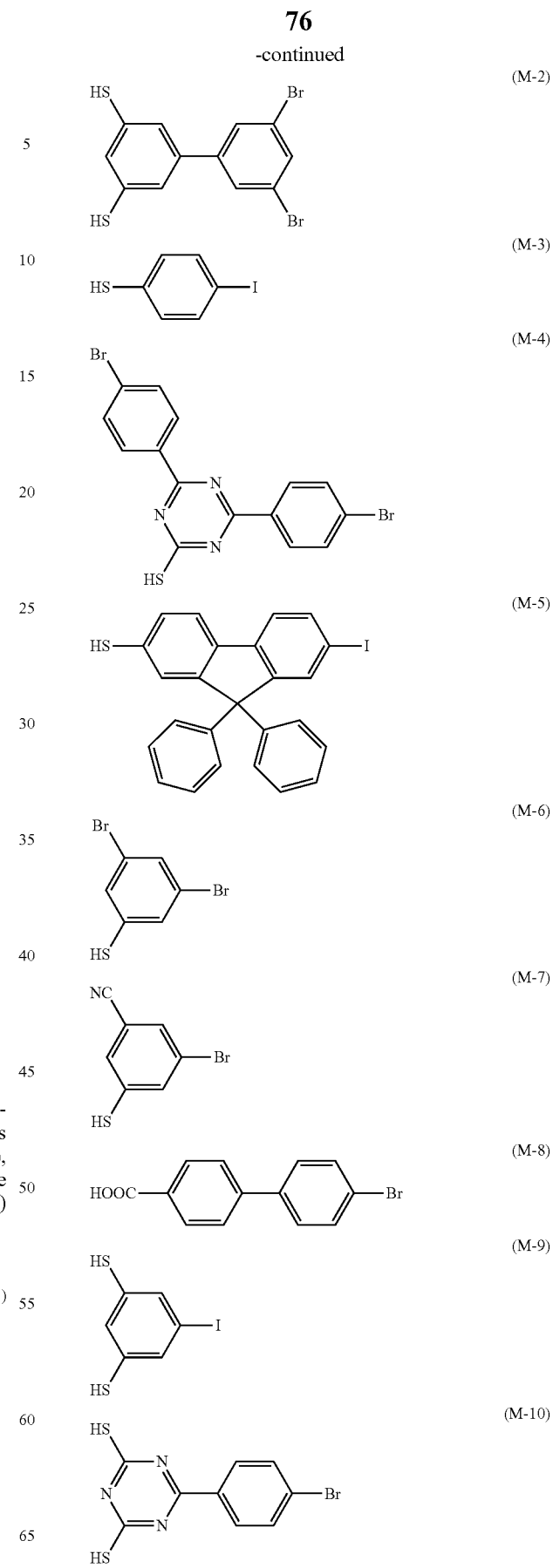
Among these groups, the groups represented by the following formulae (M-1) to (M-14) are preferable; the groups represented by the following formulae (M-2) to (M-4), (M-6), (M-9), (M-10) and (M-11) are more preferable; and the groups represented by the following formulae (M-4), (M-9) and (M-10) are particularly preferable.

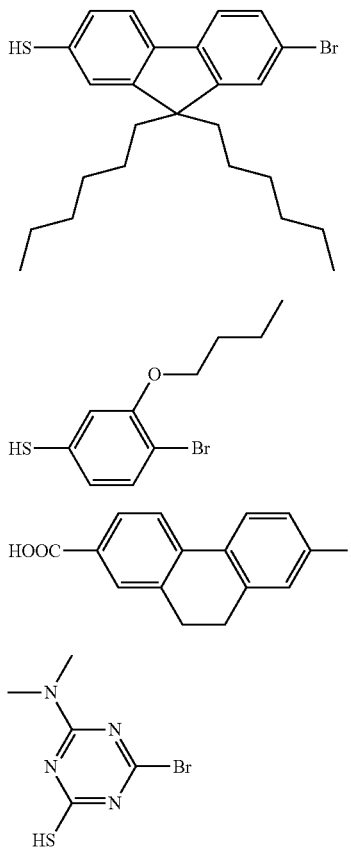

Conditions for the polycondensation reactions in the above described method for producing a conjugated polymer and the above described method (B) are described in Chem. Rev. 102, 1359 (2002); Bull. Chem. Soc. Jpn., 72, 621 (1999), and the reference documents thereof. Reaction conditions for various aromatic coupling reactions, in which a palladium complex or a nickel complex is used as a polymerization catalyst, can be adopted. In addition, reaction conditions in which an equivalently reactive reactant such as a Ni(0) compound, which are described in Chem. Lett., 153 (1988), can also be adopted. If this equivalently reactive reactant is explained using a Ni(0) compound as an example, when M in the above formula (IV) are both halogen atoms, an Ar—Ar coupling reaction progresses as a result of the reaction of such halogen atoms with the Ni(0) compound, and a Ni(II) compound is generated as a by-product. When such a Ni(II) compound is not reduced and it does not act as a catalyst, this Ni(0) compound acts as an equivalently reactive reactant. Among these aromatic coupling reactions, Suzuki coupling reactions are preferable as conditions for the polycondensation reaction.

In order to suppress side reactions, as a solvent used in the above described method for producing a conjugated polymer and the above described method (B), in general, a solvent, on which a deoxidation treatment has been sufficiently performed, is preferably used, depending on compounds and reactions used. In the above described polycondensation reaction, the reaction is preferably promoted using such an organic solvent in an inert atmosphere. Moreover, such an organic solvent is preferably subjected to a dehydration treatment, as well as the above described deoxidation treatment. However, in a case in which the reaction is carried out in a two-phase system with water, like the Suzuki coupling reaction, such a dehydration treatment is not necessary. Further, in the above described method (B), it is preferable to select an organic solvent, in which the used electrode is not soluble, and which does not impair the electrode.

Examples of such a solvent include: aromatic hydrocarbons such as benzene, toluene and xylene; chain and cyclic aliphatic hydrocarbons such as heptane and cyclohexane; halogenated hydrocarbons such as chlorobenzene, dichlorobenzene and dichloromethane; nitriles such as acetonitrile and benzonitrile; alcohols such as methanol, ethanol, n-propyl alcohol and isopropyl alcohol; ethers such as dioxane, tetrahydrofuran and ethylene glycol dimethyl ether; amides such as N,N-dimethylformamide and N-methylpyrrolidone; nitro compounds such as nitromethane and nitrobenzene; and water. As reaction solvents, aromatic hydrocarbons, halogenated hydrocarbons, nitriles, ethers, nitro compounds, and water are preferable. These reaction solvents may be used singly or as a mixture of two or more.

The concentration of the aromatic compound represented by the formula (IV) in the solution is different depending on the type of the above described aromatic compound. The solution is preferably prepared in a concentration range which is able to stably dissolve the aromatic compound. Specifically, from the viewpoint of the stable formation of the conjugated polymer and polymer binding layer used in the present invention, the concentration of the above described aromatic compound is a concentration which is able to stably dissolve the aromatic compound, and which is also, preferably from 0.001 to 1000 g/L, more preferably from 0.01 to 100 g/L, and particularly preferably from 0.01 to 30 g/L.

Moreover, in the above described polycondensation reaction, for the reaction of the aromatic compound represented by the formula (IV), a base, a suitable catalyst, or an equivalently reactive reactant is preferably added. Such a base, a catalyst, or an equivalently reactive reactant can be selected depending on a polymerization method adopted and the like. Preferably, such a base, a catalyst, and an equivalenty reactive reactant are sufficiently dissolved in the solvent used in the reaction. Furthermore, as a method of mixing such a base, a catalyst, or an equivalently reactive reactant, there may be applied a method comprising gradually adding a solution, a solid, etc. of the base, catalyst or equivalently reactive reactant to a reaction solution, while stirring the reaction solution in an inert atmosphere such as argon or nitrogen, or a method comprising gradually adding a reaction solution to a solution or suspension of the base, catalyst or equivalently reactive reactant.

Specific examples of the base used in the present invention include a hydroxide salt, a carbonate, a phosphate and a fluoride salt, in which a countercation is at least one selected from the group consisting of a lithium ion, a sodium ion, a potassium ion, a cesium ion and a tetraalkylammonium ion. Among others, sodium hydroxide, potassium hydroxide, sodium carbonate, potassium carbonate and cesium carbonate are preferable.

The above described base is used in preferably from 0.01 to 1000 times, more preferably from 0.1 to 100 times, and further preferably from 1 to 30 times, the molar amount of the aromatic compound represented by the above formula (IV).

The reaction temperature applied to the above described polycondensation is generally from −100° C. to 200° C., preferably from −50° C. to 150° C., and more preferably from −20° C. to 100° C. The reaction time is generally from 0.1 minute to 1,000 hours, preferably from 1 minute to 500 hours, and more preferably from 5 minutes to 200 hours.

A more preferred method applied as the method (B) is the method described in JP 2009-19186 A. That is, this is a method comprising: allowing an electrode, to which the group represented by the above formula (III) is bonded, to come into contact with a toluene solution of Pd (Pt—Bu$_3$)$_2$ so that a palladium complex is supported on the Electrode Surface; and then allowing the obtained electrode to come into contact with a mixture of the aromatic compound represented by the above formula (IV), a base and a solvent, so as to promote polycondensation.

A polymer binding layer having the structure represented by the above formula (V), which has been formed by the polycondensation reaction, is composed of a linear aromatic polymer compound, if p is 1. If p is 2 or greater, the above polymer binding layer is composed of an aromatic polymer compound in which a linear polymer chain is branched to a p number of chains at G. In both cases, the formed polymer binding layer is chemically bonded to the above described electrode at either one terminus thereof.

(Method for Producing Conjugated Compound)

The method for producing a conjugated compound used in the present invention will be described, using the conjugated compound of the present invention, represented by the above formula (IX), as an example. In order to produce the conjugated compound represented by the above formula (IX), for example, a compound represented by the following formula (XVI):

(XVI)

wherein Ar$^{15}$, X$^a$, i and p have the same definitions as those of Ar$^{15}$, X$^a$, i and p in the above formula (IX), is first reacted with a cyanuric acid derivative represented by the following formula (XVII):

(XVII)

wherein X$^b$ is a group which can be converted to an R$^7$—S group; and X$^c$ is a group which can react with X$^a$ to form Y or a single bond, so as to obtain a compound represented by the following formula (XVIII):

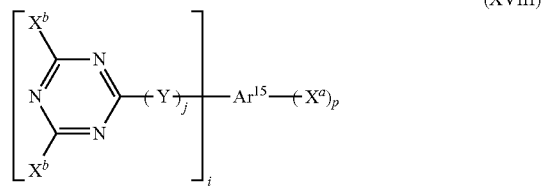

(XVIII)

wherein Ar$^{15}$, X$^a$, Y, i and p have the same definitions as those of Ar$^{15}$, X$^a$, Y, i and p in the above formula (IX); X$^b$ has the same definitions as those of X$^b$ in the above formula (XVII).

Herein, examples of X$^b$ include a hydrogen atom, a halogen atom, a hydroxy group and an amino group; and examples of X$^c$ include a halogen atom, a hydroxy group, an amino group, a monosubstituted amino group, ethenylene group, a substituted ethenylene group and an ethynylene group.

Thereafter, X$^b$ in the compound represented by the above formula (XVIII) is converted to R$^7$—S, so as to obtain the conjugated compound represented by the above formula (IX). For example, X$^b$ in the above formula (XVIII) is converted to a mercapto group (—SH) by reacting the compound represented by the above formula (XVIII) with thiourea, so as to obtain the conjugated compound represented by the above formula (IX), wherein R$^7$ is a hydrogen atom. Moreover, substituted mercaptan R$^7$—SH (wherein R$^7$ has the same definitions as those of R$^7$ in the above formula (IX) (except for a hydrogen atom)) is allowed to react with the above mercapto group, so as to obtain the conjugated compound represented by the above formula (IX), wherein R$^7$ is a group other than a hydrogen atom.

Preferred specific examples of the conjugated compound represented by the above formula (IX) are given below.

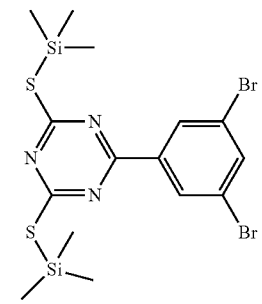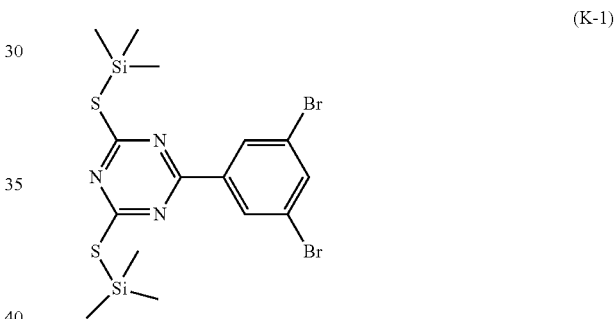

(K-1)

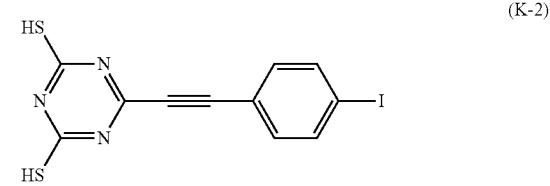

(K-2)

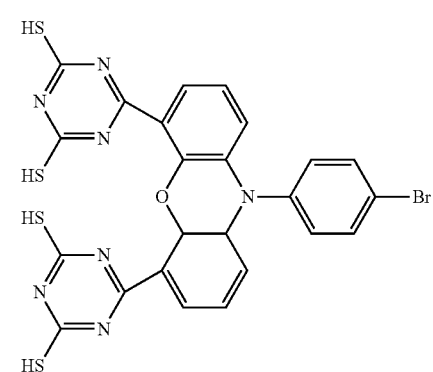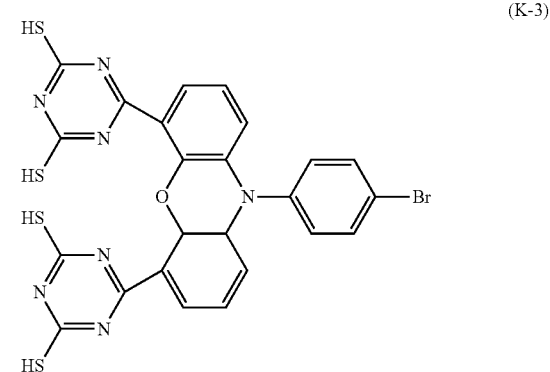

(K-3)

(K-4)
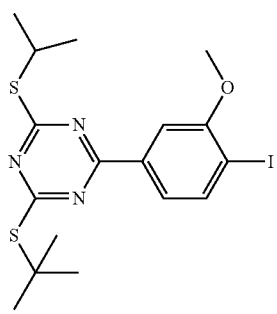
(K-5)
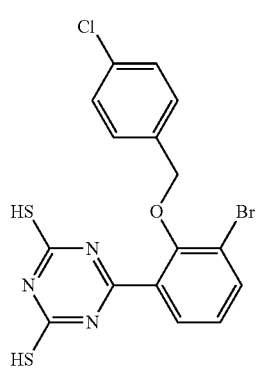
(K-6)
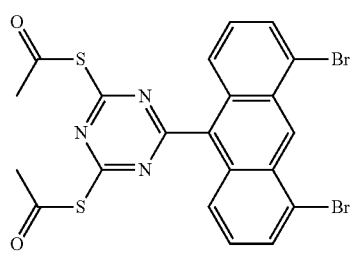
(K-7)
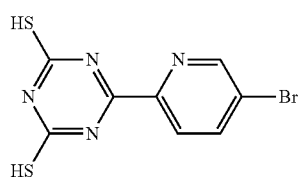
(K-8)
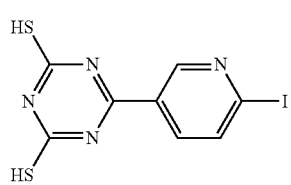
(K-9)
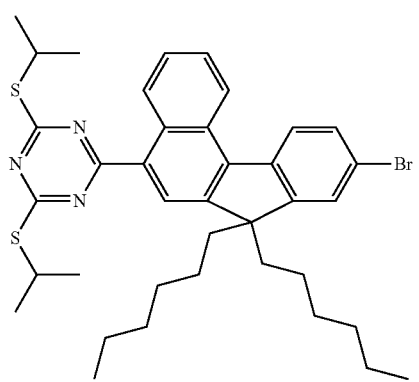
(K-10)
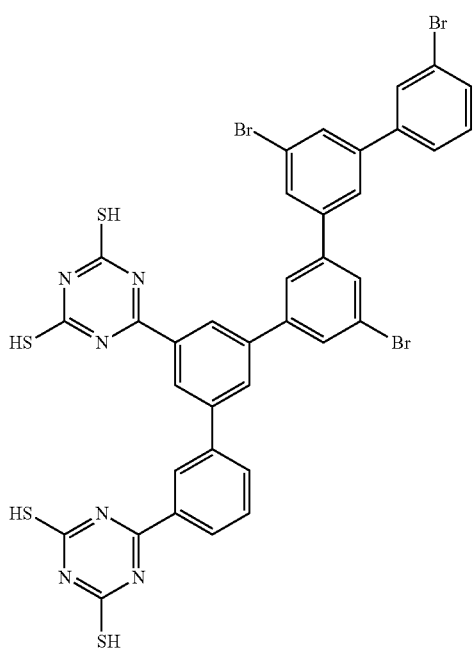
(K-11)
(K-12)
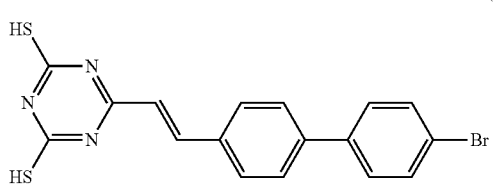

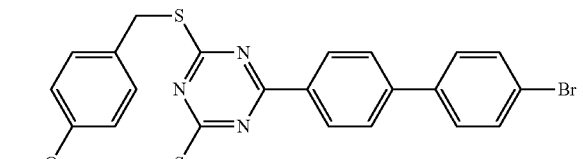
(K-13)

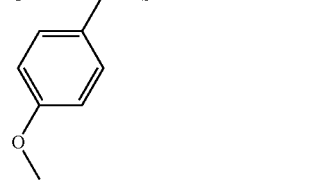
(K-14)

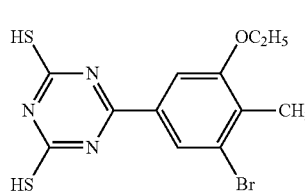
(K-15)

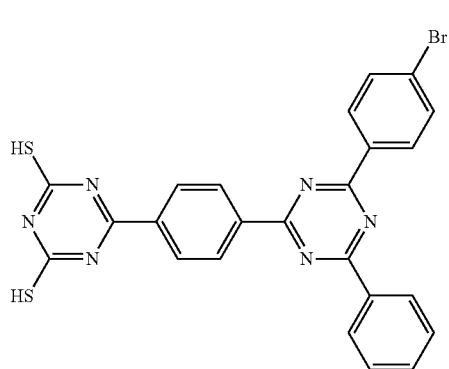
(K-16)

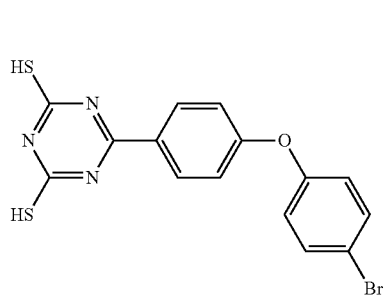
(K-17)

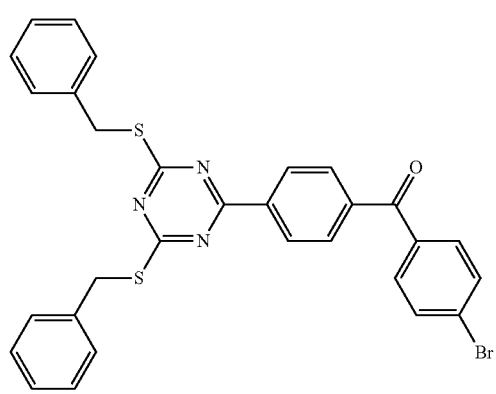

(K-18)

(K-19)

(K-20)

(K-21)

(K-22)

Of these, the conjugated compounds represented by the above formulae (K-3), (K-6)-(K-9), (K-13), (K-15), (K-18), (K-20) and (K-22) are more preferable; the conjugated compounds represented by the above formulae (K-3), (K-7), (K-8), (K-18) and (K-20) are further preferable; and the conjugated compounds represented by the above formulae (K-8), (K-18) and (K-20) are particularly preferable.

<Laminated Structure>

Next, the laminated structure of the present invention will be described. The laminated structure of the present invention comprises the above described electrode, the above described polymer binding layer disposed on the electrode, and the above described conductive organic material layer disposed on the polymer binding layer. Since such a laminated structure has a conductive organic material layer, it can be used in an electroluminescent device, a photoelectric conversion device and the like.

As a method of forming the conductive organic material layer, for example, there is a method of forming a film from a solution containing a conductive organic material.

Since a binding group of the aromatic polymer compound used in the present invention is bonded to the electrode, when the laminated structure of the present invention is used in an electroluminescent device, the obtained device emits light with high brightness. In addition, when the laminated structure of the present invention is used in a photoelectric conversion device, the obtained device has high conversion efficiency. Moreover, a binding group of the aromatic polymer compound of the polymer binding layer, which constitutes the laminated structure of the present invention, is chemically bonded to the electrode, and thus, the present laminated structure has stability to such an extent that the polymer binding layer is not easily removed from the electrode, even though a film formation operation is carried out according to a spin coating method or the like.

<Electroluminescent Device>

An electroluminescent device, in which the laminated structure of the present invention is used, comprises an electrode (a cathode or an anode), the above described polymer binding layer disposed on the electrode, and the above described conductive organic material layer disposed on the polymer binding layer. In general, such an electroluminescent device further comprises, as any given constitutional elements, a substrate and a second electrode. The substrate may be disposed on the electrode side of the laminated structure, and the second electrode and as necessary, any other constitutional elements may be disposed on the conductive organic material layer side thereof.

The conductive organic material layer in the electroluminescent device consists of at least one layer of a hole injection layer, a hole transport layer, an interlayer, a luminescent layer, an electron transport layer, a hole-blocking layer and an electron injection layer, which will be described later. This conductive organic material layer may have a monolayer structure consisting of one or two or more conductive organic materials which constitute such layers, or may have a multilayer structure consisting of multiple layers having a single composition or a heterogeneous composition.

As one embodiment of the electroluminescent device, in which the laminated structure of the present invention is used, there is a device, in which an anode is established on a substrate, a polymer binding layer is disposed thereon, a conductive organic material layer is disposed thereon, and further a cathode is disposed thereon. As another embodiment, there is an electroluminescent device, in which a cathode is established on a substrate, a polymer binding layer is disposed thereon, a conductive organic material layer is disposed thereon, and further an anode is disposed thereon. As a further embodiment, there are also electroluminescent devices of a bottom emission type, in which light is emitted from the substrate side, of a top emission type, in which light is emitted from the side opposite to the substrate, and of a both sides emission type. As a further embodiment, there is also an electroluminescent device, in which layers having other functions, such as any given protective film, buffer film and reflective film, are further established. It is to be noted that the configuration of the electroluminescent device will be described in detail below. Such an electroluminescent device is further covered with a sealing film or a sealing substrate so that a luminescence device, in which the electroluminescent device is shielded from the outside air, can be formed.

The polymer binding layer used in the present invention can be used as a layer between a cathode and a luminescent layer in an electroluminescent device, a layer between an anode and a luminescent layer therein, and the like; and it can be used as a charge injection layer, a charge transport layer and the like.

In general, such an electroluminescent device has a cathode, an anode, and a conductive organic material layer, and it further comprises other constitutional elements. For example, the electroluminescent device may have one or more layers selected from among a hole injection layer, an interlayer and a hole transport layer, between a luminescent layer and a hole injection layer. When a hole injection layer is present, the electroluminescent device may have one or more layers selected from among an interlayer and a hole transport layer, between a luminescent layer and the hole injection layer. On the other hand, between a cathode and an organic luminescent layer, the electroluminescent device may have one or more layers selected from among an electron injection layer, an electron transport layer and a hole-blocking layer. When an electron injection layer is present, the electroluminescent device may have one or more layers selected from among an electron transport layer and a hole-blocking layer, between an organic luminescent layer and the electron injection layer.

The polymer binding layer used in the present invention can be used as such a hole injection layer, a hole transport layer, an interlayer, an electron injection layer, an electron transport layer, a hole-blocking layer, etc. When the polymer binding layer is used as a hole injection layer, a hole transport layer or an interlayer, the electrode is an anode, and the second electrode is a cathode. When the polymer binding layer is used as an electron injection layer, an electron transport layer or a hole-blocking layer, the electrode is a cathode, and the second electrode is an anode.

Herein, the anode is used to supply a positive hole to a hole injection layer, a hole transport layer, an interlayer, a luminescent layer, etc., whereas the cathode is used to supply an electron to an electron injection layer, an electron transport layer, a hole-blocking layer, a luminescent layer, etc.

The luminescent layer means a layer, which provides the function of accepting a positive hole from a layer adjacent to the anode, when an electric field is charged, and accepting an electron from a layer adjacent to the cathode, the function of transferring the accepted charge (the electron and the positive hole) by the force of the electric field, and the place for the recombination of the electron with the positive hole, and which acts to lead such recombination to light emission.

The electron injection layer and the electron transport layer mean layers having any of the function of accepting an electron from the cathode, the function of transferring the electron, the function of barriering off a positive hole injected from the anode. Moreover, the hole-blocking layer means a layer, which mainly has the function of barriering off a positive hole injected from the anode and which further has either the function of accepting an electron from the cathode or the function of transferring the electron, as necessary.

The hole injection layer and the hole transport layer mean layers having any of the function of accepting a positive hole from the anode, the function of transferring the positive hole, the function of supplying the positive hole to a luminescent layer, and the function of barriering off an electron injected from the cathode. In addition, the interlayer has at least one of the function of accepting a positive hole from the anode, the function of transferring the positive hole, the function of supplying the positive hole to a luminescent layer, and the function of barriering off an electron injected from the cathode, and is generally disposed adjacent to the luminescent layer. The interlayer plays a role for separating the luminescent layer from the anode, or separating the luminescent layer from the hole injection layer or the hole transport layer.

It is to be noted that the electron transport layer and the hole transport layer are generically called a charge transport layer. It is also to be noted that the electron injection layer and the hole injection layer are generically called a charge injection layer.

Specifically, the electroluminescent device of the present invention may have a layer configuration (a) below, or may also have a layer configuration, in which one or more layers of a hole injection layer, a hole transport layer, an interlayer, a hole-blocking layer, an electron transport layer and an electron injection layer are omitted from the layer configuration (a). In the layer configuration (a), the polymer binding layer used in the present invention can be used as one or more layers selected from the group consisting of a hole injection layer, a hole transport layer, an interlayer, an electron injection layer, an electron transport layer and a hole-blocking layer.

(a) Anode-hole injection layer-(hole transport layer and/or interlayer)-luminescent layer-(hole-blocking layer and/or electron transport layer)-electron injection layer-cathode Herein, the symbol "-" is used to mean that individual layers are adjacent to one another and are laminated.

The "(hole transport layer and/or interlayer)" means a layer consisting only of a hole transport layer, a layer consisting only of an interlayer, a layer configuration of a hole transport layer-an interlayer, a layer configuration of an interlayer-a hole transport layer, or other any given layer configurations comprising one or more layers from each of a hole transport layer and an interlayer.

The "(hole-blocking layer and/or electron transport layer)" means a layer consisting only of a hole-blocking layer, a layer consisting only of an electron transport layer, a layer configuration of a hole-blocking layer-an electron transport layer, a layer configuration of an electron transport layer-a hole-blocking layer, or other any given layer configurations comprising one or more layers from each of a hole-blocking layer and an electron transport layer. The same applies to the descriptions of layer configurations below.

Furthermore, the electroluminescent device, in which the laminated structure of the present invention is used, may have two luminescent layers in a single laminated structure. In this case, the electroluminescent device may have a layer configuration (b) below, or may also have a layer configuration, in which one or more layers of a hole injection layer, a hole transport layer, an interlayer, a hole-blocking layer, an electron transport layer, an electron injection layer and an electrode are omitted from the layer configuration (b). In the layer configuration (b), the polymer binding layer used in the present invention is present between an anode and a luminescent layer closest to the anode, and it is used as a layer which is bonded to the electrode. Otherwise, the polymer binding layer is present between a cathode and a luminescent layer closest to the cathode, and it is used as a layer which is bonded to the cathode.

(b) Anode-hole injection layer-(hole transport layer and/or interlayer)-luminescent layer-(hole-blocking layer and/or electron transport layer)-electron injection layer-electrode-hole injection layer-(hole transport layer and/or interlayer)-luminescent layer-(hole-blocking layer and/or electron transport layer)-electron injection layer-cathode Herein, the symbol "-" is used to mean that individual layers are adjacent to one another and are laminated.

Moreover, the electroluminescent device, in which the laminated structure of the present invention is used, may have three or more luminescent layers in a single laminated structure. In this case, the electroluminescent device may have a layer configuration (c) below, or may also have a layer configuration, in which one or more layers of a hole injection layer, a hole transport layer, an interlayer, a hole-blocking layer, an electron transport layer, an electron injection layer and an electrode are omitted from the layer configuration (c). In the layer configuration (c), the polymer binding layer used in the present invention is present between an anode and a luminescent layer closest to the anode, and it is used as a layer which is bonded to the anode. Otherwise, the polymer binding layer is present between a cathode and a luminescent layer closest to the cathode, and it is used as a layer which is bonded to the cathode.

(c) Anode-hole injection layer-(hole transport layer and/or interlayer)-luminescent layer-(hole-blocking layer and/or electron transport layer)-electron injection layer-repeating unit A-repeating unit A . . . -cathode Herein, the "repeating unit A" means a unit of layer configuration consisting of electrode-hole injection layer-(hole transport layer and/or interlayer)-luminescent layer-(hole-blocking layer and/or electron transport layer)-electron injection layer.

Preferred specific examples of the layer configuration of the electroluminescent device of the present invention will be given below. In the following layer configurations, the polymer binding layer used in the present invention can be used as one or more layers selected from the group consisting of a hole injection layer, a hole transport layer, an interlayer, an electron injection layer, an electron transport layer and a hole-blocking layer.

(d) Anode-hole transport layer-luminescent layer-cathode
(e) Anode-luminescent layer-electron transport layer-cathode
(f) Anode-hole transport layer-luminescent layer-electron transport layer-cathode Herein, the symbol "-" is used to mean that individual layers are adjacent to one another and are laminated.

Moreover, each of these structures may include a structure in which an interlayer is established adjacent to the luminescent layer, between the anode and the luminescent layer. That is to say, the following structures (d') to (g') are also included.

(d') Anode-interlayer-luminescent layer-cathode
(e') Anode-hole transport layer-interlayer-luminescent layer-cathode
(f') Anode-interlayer-luminescent layer-electron transport layer-cathode
(g') Anode-hole transport layer-interlayer-luminescent layer-electron transport layer-cathode Herein, the symbol "-" is used to mean that individual layers are adjacent to one another and are laminated.

In the present invention, examples of an electroluminescent device comprising a charge injection layer (an electron injection layer or a hole injection layer) include: an electroluminescent device in which a charge injection layer is established adjacent to the cathode; and an electroluminescent device in which a charge injection layer is established adjacent to the anode. Specifically, there are the following structures (h) to (s), for example.

(h) Anode-charge injection layer-luminescent layer-cathode
(i) Anode-luminescent layer-charge injection layer-cathode
(j) Anode-charge injection layer-luminescent layer-charge injection layer-cathode
(k) Anode-charge injection layer-hole transport layer-luminescent layer-cathode
(l) Anode-hole transport layer-luminescent layer-charge injection layer-cathode
(m) Anode-charge injection layer-hole transport layer-luminescent layer-charge injection layer-cathode (n) Anode-charge injection layer-luminescent layer-electron transport layer-cathode
(o) Anode-luminescent layer-electron transport layer-charge injection layer-cathode
(p) Anode-charge injection layer-luminescent layer-electron transport layer-charge injection layer-cathode
(q) Anode-charge injection layer-hole transport layer-luminescent layer-electron transport layer-cathode
(r) Anode-hole transport layer-luminescent layer-electron transport layer-charge injection layer-cathode
(s) Anode-charge injection layer-hole transport layer-luminescent layer-electron transport layer-charge injection layer-cathode Herein, the symbol "-" is used to mean that individual layers are adjacent to one another and are laminated.

Furthermore, as structures similar to the above described structures (d') to (g'), there are also structures in which an interlayer is established adjacent to the luminescent layer, between the anode and the luminescent layer, in each of the structures (d') to (g'). In this case, the interlayer may also act as a hole injection layer and/or a hole transport layer.

The polymer binding layer used in the present invention is preferably an electron injection layer or a hole injection layer in an electroluminescent device.

In order to further improve adhesion to an electrode or the injection of a charge (that is, a positive hole or an electron) from such an electrode, the electroluminescent device, in which the laminated structure of the present invention is used, may further comprise an insulation layer adjacent to the electrode. Otherwise, in order to improve the adhesion of an interface or to prevent mixing, a thin buffer layer may be inserted into the interface of the charge transport layer (that is, a hole transport layer or an electron transport layer) or the luminescent layer. The order of layers to be laminated, the number of such layers, and the thickness of each layer can be determined, while taking into consideration luminous efficiency or the lifetime of the device.

Next, materials for individual layers, which constitute the electroluminescent device of the present invention, and the formation method will be more specifically described.

<Substrate>

The type of the substrate, which constitutes the electroluminescent device using the laminated structure of the present invention, is not particularly limited, as long as it forms an electrode and does not change during the formation of an organic material layer. For example, a glass, a plastic, a polymeric film, a metallic film, a silicon, a laminated product thereof or the like can be used. As such a substrate, a commercially available product can be used, or a substrate can be produced according to a known method.

When the electroluminescent device using the laminated structure of the present invention constitutes a pixel of a display apparatus, a circuit for driving such pixels may be established on the substrate, or a planarizing film may be established on such a driving circuit. When such a planarizing film is established, the centerline average roughness (Ra) of the planarizing film preferably satisfies Ra<10 nm. It is to be noted that Ra can be calculated with reference to JIS-B0651 to JIS-B0656, JIS-B0671-1, etc. in accordance with JIS-B0601-2001 of the Japanese Industrial Standards JIS.

<Anode>

From the viewpoint of the supply of a positive hole to the conductive organic material layer or the polymer binding layer, with regard to an anode which constitutes the electroluminescent device using the laminated structure of the present invention, the work function of the surface of the anode on the polymer binding layer or conductive organic material layer side is preferably 4.0 eV or more.

As a material for such an anode, an electroconductive compound such as a metal, an alloy, a metal oxide or a metal sulfide, or a mixture thereof can be used. Specific examples of the material include: conductive metal oxides such as tin oxide, zinc oxide, indium oxide, indium tin oxide (ITO), indium zinc oxide (IZO) and molybdenum oxide; metals such as gold, silver, chromium and nickel; and the mixtures of these conductive metal oxides and metals. The above described anode may have a monolayer structure consisting of one or two or more of these materials, or may also have a multilayer structure consisting of multiple layers having a single composition or a heterogeneous composition. When the anode has a multilayer structure, it is more preferable to use a material having a work function of 4.0 eV or more at the outermost surface layer of the polymer binding layer or conductive organic material layer.

As methods for producing an anode, known methods can be applied. Examples of such a method include a vacuum evaporation method, a sputtering method, an ion plating method, and a plating method.

The film thickness of such an anode is generally 10 nm to 10 μm, and preferably 50 nm to 500 nm. Moreover, from the viewpoint of prevention of the deficiency of electrical connection such as a short, the centerline average roughness (Ra) of the surface of the anode on the luminescent layer side satisfies preferably Ra<10 nm, and more preferably Ra<5 nm.

Further, after the anode has been produced by the above described method, the produced anode may be subjected to a surface treatment in a solution containing UV ozone, a silane coupling agent, or an electron-accepting compound such as 2,3,5,6-tetrafluoro-7,7,8,8-tetracyanoquinodimethane, in some cases. The electrical connection between the anode and an organic layer adjacent thereto is improved by such a surface treatment.

When the anode is used as a light reflective electrode in the electroluminescent device of the present invention, the anode preferably has a multilayer structure, in which a light reflective layer consisting of a highly light reflective metal is combined with a high work function material layer containing a material having a work function of 4.0 eV or more.

Specific examples of such an anode structure include:
(i) Ag—$MoO_3$;
(ii) (Ag—Pd—Cu alloy)-(ITO and/or IZO);
(iii) (AL-Nd alloy)-(ITO and/or IZO);
(iv) (Mo—Cr alloy)-(ITO and/or IZO); and
(v) (Ag—Pd—Cu alloy)-(ITO and/or IZO)—$MoO_3$. In order to obtain a sufficient light reflective rate, the film thickness of a highly light reflective metal layer, such as Al, Ag, an Al alloy, an Ag alloy or a Cr alloy, is preferably 50 nm or more, and more preferably 80 nm or more. The film thickness of a high work function material layer, such as ITO, IZO or $MoO_3$, is generally within the range from 5 nm to 500 nm.

<Cathode>

In the electroluminescent device using the laminated structure of the present invention, a cathode is disposed adjacent to the conductive organic material layer or the polymer binding layer and has the function of supplying an electron to such a layer. The cathode may have a monolayer structure consisting of a single material or a plurality of materials, or may have a multilayer structure consisting of multiple layers. When the cathode has a multilayer structure, it is preferably a bilayer structure consisting of a first cathode layer and a cover cathode layer, or a trilayer structure consisting of a first cathode structure, a second cathode structure and a cover cathode layer. Herein, the first cathode layer means a layer in the cathode, which is located on the side closest to the conductive organic material layer or the polymer binding layer; the cover cathode layer means a layer, which covers the first cathode layer when the cathode has a bilayer structure, and which covers the first cathode layer and the second cathode layer when the cathode has a trilayer structure. From the viewpoint of electron-supplying capacity, a material used for the first cathode layer preferably has a work function of 3.5 eV or less. Also, the oxide, fluoride, carbonate, complex oxide or the like of a metal, having a work function of 3.5 eV or less, is preferably used as a material used for the first cathode layer. As a material used for the cover cathode layer, a metal, a metal oxide or the like, which has low resistivity and high corrosion resistance to water, is preferably used.

Specific examples of such a material used for the first cathode layer include: an alkaline metal and an alkaline-earth metal; an alloy comprising one or more of the aforementioned metals; the oxide, halide, carbonate and complex oxide of the aforementioned metals; and the mixtures thereof. Examples of the alkaline metal or the oxide, halide, carbonate and complex oxide thereof include lithium, sodium, potassium, rubidium, cesium, lithium oxide, sodium oxide, potassium oxide, rubidium oxide, cesium oxide, lithium fluoride, sodium fluoride, potassium fluoride, rubidium fluoride, cesium fluoride, lithium carbonate, sodium carbonate, potassium carbonate, rubidium carbonate, cesium carbonate, potassium molybdate, potassium titanate, potassium tungstate, and cesium molybdate. Examples of the alkaline-earth metal or the oxide, halide, carbonate and complex oxide thereof include magnesium, calcium, strontium, barium, magnesium oxide, calcium oxide, strontium oxide, barium oxide, magnesium fluoride, calcium fluoride, strontium fluoride, barium fluoride, magnesium carbonate, calcium carbonate, strontium carbonate, barium carbonate, barium molybdate, and barium tungstate. Examples of the alloy comprising one or more alkaline metals or alkaline-earth metals include an Li—Al alloy, an Mg—Ag alloy, an Al—Ba alloy, an Mg—Ba alloy, a Ba—Ag alloy, and a Ca—Bi—Pb—Sn alloy. A composition formed from materials exemplified as a material for the first cathode layer and materials exemplified as a material which constitutes the electron injection layer can also be used for the first cathode layer. As materials for the second cathode layer, the same materials as those for the first cathode layer are used.

Specific examples of the cover cathode layer material include: low resistive metals such as gold, silver, copper, aluminum chromium, tin, lead, nickel and titanium, and alloys comprising these metals; conductive metal oxides such as tin oxide, zinc oxide, indium oxide, indium tin oxide (ITO), indium zinc oxide (IZO) and molybdenum oxide; and the mixtures of these conductive metal oxides and metals.

Examples of a layer structure in a case in which the cathode has a multilayer structure include: a bilayer structure consisting of a first cathode layer and a cover cathode layer, such as Mg/Al, Ca/Al, Ba/Al, NaF/Al, KF/Al, RbF/Al, CsF/Al, $Na_2CO_3$/Al, $K_2CO_3$/Al, and $Cs_2CO_3$/Al; and a trilayer structure consisting of a first cathode layer, a second cathode layer and a cover cathode layer, such as LiF/Ca/Al, NaF/Ca/Al, KF/Ca/Al, RbF/Ca/Al, CsF/Ca/Al, Ba/Al/Ag, KF/Al/Ag, KF/Ca/Ag, and $K_2CO_3$/Ca/Ag (wherein the symbol "/" is used to mean that two layers are adjacent to each other). A material used for the second cathode layer preferably has reduction action on a material used for the first cathode layer. Herein, the presence or absence of reduction action between materials and the degree thereof can be estimated from bond dissociation energy ($\Delta rH°$) between compounds. That is to say, in a reduction reaction of a material, which constitutes the second cathode layer, on a material, which constitutes the first cathode layer, when the compounds are combined so that the bond dissociation energy becomes positive, it is said that the material for the second cathode layer has reduction action on the material for the first cathode layer. For such bond dissociation energy, please refer to publications such as "*Denki Kagaku Binran* $5^{th}$ edition (Electrochemistry Handbook $5^{th}$ edition)" (Maruzen Co., Ltd., published in 2000); "*Netsu Riki-gaku* Database MALT (Thermodynamics Database MALT)" (Kagaku Gijutsu Sha, published in 1992).

For the production of a cathode, various known methods can be applied, and examples of such a production method include a vacuum evaporation method, a sputtering method and an ion plating method. When a metal or the oxide, fluoride or carbonate of the metal is used, a vacuum evaporation method is frequently applied. When a metal oxide having a high boiling point, a metal complex oxide, or a conductive metal oxide such as indium tin oxide (ITO) is used, a sputtering method or an ion plating method is frequently applied. When a film is formed from a composition containing a different type of material, a co-evaporation method, a sputtering method, an ion plating method or the like is applied. In particular, when a film is formed from a composition consisting of a low molecular weight organic material, and a metal, or the oxide, fluoride or carbonate of the metal, a co-evaporation method is appropriate.

The optimal value of the film thickness of the cathode is different depending on the materials used and a layer structure. The optimal value of such a film thickness may be selected, such that a driving voltage, luminous efficiency, and the lifetime of the device may have adequate values. In general, the film thickness of a first cathode layer is 0.5 nm to 20 nm, and the film thickness of a cover cathode layer is 10 nm to 1 μm. For example, when Ba or Ca is used as a first cathode layer, and Al is used as a cover cathode layer, the film thickness of such Ba or Ca is preferably 2 nm to 10 nm, and the film thickness of such Al is preferably 10 nm to 500 nm. When NaF or KF is used as a first cathode layer, and Al is used as a cover cathode layer, the film thickness of such NaF or KF is preferably 1 nm to 8 nm, and the film thickness of such Al is preferably 10 nm to 500 nm.

<Hole Injection Layer>

In the electroluminescent device of the present invention, examples of materials other than the conjugated polymer compound used in the present invention, which form a hole injection layer, include a carbazole derivative, a triazole derivative, an oxazole derivative, an oxadiazole derivative, an imidazole derivative, a polyaryl alkane derivative, a pyrazoline derivative, a pyrazolone derivative, a phenylenediamine derivative, an arylamine derivative, a starburst type amine, a phthalocyanine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine compound, a porphyrin compound, a polysilane compound, a poly(N-vinyl carbozole) derivative, an organic silane derivative, and polymers containing these compounds. Examples also include: conductive metal oxides such as vanadium oxide, tantalum oxide, tungsten oxide, molybdenum oxide, ruthenium oxide and aluminum oxide; conductive polymers and oligomers, such as polyaniline, an aniline copolymer, a thiophene oligomer and polythiophene; organic conductive materials such as poly(3,4-ethylenedioxythiophene)/polystyrenesulfonic acid and polypyrrole; polymers containing these compounds; and amorphous carbon. Further examples of the aforementioned materials, which can be preferably used herein, include:

acceptor-type organic compounds such as a tetracyanoquinodimethane derivative (e.g. 2,3,5,6-tetrafluoro-7,7,8,8-tetracyanoquinodimethane), a 1,4-naphthoquinone derivative, a diphenoquinone derivative and a polynitro compound; and silane coupling agents such as octadecyltrimethoxysilane.

The above described material may be used as a single ingredient, or a composition consisting of multiple ingredients. In addition, the hole injection layer may have a monolayer structure consisting of one or two or more of the above described materials, or a multilayer structure consisting of multiple layers having a single composition or a heterogeneous composition. Moreover, materials exemplified as a material, which can be used as a hole transport layer or an interlayer, may also be used as hole injection layers.

As methods for producing a hole injection layer, various known methods can be applied. In the case of using an inorganic compound material, a vacuum evaporation method, a sputtering method, an ion plating method and the like can be applied. In the case of using a low molecular weight organic material, a vacuum evaporation method, a transfer method such as laser transfer or thermal transfer, a method involving film formation from solution (wherein a mixed solution comprising a polymer binder and a positive hole injection material may be used), and the like can be applied. Moreover, in the case of a high molecular weight organic material, a method involving film formation from solution can be applied.

When a positive hole injection material is a low molecular weight compound such as a pyrazoline derivative, an arylamine derivative, a stilbene derivative or a triphenyldiamine derivative, a hole injection layer can be formed according to a vacuum evaporation method.

Moreover, it is also possible to form a hole injection layer film, using a mixed solution, in which a polymer compound binder and the above described low molecular weight positive hole injection material are dispersed. As a high molecular weight compound binder to be mixed, a compound, which does not significantly inhibit charge transport, is preferable, and a compound, which does not absorb visible light so much, is preferably used. Specific examples of such a compound include poly(N-vinyl carbazole), polyaniline and the derivative thereof, polythiophene and the derivative thereof, poly (p-phenylenevinylene) and the derivative thereof, poly(2,5-thienylenevinylene) and the derivative thereof, polycarbonate, polyacrylate, polymethyl acrylate, polymethyl methacrylate, polystyrene, polyvinyl chloride, and polysiloxane.

The type of a solvent used in the formation of a film from a solution is not particularly limited, as long as it dissolves a positive hole injection material. Examples of such a solvent include: water; chlorine-containing solvents such as chloroform, methylene chloride and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate and ethyl cellosolve acetate.

Examples of a method of forming a film from a solution, which can be applied herein, include: coating methods from solution, such as a spin coating method, a casting method, a micro gravure coating method, a gravure coating method, a bar-coating method, a roll coating method, a wire-bar coating method, a dip coating method, a slit coating method, a capillary coating method, a spray coating method and a nozzle coating method; and coating methods involving printing, such as a gravure printing method, a screen printing method, a flexographic method, an offset printing method, a reverse printing method and an ink jet printing method. In terms of the easiness of the formation of a pattern, printing methods such as a gravure printing method, a screen printing method, a flexographic method, an offset printing method, a reverse printing method and an ink jet printing method, and a nozzle coating method are preferable.

Following the formation of a hole injection layer, when organic compound layers such as a hole transport layer, an interlayer and a luminescent layer are formed, and in particular, when two layers are formed according to a coating method, there may be a case in which the previously coated layer is dissolved in a solvent contained in a solution of a layer, which is subsequently applied, and as a result, a laminated structure cannot be formed.

In this case, a method of insolubilizing the lower layer in a solvent can be applied. Examples of such a method of insolubilizing the lower layer include: a method comprising adding a crosslinking group to a polymer compound so as to insolubilize it by crosslinking; a method comprising mixing, as a crosslinker, a low molecular weight compound having a crosslinking group with an aromatic ring, such as aromatic bisazide, so as to insolubilize the layer by crosslinking; a method comprising mixing, as a crosslinker, a low molecular weight compound having a crosslinking group without having an aromatic ring, such as an acrylate group, so as to insolubilize the layer by crosslinking; a method comprising exposing the lower layer to ultraviolet light to crosslink it, and thereby insolubilizing it in an organic solvent used in the production of an upper layer; and a method comprising heating the lower layer so as to crosslink it, and thereby insolubilizing it in an organic solvent used in the production of an upper layer. The heating temperature applied to the heating of the lower layer is generally 100° C. to 300° C., and the heating time is generally 1 minute to 1 hour.

In addition, other than the aforementioned methods involving crosslinking, the methods of laminating the lower layer without dissolving it include those using two solutions each having a different polarity in the production of two adjacent layers. For example, there is a method, in which a water-soluble polymer compound is used for the lower layer and an oil-soluble polymer compound is used for the upper layer, so as to prevent the dissolution of the lower layer after coating.

<Hole Transport Layer and Interlayer>

In the electroluminescent device of the present invention, examples of materials, which constitute a hole transport layer and an interlayer, other than the aromatic polymer compound used in the present invention, include a carbazole derivative, a triazole derivative, an oxazole derivative, an oxadiazole derivative, an imidazole derivative, a polyaryl alkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, stilbene derivative, a silazane derivative, an aromatic tertiary amine compound, a styrylamine compound, an aromatic dimethylidine compound, a porphyrin compound, a polysilane compound, a poly(N-vinyl carbozole) derivative, an organic silane derivative, and polymers containing these compounds. Moreover, other examples include: conductive polymers and oligomers, such as an aniline copolymer and a thiophene oligomer; and organic conductive materials such as polypyrrole.

The above described material may be used as a single ingredient, or a composition consisting of multiple ingredients. In addition, the hole transport layer and the interlayer each may have a monolayer structure consisting of one or two or more of the above described materials, or a multilayer structure consisting of multiple layers having a single composition or a heterogeneous composition. Moreover, materials exemplified as a material, which can be used as a hole injection layer, may also be used as hole transport layers.

Specifically, the compounds disclosed in JP 63-70257 A, JP 63-175860 A, JP 2-135359 A, JP 2-135361 A, JP 2-209988 A, JP 3-37992 A, JP 3-152184 A, JP 5-263073 A, JP 6-1972 A, WO2005/52027, JP 2006-295203 A, and the like can be used as materials for the hole transport layer and the interlayer. Among others, a polymer comprising a divalent aromatic amine residue as a repeating unit is preferably used.

An example of such a divalent aromatic amine residue is a group represented by the following formula (XIX):

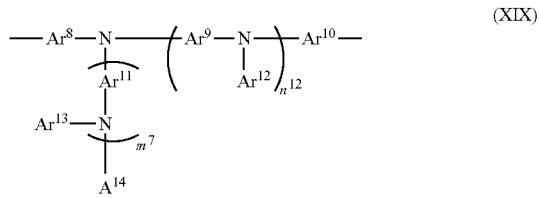

In the above formula, $Ar^8$, $Ar^9$, $Ar^{10}$ and $Ar^{11}$ each independently represent an arylene group optionally having a substituent, or a divalent heterocyclic group optionally having a substituent; $Ar^{12}$, $Ar^{13}$ and $Ar^{14}$ independently represent an aryl group optionally having a substituent, or a monovalent heterocyclic group optionally having a substituent; and $n^{12}$ and $m^7$ each independently represent 0 or 1.

Examples of a substituent, which the above described arylene group, aryl group, divalent heterocyclic group and monovalent heterocyclic group may optionally have, include a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, a carbamoyl group, an acid imide group, an imine residue group, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group, and a carboxyl group. The substituent may be a crosslinking group such as a vinyl group, an acetylene group, a butenyl group, an acryl group, an acrylate group, an acrylamide group, a methacryl group, a methacrylate group, a methacrylamide group, a vinyl ether group, a vinyl amino group, a silanol group, a group having a small ring (a cyclopropyl group, a cyclobutyl group, an epoxy group, an oxetane group, a diketene group, an episulfide group, etc.), a lactone group, a lactam group, or a group containing the structure of a siloxane derivative. When $n^{12}$ is 0, the arylene group, in which $Ar^8$ may be bonded to $Ar^{10}$ directly or via a divalent group such as —O— or —S—, may be a phenylene group and the like, and the divalent heterocyclic group may be a pyridine diyl group and the like. The aryl group may include a phenyl group, a naphthyl group and the like, and the monovalent heterocyclic group may be a pyridyl group and the like.

The polymer comprising a divalent aromatic amine as a repeating unit may further have other repeating units. Such other repeating units include arylene groups such as a phenylene group and a fluorene diyl group. Among such polymers, a polymer comprising a crosslinking group is more preferable.

As a method of forming a hole transport layer and an interlayer, the same method as the method of forming a hole injection layer is applied. Examples of a method of forming such layers from a solution include coating methods and printing methods, such as the above described spin coating method, casting method, bar-coating method, slit coating method, spray coating method, nozzle coating method, gravure printing method, screen printing method, flexographic method and ink jet printing method. When a sublimation compound material is used, a vacuum evaporation method, a transfer method and the like are applied. Examples of a solvent used in the formation of a film from a solution are the same as those exemplified in the method of forming a hole injection layer.

Following the formation of a hole transport layer and an interlayer, when an organic compound layer such as a luminescent layer is formed by a coating method, if a lower layer is dissolved in a solvent contained in a solution of a layer, which is subsequently applied, it may be adequate if the solvent dissolves a positive hole injection material. The lower layer may be converted to be insoluble in the solvent by the same method as that exemplified in the method of forming a hole injection layer.

<Luminescent Layer>

In the electroluminescent device of the present invention, when the conductive organic material layer has a luminescent layer, examples of such a luminescent layer that can be preferably used herein include a polyfluorene derivative, a polyparaphenylene vinylene derivative, a polyphenylene derivative, a polyparaphenylene derivative, a polythiophene derivative, and luminescent material compounds such as polydialkylfluorene, polyfluorenebenzothiadiazole and polyalkylthiophene.

Moreover, such a luminescent layer may comprise: polymer pigment compounds such as a perylene pigment, a coumalin pigment and a rhodamine pigment; and low molecular weight pigment compounds such as rubrene, perylene, 9,10-diphenylanthracene, tetraphenylbutadiene, Nile red, coumalin 6 and quinacridon. Moreover, such a luminescent layer may also comprise: pigments such as a naphthalene derivative, anthracene and the derivative thereof, perylene and the derivative thereof, and polymethine, xanthene, coumalin and cyanine pigments; metal complexes of 8-hydroxyquinoline and the derivative thereof, metal complexes emitting phosphorescence, such as aromatic amine, tetraphenylcyclopentadiene and the derivative thereof, tetraphenylbutadiene and the derivative thereof, and tris(2-phenylpyridine)iridium.

Furthermore, the luminescent layer of the electroluminescent device of the present invention may be composed of a composition of a non-conjugated polymer compound with a luminescent organic compound such as the above described organic pigment or the above described metal complex. Examples of such a non-conjugated polymer compound include polyethylene, polyvinyl chloride, polycarbonate, polystyrene, polymethyl methacrylate, polybutyl methacrylate, polyester, polysulfone, polyphenylene oxide, polybutadiene, poly(N-vinyl carbazole), a hydrocarbon resin, a ketone resin, a phenoxy resin, polyamide, ethyl cellulose, vinyl acetate, an ABS resin, polyurethane, a melamine resin, an unsaturated polyester resin, an alkyd resin, an epoxy resin, and a silicon resin. The above described non-conjugated polymer compound may have, on the side chain thereof, a structure shown as one or more derivatives or compounds selected from the group consisting of a carbazole derivative, a triazole derivative, an oxazole derivative, an oxadiazole derivative, an imidazole derivative, a polyaryl alkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, stilbene derivative, a silazane derivative, an aromatic tertiary amine compound, a styrylamine compound, an aromatic dimethylidine compound, a porphyrin compound, and an organic silane derivative.

When the luminescent layer comprises a low molecular weight compound, examples of such a low molecular weight compound include: low molecular weight pigment compounds such as rubrene, perylene, 9,10-diphenylanthracene, tetraphenylbutadiene, Nile red, coumalin 6, carbazole and quinacridon; pigments such as a naphthalene derivative, anthracene and the derivative thereof, perylene and the derivative thereof, and polymethine, xanthene, coumalin, cyanine and indigo pigments; metal complexes of 8-hydroxyquinoline and the derivative thereof; metal complexes of phthalocyanine and the derivative thereof; aromatic amine; tetraphenylcyclopentadiene and the derivative thereof; and tetraphenylbutadiene and the derivative thereof.

When the luminescent layer comprises a metal complex emitting phosphorescence, examples of such a metal complex include tris(2-phenylpyridine)iridium, a thienylpyridine ligand-containing iridium complex, a phenylquinoline ligand-containing iridium complex, and a triazabicyclononane skeleton-containing terbium complex.

Specific examples of a luminescent material compound used for the luminescent layer include polyfluorene, the derivative thereof and the copolymer thereof, polyarylene, the derivative thereof and the copolymer thereof, polyarylenevinylene, the derivative thereof and the copolymer thereof, and a (co)polymer of aromatic amine and the derivative thereof, which are disclosed in WO97/09394, WO98/27136, WO99/54385, WO00/22027, WO01/19834, GB 2340304A, GB 2348316, U.S. Pat. No. 573,636, U.S. Pat. No. 5,741,921, U.S. Pat. No. 5,777,070, EP 0707020, JP 9-111233 A, JP 10-324870×JP 2000-80167 A, JP 2001-123156 A, JP 2004-168999 A, JP 2007-162009 A, "*Yuki EL Soshi no Kaihatsu to Kosei Zairyo* (Development of organic EL devices and constitutional materials)" (CMC Publishing Co., Ltd., published in 2006), and the like.

Moreover, specific examples of a low molecular weight compound include compounds described, for example, in JP 57-51781 A, "*Yuki Usumaku Shigoto Kansu Data Shu [2$^{nd}$ edition]* (Data of organic thin film work functions [2$^{nd}$ edition])" (CMC Publishing Co., Ltd., published in 2006), "*Yuki EL Soshi no Kaihatsu to Kosei Zairyo* (Development of organic EL devices and constitutional materials)" (CMC Publishing Co., Ltd., published in 2006), and the like.

The above described material may be a single ingredient, or a composition consisting of multiple ingredients. In addition, the luminescent layer may have a monolayer structure consisting of one or two or more of the above described materials, or a multilayer structure consisting of multiple layers having a single composition or a heterogeneous composition.

As a method of forming a luminescent layer, the same method as the method of forming a hole injection layer is applied. Examples of a method of forming such layers from a solution include the above described coating methods and printing methods, such as a spin coating method, a casting method, a bar-coating method, a slit coating method, a spray coating method, a nozzle coating method, a gravure printing method, a screen printing method, a flexographic method and an ink jet printing method. When a sublimation compound material is used, a vacuum evaporation method, a transfer method and the like are applied. Examples of a solvent used in the formation of a film from a solution are the same as those exemplified in the method of forming a hole injection layer.

Following the formation of a luminescent layer, when an organic compound layer such as a luminescent layer is formed by a coating method, if a lower layer is dissolved in a solvent contained in a solution of a layer, which is subsequently applied, the lower layer may be converted to be insoluble in the solvent by the same method as that exemplified in the method of forming a hole injection layer.

<Electron Transport Layer and Hole-Blocking Layer>

In the electroluminescent device, in which the laminated structure of the present invention is used, known materials can be used as materials which constitute the electron transport layer and the hole-blocking layer. Examples of such materials include: aromatic tetracarboxylic anhydrides such as a triazole derivative, an oxazole derivative, an oxadiazole derivative, an imidazole derivative, a fluorenone derivative, benzoquinone and the derivative thereof, naphthoquinone and the derivative thereof, anthraquinone and the derivative thereof, tetracyanoanthraquinodimethane and the derivative thereof, a fluorenone derivative, diphenyldicyanoethylene and the derivative thereof, a diphenoquinone derivative, an anthraquinodimethane derivative, an anthrone derivative, a thiopyran dioxide derivative, a carbodiimide derivative, a fluorenylidenemethane derivative, a distyrylpyrazine derivative, naphthalene and perylene; various metal complexes including, as typical examples, metal complexes of a phthalocyanine derivative and a 8-quinolinol derivative, and metal complexes comprising, as ligands, metal phthalocyanine, benzoxazole and benzothiazole; metal complexes of an organic silane derivative, 8-hydroxyquinoline and the derivative thereof; and polyquinoline and the derivative thereof, polyquinoxaline and the derivative thereof, and polyfluorene and the derivative thereof. Of these, metal complexes of a triazole derivative, an oxadiazole derivative, benzoquinone and the derivative thereof, anthraquinone and the derivative thereof, or 8-hydroxyquinoline and the derivative thereof, polyquinoline and the derivative thereof, polyquinoxaline and the derivative thereof, and polyfluorene and the derivative thereof are preferable.

The above described material may be a single ingredient, or a composition consisting of multiple ingredients. In addition, the electron transport layer and the hole-blocking layer may have a monolayer structure consisting of one or two or more of the above described materials, or a multilayer structure consisting of multiple layers having a single composition or a heterogeneous composition. Moreover, materials exemplified as materials which can be used for the electron injection layer may also be used for the electron transport layer and the hole-blocking layer.

As a method of forming an electron transport layer and a hole-blocking layer, the same method as the method of forming a hole injection layer is applied. Examples of a method of forming such layers from a solution include the above described coating methods and printing methods, such as a spin coating method, a casting method, a bar-coating method, a slit coating method, a spray coating method, a nozzle coating method, a gravure printing method, a screen printing method, a flexographic method and an ink jet printing method. When a sublimation compound material is used, a vacuum evaporation method, a transfer method and the like are applied. Examples of a solvent used in the formation of a film from a solution are the same as those exemplified in the method of forming a hole injection layer.

Following the formation of an electron transport layer and a hole-blocking layer, when an organic compound layer such as an electron injection layer is formed by a coating method, if a lower layer is dissolved in a solvent contained in a solution of a layer, which is subsequently applied, the lower layer may be converted to be insoluble in the solvent by the same method as that exemplified in the method of forming a hole injection layer.

<Electron Injection Layer>

In the electroluminescent device, in which the laminated structure of the present invention is used, known materials can be used as electron injection layers. Examples of such materials include: aromatic tetracarboxylic anhydrides such as a triazole derivative, an oxazole derivative, an oxadiazole derivative, an imidazole derivative, a fluorenone derivative, benzoquinone and the derivative thereof, naphthoquinone and the derivative thereof, anthraquinone and the derivative thereof, tetracyanoanthraquinodimethane and the derivative thereof, a fluorenone derivative, diphenyldicyanoethylene and the derivative thereof, a diphenoquinone derivative, an anthraquinodimethane derivative, an anthrone derivative, a thiopyran dioxide derivative, a carbodiimide derivative, a fluorenylidenemethane derivative, a distyrylpyrazine derivative, naphthalene and perylene; various metal complexes including, as typical examples, metal complexes of a phthalocyanine derivative and a 8-quinolinol derivative, and metal complexes comprising, as ligands, metal phthalocyanine, benzoxazole and benzothiazole; and an organic silane derivative.

The above described material may be a single ingredient, or a composition consisting of multiple ingredients. In addition, the electron injection layer may have a monolayer structure consisting of one or two or more of the above described materials, or a multilayer structure consisting of multiple layers having a single composition or a heterogeneous composition. Moreover, materials exemplified as materials which can be used for the electron transport layer and the hole-blocking layer may also be used for the electron injection layer.

As a method of forming an electron injection layer, the same method as the method of forming a hole injection layer is applied. Examples of a method of forming such layers from a solution include the above described coating methods and printing methods, such as a spin coating method, a casting method, a bar-coating method, a slit coating method, a spray coating method, a nozzle coating method, a gravure printing method, a screen printing method, a flexographic method and an ink jet printing method. When a sublimation compound material is used, a vacuum evaporation method, a transfer method and the like are applied. Examples of a solvent used in the formation of a film from a solution are the same as those exemplified in the method of forming a hole injection layer.

<Insulation Layer>

An insulation layer having a film thickness of 5 nm or less, which the electroluminescent device of the present invention may optionally have, has functions such as the improvement of adhesion to an electrode, the improvement of injection of charge (that is, a positive hole or an electron) from the electrode, and the prevention of mixing with an adjacent layer. Materials used for the aforementioned insulation layer include a metal fluoride, a metal oxide, an organic insulation material (polymethyl methacrylate, etc.), and the like. Electroluminescent devices, in which an insulation layer having a film thickness of 5 nm or less is established, include: an electroluminescent device in which an insulation layer having a film thickness of 5 nm or less is established adjacent to the cathode; and an electroluminescent device in which an insulation layer having a film thickness of 5 nm or less is established adjacent to the anode.

As a method for producing an electroluminescent device using the laminated structure of the present invention, for example, the device can be produced by successively laminating individual layers on a substrate. Specifically, an anode is established on a substrate; layers such as a hole injection layer, a hole transport layer and an interlayer are then established thereon, as necessary; a luminescent layer is then established thereon; layers such as an electron transport layer and an electron injection layer are then established thereon, as necessary; and a cathode is further laminated thereon, so as to produce the aforementioned device. Otherwise, a cathode is established on a substrate; layers such as an electron injection layer, an electron transport layer and an interlayer are then established thereon, as necessary; layers such as a hole transport layer and a hole injection layer are then established thereon, as necessary; and an anode is further laminated thereon, so as to produce the aforementioned device.

A display apparatus can be produced using the electroluminescent device of the present invention. The display apparatus comprises the electroluminescent device as one pixel unit. As an embodiment of the alignment of such pixel units may be an alignment which is generally adopted for display apparatuses such as a television, for example, an embodiment in which a large number of pixels are aligned on a common substrate. In the apparatus of the present invention, pixels aligned on a substrate may be formed in a pixel region determined by bank, as necessary.

The above described apparatus may further have a sealing member on the side opposite to the substrate, while sandwiching a luminescent layer and the like therebetween, as necessary. Moreover, the apparatus may further have any given constitutional elements for constituting the display apparatus, including a filter such as a color filter or a fluorescence conversion filter, and a circuit and a wire necessary for driving pixels, and the like, as necessary.

In the laminated structure of the present invention, preferred combinations of an electrode, a binding group E, an r+p valent group G having an aromatic ring, and $Ar^1$ are as follows. When the electrode of the laminated structure of the present invention functions as an anode, the electrode is preferably gold, silver, indium tin oxide (ITO) or indium zinc oxide, the binding group E is preferably a binding group which is formed when $E^a$ is a mercapto group, a carboxyl group, a phosphonic acid group or a trialkoxysilyl group, the group G is a group constituting a conjugated polymer represented by the above formula (L-4), (L-9) or (L-10), and the $Ar^1$ is preferably a group having the orbital energy of the HOMO of $-5.5$ eV or more and $-4.0$ eV or less. When the electrode of the laminated structure of the present invention functions as a cathode, the electrode is preferably aluminum or silver, the groups E and G are preferably the same groups as those in the above described example in which the electrode of the laminated structure functions as an anode, and the $Ar^1$ is preferably a group having the orbital energy of the LUMO of $-3.5$ eV or more and $-0.5$ eV or less.

Next, a photoelectric conversion device, which can be produced using the laminated structure of the present invention, will be described. Such a photoelectric conversion device, in which the laminated structure of the present invention is used, has a polymer binding layer between an electrode and a conductive organic material layer.

The conductive organic material layer of the photoelectric conversion device of the present invention comprises an electron-donating compound and an electron-accepting compound. An example of the electron-donating compound is a conjugated polymer compound. Specific examples include a polymer compound containing a thiophenediyl group and a polymer compound containing a fluorenediyl group. In addition, examples of the electron-accepting compound include fullerene and a fullerene derivative.

The photoelectric conversion device, in which the laminated structure of the present invention is used, is generally formed on a supporting substrate. The type of such a supporting substrate is not particularly limited, as long as it does not inhibit the characteristics of an organic photoelectric conversion device. A second electrode, a glass substrate, a flexible film substrate, and a plastic substrate may also be used. When the photoelectric conversion device has a polymer binding layer between an anode and a conductive organic material layer, the used electrode is an anode, the second electrode is a cathode, and the polymer binding layer is used as a hole transport layer or the like. When the photoelectric conversion device has a polymer binding layer between a cathode and a conductive organic material layer, the electrode is a cathode, the second electrode is an anode, and the polymer binding layer is used as an electron transport layer or the like.

The photoelectric conversion device of the present invention can be produced according to known methods such as the method described in Synch. Met., 102, 982 (1999) or the method described in Science, 270, 1789 (1995).

EXAMPLES

Hereinafter, the present invention will be described more in detail in the following examples. However, these examples are not intended to limit the scope of the present invention.

The weight average molecular weight (Mw) and number average molecular weight (Mn) of a polymer were obtained as a polystyrene equivalent weight average molecular weight and a polystyrene equivalent number average molecular weight, respectively, using gel permeation chromatography (GPC) (manufactured by Tosoh Corporation; trade name: HLC-8220GPC). In addition, a sample to be measured was dissolved in tetrahydrofuran to a concentration of approximately 0.5% by mass, and 50 μL of the obtained solution was poured into GPC. Moreover, tetrahydrofuran was used as a mobile phase of GPC, and it was supplied at a flow rate of 0.5 mL/min. The structural analyses of polymers and compounds were carried out by $^1$H-NMR analysis, using a 300 MHz NMR spectrometer manufactured by Varian. The measurement was carried out by dissolving a sample in a heavy solvent, in which the sample was soluble, to a concentration of 20 mg/mL. The area of an electrode was set at 4 mm$^2$, during the current-voltage measurement of a laminated structure and a polymer film.

Example 1

Synthesis of Compound H 10.4 g of magnesium and 120 mL of THF were added to a reaction vessel, and a mixed solvent of 93.0 g of p-dibromobenzene and 160 mL of THF was then added dropwise thereto (mixed solution 1). To another reaction vessel, 72.0 g of cyanuric chloride and 720 mL of toluene were added, and the mixture was then cooled to 0° C. Thereafter, the mixed solution 1 was added dropwise to the reaction solution, and the obtained mixture was then stirred for 1 hour. Subsequently, an ammonium chloride aqueous solution was added to the reaction solution, the solution was then separated with chloroform, and an organic layer was then concentrated. The obtained crude product was purified by recrystallization to obtain 77.2 g of a compound J. The results of the NMR analysis of this compound J are shown below.

$^1$H NMR (400 MHz, CDCl$_3$, rt)

δ 7.68 (2H), 8.38 (2H)

From these results, it was confirmed that the compound J is represented by the following formula:

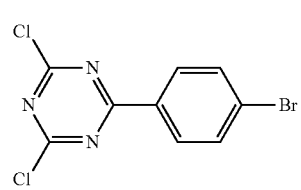

(Compound J)

Subsequently, 15.0 g of the compound J, 188 mL of acetone, and 7.5 g of thiourea were added to a reaction vessel, and the mixture was then heated to reflux for 1 hour. The reaction solution was cooled to 0° C., and sodium carbonate was then added dropwise thereto, followed by stirring. The reaction mixture was filtrated, and hydrochloric acid was then added to the filtrate so that it was changed to be acidic. The precipitate was collected by filtration to obtain a crude product. The obtained crude product was purified by column chromatography, so as to obtain 6.8 g of a compound H. The results of the NMR analysis of this compound H are shown below.

$^1$H NMR (400 MHz, DMSO-d$_6$, rt)

δ 3.17 (1H), 7.78 (2H), 8.05 (2H), 13.87 (1H)

From these results, it was confirmed that the compound H is represented by the following formula:

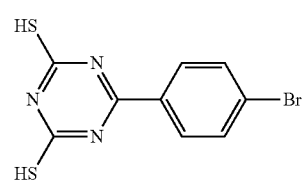

(Compound H)

Example 2

Synthesis of Compound C 138 mL of isopropanol and 2.3 g of metallic sodium were added to a reaction vessel, and the mixture was then heated to reflux. Subsequently, 9.8 g of t-butyl mercaptan was added to the reaction solution, and the obtained mixture was then cooled to a room temperature. Thereafter, 15.0 g of the compound H was added to the reaction solution, and the obtained mixture was then refluxed for 2 hours. Subsequently, water and a sodium hydroxide aqueous solution were added to the reaction solution, the mixed solution was then separated with t-butyl methyl ether, and an organic layer was then concentrated. The obtained crude product was washed with petroleum ether to obtain 8.1 g of a compound C. The results of the NMR analysis of this compound C are shown below.

$^1$H NMR (400 MHz, CDCl$_3$, rt)

δ 1.67 (18H), 7.62 (2H), 8.28 (2H)

From these results, it was confirmed that the compound C is represented by the following formula:

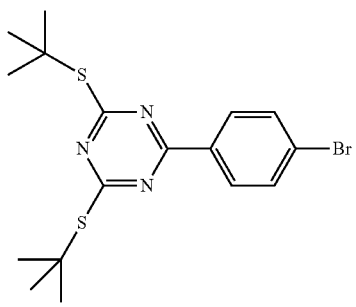

(Compound C)

Example 3

Synthesis of Composition A

To a 25-mL double-necked flask, 250 mg of a compound B (0.43 mmol) represented by the following formula:

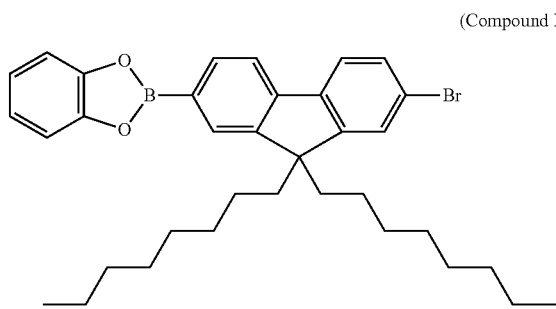

(Compound B)

and 14.0 mg of a compound C (0.034 mmol) represented by the following formula:

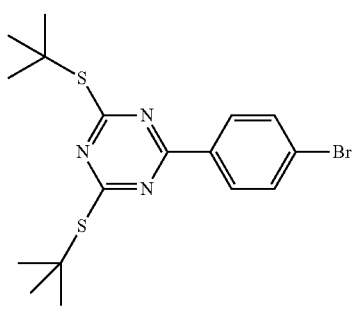

(Compound C)

were added, and the inside of the flask was then substituted with argon gas. To such a flask, 9 mL of toluene was added, and the obtained mixture was then stirred at 45° C. for 5 minutes. Subsequently, 0.58 mg of tris(dibenzylideneacetone)dipalladium (0.0006 mmol) and 1.80 mg of tris(2-methoxyphenyl)phosphine (0.0051 mmol) were added to the reaction solution, and the obtained mixture was then stirred at 45° C. for 10 minutes. Then, 2.0 mL of 33-mass-% cesium carbonate aqueous solution was added to the reaction solution, and the obtained mixture was then stirred at 45° C. for 5 minutes. Subsequently, the reaction solution was stirred at 110° C. for 2 hours. Thereafter, 0.58 mg of tris(dibenzylideneacetone)dipalladium (0.0006 mmol) and 1.80 mg of tris(2-methoxyphenyl)phosphine (0.0051 mmol) were added to the reaction solution, and the obtained mixture was further stirred for 2 hours. Thereafter, 0.58 mg of tris(dibenzylideneacetone)dipalladium (0.0006 mmol) and 1.80 mg of tris(2-methoxyphenyl)phosphine (0.0051 mmol) were added to the reaction solution, and the obtained mixture was further stirred for 2 hours.

Subsequently, 92.8 mg of 4-(4,4,5,5-tetramethyl-1,3,2-dioxaborolan-2-yl)toluene (0.43 mmol) and 2 mL of toluene were added to the reaction solution, and then, 0.58 mg of tris(dibenzylideneacetone)dipalladium (0.0006 mmol), 1.80 mg of tris(2-methoxyphenyl)phosphine (0.0051 mmol), and 1.1 mL of 33-mass-% cesium carbonate aqueous solution were added thereto. The obtained mixture was stirred at 110° C. for 2 hours. Thereafter, 6.0 mg of tris(dibenzylideneacetone)dipalladium (0.0065 mmol) and 18.0 mg of tris(2-methoxyphenyl)phosphine (0.051 mmol) were added to the reaction solution, and the obtained mixture was then stirred for 8 hours. Thereafter, the reaction solution was cooled to a room temperature, and the organic layer of the reaction solution was then separated from the water layer thereof. The organic layer was added dropwise to 120 mL of methanol to deposit a precipitate. The precipitate was filtrated and was then dried to obtain a yellow solid. This yellow solid was dissolved in 20 mL of toluene, and the solution was then subjected to column chromatography using silica gel and activated alumina so that it was concentrated to dryness. The obtained solid was dissolved in toluene, and the obtained solution was then added dropwise to methanol to deposit a precipitate. The thus obtained precipitate was filtrated and was then dried, so as to obtain 150 mg of a composition A.

From the results of NMR analysis, it was found that the composition A was a composition, which comprised a polymer 1 represented by the following formula:

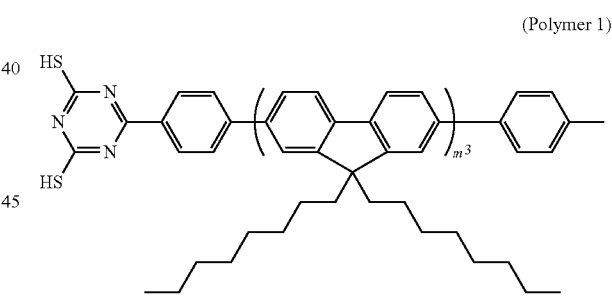

(Polymer 1)

wherein $m^3$ represents the degree of polymerization, and a polymer 2 represented by the following formula:

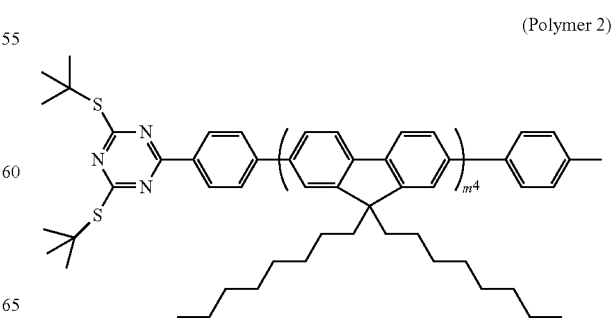

(Polymer 2)

wherein m⁴ represents the degree of polymerization, at a molar ratio of 38:62. In addition, the polystyrene equivalent number average molecular weight Mn of the composition A was $7.9 \times 10^3$, and the polystyrene equivalent weight average molecular weight Mw of the composition A was $1.7 \times 10^4$. Since the —S-t-Bu portion was converted to —SH during the polymerization, a deprotection step was omitted.

Example 4

Synthesis of Composition D

To a 25-mL double-necked flask, 250 mg of a compound E (0.47 mmol) represented by the following formula:

(Compound E)

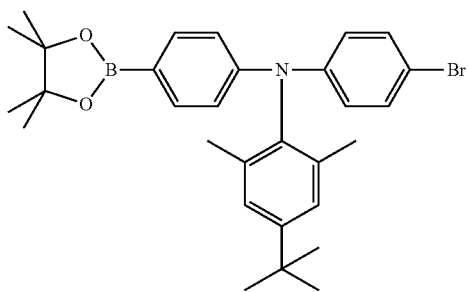

and 15.4 mg of a compound C (0.037 mmol) represented by the following formula:

(Compound C)

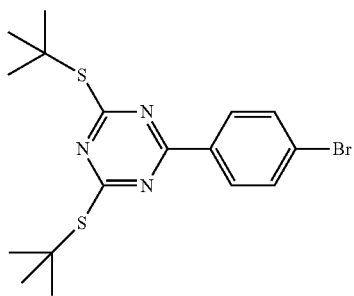

were added, and the inside of the flask was then substituted with argon gas. To such a flask, 9 mL of toluene was added, and the obtained mixture was then stirred at 45° C. for 5 minutes. Subsequently, 0.64 mg of tris(dibenzylideneacetone)dipalladium (0.0007 mmol) and 1.98 mg of tris(2-methoxyphenyl)phosphine (0.0056 mmol) were added to the reaction solution, and the obtained mixture was then stirred at 45° C. for 10 minutes. Then, 2.2 mL of 33-mass-% cesium carbonate aqueous solution was added to the reaction solution, and the obtained mixture was then stirred at 45° C. for 5 minutes. Subsequently, the reaction solution was stirred at 110° C. for 2 hours. Thereafter, 0.64 mg of tris(dibenzylideneacetone)dipalladium (0.0007 mmol) and 1.98 mg of tris(2-methoxyphenyl)phosphine (0.0056 mmol) were added to the reaction solution, and the obtained mixture was further stirred for 2 hours. Thereafter, 0.64 mg of tris(dibenzylideneacetone)dipalladium (0.0007 mmol) and 1.98 mg of tris(2-methoxyphenyl)phosphine (0.0056 mmol) were added to the reaction solution, and the obtained mixture was further stirred for 2 hours.

Subsequently, 102.1 mg of 4-(4,4,5,5-tetramethyl-1,3,2-dioxaborolan-2-yl)toluene (0.47 mmol) and 2 mL of toluene were added to the reaction solution, and then, 0.64 mg of tris(dibenzylideneacetone)dipalladium (0.0007 mmol), 1.98 mg of tris(2-methoxyphenyl)phosphine (0.0056 mmol), and 1.1 mL of 33-mass-% cesium carbonate aqueous solution were added thereto. The obtained mixture was stirred at 110° C. for 2 hours. Thereafter, 6.0 mg of tris(dibenzylideneacetone)dipalladium (0.0065 mmol) and 18.0 mg of tris(2-methoxyphenyl)phosphine (0.051 mmol) were added to the reaction solution, and the obtained mixture was then stirred for 7 hours. Thereafter, the reaction solution was cooled to a room temperature, and the organic layer of the reaction solution was then separated from the water layer thereof. The organic layer was added dropwise to 120 mL of methanol to deposit a precipitate. The precipitate was filtrated and was then dried to obtain a yellow solid. This yellow solid was dissolved in 11 mL of toluene, and the solution was then subjected to column chromatography using silica gel and activated alumina so that it was concentrated to dryness. The obtained solid was dissolved in toluene, and the obtained solution was then added dropwise to methanol to deposit a precipitate. The thus obtained precipitate was filtrated and was then dried, so as to obtain 103 mg of a composition D.

From the results of NMR analysis, it was found that the composition D was a composition, which comprised a polymer 3 represented by the following formula:

(Polymer 3)

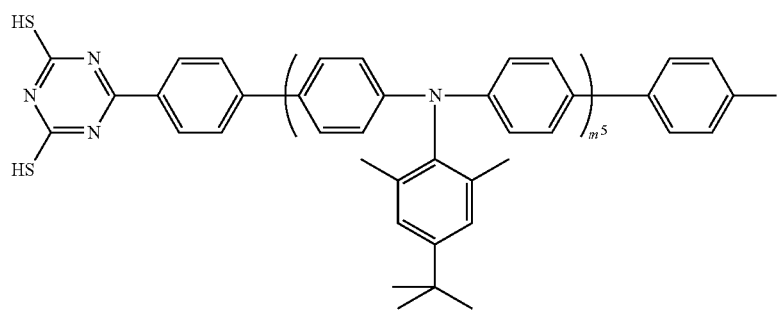

wherein m⁵ represents the degree of polymerization, and a polymer 4 represented by the following formula:

(Polymer 4)

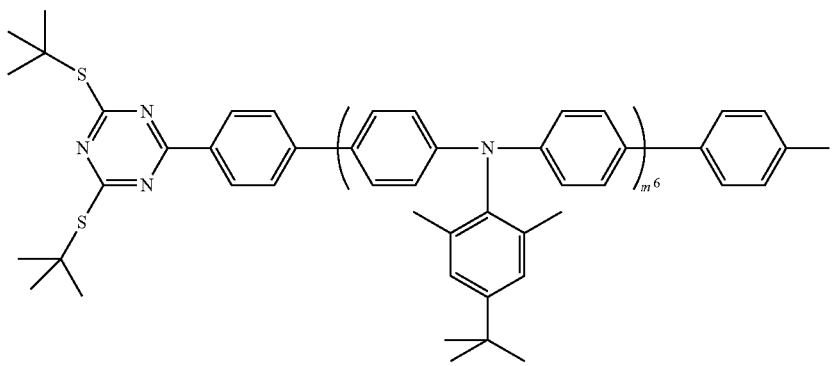

wherein m⁶ represents the degree of polymerization, at a molar ratio of 27:73. In addition, the polystyrene equivalent number average molecular weight Mn of the composition D was $5.2 \times 10^3$, and the polystyrene equivalent weight average molecular weight Mw of the composition D was $9.8 \times 10^3$. Since the —S-t-Bu portion was converted to —SH during the polymerization, a deprotection step was omitted.

Synthesis Example 1

Synthesis of Polymer F

To a 25-mL double-necked flask, 500 mg of a compound B (0.85 mmol) represented by the following formula:

(Compound B)

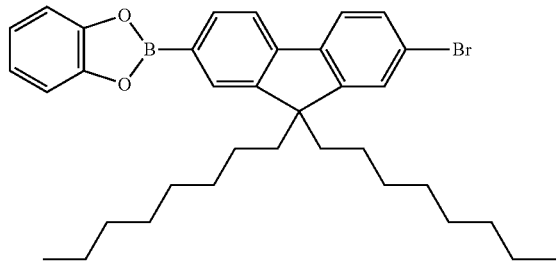

and 3.9 mg of 4-(4,4,5,5-tetramethyl-1,3,2-dioxaborolan-2-yl)toluene (0.018 mmol) were added, and the inside of the flask was then substituted with argon gas. To such a flask, 18 mL of toluene was added, and the obtained mixture was then stirred at 45° C. for 5 minutes. Subsequently, 1.17 mg of tris(dibenzylideneacetone)dipalladium (0.0013 mmol) and 3.6 mg of tris(2-methoxyphenyl)phosphine (0.0102 mmol) were added to the reaction solution, and the obtained mixture was then stirred at 45° C. for 10 minutes. Then, 3.9 mL of 33-mass-% cesium carbonate aqueous solution was added to the reaction solution, and the obtained mixture was then stirred at 45° C. for 5 minutes. Subsequently, the reaction solution was stirred at 110° C. for 3 hours. Thereafter, 108.8 mg of 4-t-butylbromobenzene (0.51 mmol) and 4 mL of toluene were added to the reaction solution, and then, 1.17 mg of tris(dibenzylideneacetone)dipalladium (0.0013 mmol), 3.6 mg of tris(2-methoxyphenyl)phosphine (0.0102 mmol), and 2.2 mL of 33-mass-% cesium carbonate aqueous solution were added thereto, and the obtained mixture was stirred at 110° C. for 1.5 hours. Thereafter, the reaction solution was cooled to a room temperature, and the organic layer of the reaction solution was then separated from the water layer thereof. The organic layer was added dropwise to 240 mL of methanol to deposit a precipitate. The precipitate was filtrated and was then dried to obtain a yellow solid. This yellow solid was dissolved in 33 mL of toluene, and the solution was then subjected to column chromatography using silica gel and activated alumina so that it was concentrated to dryness. The obtained solid was dissolved in toluene, and the obtained solution was then added dropwise to methanol to deposit a precipitate. The thus obtained precipitate was filtrated and was then dried, so as to obtain 267 mg of a polymer F.

The polystyrene equivalent number average molecular weight Mn of the polymer F was $6.6 \times 10^4$, and the polystyrene equivalent weight average molecular weight Mw of the polymer F was $1.6 \times 10^5$.

Synthesis Example 2

Synthesis of Polymer G

To a reaction vessel, 1.10 g of a compound B (1.9 mmol) represented by the following formula:

(Compound B)

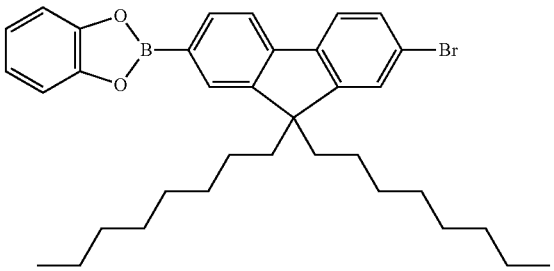

was added, and the inside of the flask was then substituted with argon gas. To such a flask, 8.4 mg of 4-t-butylbromobenzene (0.04 mmol) and 39.5 mL of toluene were added, and the obtained mixture was bubbled with Ar and was then stirred at 45° C. for 5 minutes.

Subsequently, 2.6 mg of tris(dibenzylideneacetone)dipalladium (0.003 mmol), 7.9 mg of tris(2-methoxyphenyl)phosphine (0.02 mmol), and 4.0 mL of toluene were added to the reaction solution, and the obtained mixture was then stirred at 45° C. for 10 minutes. Then, 8.5 mL of 33-mass-% cesium carbonate aqueous solution was added to the reaction solution, and the obtained mixture was then stirred at 114° C. for 30 minutes. Thereafter, 0.24 g of 4-(4,4,5,5-tetramethyl-1,3,2-dioxaborolan-2-yl)toluene (1.1 mmol) and 8.5 mL of toluene were added to the reaction solution, and then, 1.5 mg of tris(dibenzylideneacetone)dipalladium (0.002 mmol), 4.6 mg of tris(2-methoxyphenyl)phosphine (0.01 mmol), 2.0 mL of toluene, and 5.0 mL of 33-mass-% cesium carbonate aqueous solution were added thereto. The obtained mixture was stirred at 114° C. for 2 hours. Thereafter, the reaction solution was cooled to a room temperature, and the organic layer of the reaction solution was then separated from the water layer thereof. The organic layer was added dropwise to methanol, and the obtained precipitate was recovered by filtration to obtain a yellow solid. This yellow solid was dissolved in toluene, and the solution was then subjected to column chromatography using silica gel and activated alumina so that the eluant was concentrated. The obtained concentrate was added dropwise to methanol, and the deposited precipitate was recovered by filtration and was then dried, so as to obtain 0.64 g of a polymer G.

The polystyrene equivalent number average molecular weight Mn of the polymer G was $3.7 \times 10^4$, and the polystyrene equivalent weight average molecular weight Mw of the polymer G was $7.7 \times 10^4$.

Synthesis Example 3

Synthesis of bis(tri-t-butylphosphine)palladium

Bis(tri-t-butylphosphine)palladium was synthesized by the method described in J. Am. Chem. Soc. 98, 5850-5857 (1976).

Example 5

Production of Electroluminescent Device Using Laminated Structure 1 (Method (A))

An ITO substrate was washed with chloroform, methanol, an aqueous solution of alkaline detergent, distilled water and acetone, and it was then exposed to ozone gas for 1 minute, so as to remove matters attached on the surface of the ITO substrate. This ITO substrate was immersed in a THF solution (2.3 g/L) of the above described composition A containing the polymer 1, and it was then left at rest for 1 day. Thereafter, the substrate was removed from the solution, was washed by blowing THF on it, and was then dried by blowing Ar gas on it, so as to produce a polymer binding layer composed of an aromatic polymer compound having a polystyrene equivalent number average molecular weight of $7.9 \times 10^3$. At that time, the polymer binding layer had a film thickness of 61 nm, and the orbital energies of the LUMO and HOMO of the polymer 1 constituting the polymer binding layer, which were calculated by the above described B3LYP/6-31G* method, were −1.70 eV and −4.97 eV, respectively. Thereafter, the film was spin-coated with a conductive organic material consisting of the polymer F, the orbital energies of the LUMO and HOMO of which, calculated by the aforementioned method, were −1.70 eV and −4.97 eV, respectively, so that the film thickness of the conductive organic material became approximately 125 nm. Subsequently, the resultant substrate was further coated with 67 nm of gold via evaporation, and the current-voltage measurement of the obtained laminated structure 1 was then carried out. As a result, when a voltage of +4 V was applied, a current of $9.02 \times 10^{-6}$ A was flowed. The obtained results are shown in Table 2.

Example 6

Production of Electroluminescent Device Using Laminated Structure 2 (Method (A))

An ITO substrate was washed with chloroform, methanol, an aqueous solution of alkaline detergent, distilled water and acetone, and it was then exposed to ozone gas for 1 minute, so as to remove matters attached on the surface of the ITO substrate. This ITO substrate was immersed in a THF solution (2.3 g/L) of the above described composition D containing the polymer 3, and it was then left at rest for 1 day. Thereafter, the substrate was removed from the solution, was washed by blowing THF on it, and was then dried by blowing Ar gas on it, so as to produce a polymer binding layer composed of an aromatic polymer compound having a polystyrene equivalent number average molecular weight of $5.2 \times 10^3$. At that time, the polymer binding layer had a film thickness of 61 nm, and the orbital energies of the LUMO and HOMO of the polymer 3 constituting the polymer binding layer, which were calculated by the above described B3LYP/6-31G* method, were −0.89 eV and −4.37 eV, respectively. Thereafter, the film was spin-coated with a conductive organic material consisting of the polymer F, the orbital energies of the LUMO and HOMO of which, calculated by the aforementioned method, were −1.70 eV and −4.97 eV, respectively, so that the film thickness of the polymer F became approximately 125 nm. Subsequently, the resultant substrate was further coated with 78 nm of gold via evaporation, and the current-voltage measurement of the obtained laminated structure 2 was then carried out. As a result, when a voltage of +4 V was applied, a current of $1.22 \times 10^{-4}$ A was flowed. The obtained results are shown in Table 2.

Example 7

Production of Electroluminescent Device Using Laminated Structure 3 (Method (A))

An ITO substrate was washed with chloroform, methanol, an aqueous solution of alkaline detergent, distilled water and acetone, and it was then exposed to ozone gas for 1 minute, so as to remove matters attached on the surface of the ITO substrate. The ITO substrate was spin-coated with the above described composition A containing the polymer 1 so that the film thickness of the composition A became approximately 10 nm, and as a result, a polymer binding layer composed of an aromatic polymer compound having a polystyrene equivalent number average molecular weight of $7.9 \times 10^3$ was produced. The orbital energies of the LUMO and HOMO of the polymer 1 constituting the polymer binding layer, which were calculated by the above described B3LYP/6-31G* method, were −1.70 eV and −4.97 eV, respectively. Thereafter, the film was spin-coated with a conductive organic material consisting of the polymer F, the orbital energies of the LUMO and HOMO of which, calculated by the aforementioned method, were −1.70 eV and −4.97 eV, respectively, so that the film thickness of the conductive organic material became approximately 125 nm. Subsequently, the resultant substrate was further coated with 66 nm of gold via evaporation, and the current-voltage measurement of the obtained laminated structure 3 was then carried out. As a result, when a voltage of +4 V was applied, a current of $9.16 \times 10^{-7}$ A was flowed. The obtained results are shown in Table 2.

Comparative Example 1

Production of Electroluminescent Device Consisting of Polymer Film 1 for Comparison Use (which is not Laminated Structure)

An ITO substrate was washed with chloroform, methanol, an aqueous solution of alkaline detergent, distilled water and acetone, and it was then exposed to ozone gas for 1 minute, so as to remove matters attached on the surface of the ITO substrate. The ITO substrate was spin-coated with a conductive organic material consisting of the polymer F, the orbital energies of the LUMO and HOMO of which, calculated by the aforementioned B3LYP/6-31G* method, were −1.70 eV and −4.97 eV, respectively, so that the film thickness of the conductive organic material became approximately 125 nm. Subsequently, the resultant substrate was further coated with 67 nm of gold via evaporation, and the current-voltage measurement of the obtained polymer film 1 for comparison use was then carried out. As a result, when a voltage of +4 V was applied, a current of $7.90 \times 10^8$ A was flowed. The obtained results are shown in Table 2.

TABLE 2

| | Step | Laminated structure | Voltage applied (V) | Current (A) |
|---|---|---|---|---|
| Example 5 | A | Laminated structure 1 | +4 | $9.02 \times 10^{-6}$ |
| Example 6 | A | Laminated structure 2 | +4 | $1.22 \times 10^{-4}$ |
| Example 7 | $A^a$ | Laminated structure 3 | +4 | $9.16 \times 10^{-7}$ |
| Comparative Example 1 | — | Non laminated structure | +4 | $7.90 \times 10^{-8}$ |

The symbol "a" indicates coating step according to spin coating method.

<Evaluation>

As is clear from the results shown in Table 2, it is found that the laminated structure of the present invention supplied a larger amount of current than the polymer film for comparison use, which was not a laminated structure.

Example 8

Production of Electroluminescent Device Using Laminated Structure 4 (Method (A))

An ITO substrate was washed with chloroform, methanol, an aqueous solution of alkaline detergent, distilled water and acetone, and it was then exposed to ozone gas for 1 minute, so as to remove matters attached on the surface of the ITO substrate. This ITO substrate was coated with 92 nm of aluminum via evaporation. The obtained substrate was then immersed in a THF solution (2.3 g/L) of the above described composition A, and it was then left at rest for 4 days. Thereafter, the substrate was removed from the solution, was washed by blowing THF on it, and was then dried by blowing Ar gas on it, so as to produce a polymer binding layer composed of an aromatic polymer compound having a polystyrene equivalent number average molecular weight of $7.9 \times 10^3$. At that time, the polymer binding layer had a film thickness of 57 nm, and the orbital energies of the LUMO and HOMO of the polymer 1 constituting the polymer binding layer, which were calculated by the above described B3LYP/6-31G* method, were −1.70 eV and −4.97 eV, respectively. Thereafter, the film was spin-coated with a conductive organic material consisting of the polymer F, the orbital energies of the LUMO and HOMO of which, calculated by the aforementioned method, were −1.70 eV and −4.97 eV, respectively, so that the film thickness of the conductive organic material became approximately 85 nm. Subsequently, the resultant substrate was further coated with 84 nm of aluminum via evaporation, and the current-voltage measurement of the obtained laminated structure 4 was then carried out. As a result, when a voltage of +8 V was applied, a current of $3.31 \times 10^{-6}$ A was flowed. The obtained results are shown in Table 3.

Comparative Example 2

Production of Electroluminescent Device Consisting of Polymer Film 2 for Comparison Use (which is not Laminated Structure)

An ITO substrate was washed with chloroform, methanol, an aqueous solution of alkaline detergent, distilled water and acetone, and it was then exposed to ozone gas for 1 minute, so as to remove matters attached on the surface of the ITO substrate. This ITO substrate was coated with 86 nm of aluminum via evaporation. The ITO substrate was spin-coated with a conductive organic material consisting of the polymer F, the orbital energies of the LUMO and HOMO of which, calculated by the aforementioned B3LYP/6-31G* method, were −1.70 eV and −4.97 eV, respectively, so that the film thickness of the conductive organic material became approximately 85 nm. Subsequently, the resultant substrate was further coated with 94 nm of aluminum via evaporation, and the current-voltage measurement of the obtained polymer film 2 for comparison use was then carried out. As a result, when a voltage of +8 V was applied, a current of $1.20 \times 10^{-6}$ A was flowed. The obtained results are shown in Table 3.

TABLE 3

| | Step | Laminated structure | Voltage applied (V) | Current (A) |
|---|---|---|---|---|
| Example 8 | A | Laminated structure 4 | +8 | $3.31 \times 10^{-6}$ |
| Comparative Example 2 | — | Non laminated structure | +8 | $1.20 \times 10^{-6}$ |

<Evaluation>

As is clear from the results shown in Table 3, it is found that the laminated structure of the present invention supplied a larger amount of current than the polymer film for comparison use, which was not a laminated structure.

Example 9

Production of Electroluminescent Device Using Laminated Structure 5 (Method (B))

Two ITO substrates were each washed with a sodium hydroxide aqueous solution, hydrochloric acid and water, and then, were each exposed to ozone gas for 1 minute, so as to remove matters attached on the surface of each ITO substrate. The two ITO substrates were each immersed in an ethanol solution (4 mM) of a compound H represented by the following formula:

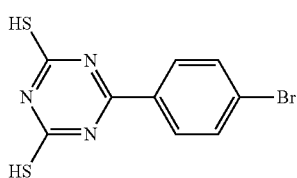
(Compound H)

Thereafter, these substrates were removed from the solution, and were washed with ethanol and were then dried. Subsequently, these substrates were each immersed in a toluene solution (15 mM) of bis(tri-t-butylphosphine)palladium, and were heated at 70° C. for 2 hours. Thereafter, the substrates were removed from the solution, and were washed with toluene and were then dried. Thereafter, these substrates were each immersed in a solution, in which a THF solution (25 mM) of a compound (I) represented by the following formula:

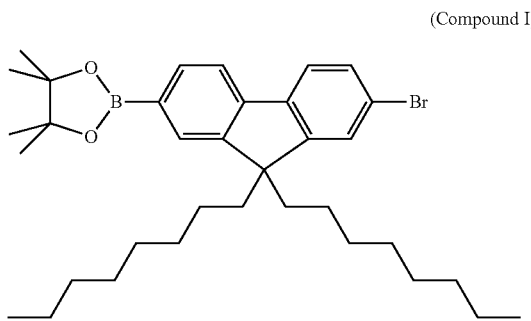 [SMILES: CCCCCCCCC1(CCCCCCCC)c2cc(Br)ccc2-c2ccc(B3OC(C)(C)C(C)(C)O3)cc21]
(Compound I)

was mixed with a sodium carbonate aqueous solution (2 M) at a volume ratio of 2:1, and this mixed solution was then stirred at a room temperature for 2 hours. Thereafter, these substrates were removed from the solution, and were washed with toluene, methanol and distilled water, and were then dried, so as to form a polymer binding layer on each ITO substrate. The film thickness of this polymer binding layer was 236 nm.

From one of the two substrates, on each of which the polymer binding layer was produced, an aromatic polymer compound which constituted the polymer binding layer on the ITO substrate was recovered by supplying chloroform onto it. This recovery operation was repeatedly carried out while applying a UV lamp to the substrate, until light emission from the aromatic polymer compound could not be confirmed. The recovered washing solution was concentrated, and the molecular weight of the obtained aromatic polymer compound was analyzed using gel permeation chromatography (GPC) (manufactured by Shimadzu Corporation; LC-10 series) equipped with a fluorescence detector (manufactured by Agilent Technologies; trade name: Agilent 1100 Series). As a result, it was found that the aromatic polymer compound had a polystyrene equivalent average molecular weight Mn of $5.5 \times 10^4$ and a polystyrene equivalent weight number average molecular weight Mw of $9.9 \times 10^4$. Moreover, the orbital energies of the LUMO and HOMO of the aromatic polymer compound, which were calculated by the above described B3LYP/6-31G* method, were −1.70 eV and −4.97 eV, respectively.

Subsequently, the polymer binding layer of the other substrate was spin-coated with a conductive organic material consisting of the polymer Cc the orbital energies of the LUMO and HOMO of which, calculated by the aforementioned method, were −1.70 eV and −4.97 eV, respectively, so that the film thickness of the conductive organic material became approximately 500 nm. Thereafter, the substrate was further coated with 100 nm of gold via evaporation, and the current-voltage measurement of the obtained laminated structure 5 was then carried out. As a result, when a voltage of +3 V was applied, a current of $1.1 \times 10^{-8}$ A was flowed, and when a voltage of +6 V was applied, a current of $1.0 \times 10^{-7}$ A was flowed. The obtained results are shown in Table 4.

Comparative Example 3

Production of Electroluminescent Device Consisting of Polymer Film 3 for Comparison Use (which is not Laminated Structure)

An ITO substrate was exposed to ozone gas for 1 minute to remove matters attached on the surface thereof.

The ITO substrate was spin-coated with a conductive organic material consisting of the polymer G, the orbital energies of the LUMO and HOMO of which, calculated by the aforementioned B3LYP/6-31G* method, were −1.70 eV and −4.97 eV, respectively, so that the film thickness of the conductive organic material became approximately 500 nm. Subsequently, the resultant substrate was further coated with approximately 100 nm of gold via evaporation, and the current-voltage measurement of the obtained polymer film 3 for comparison use was then carried out. As a result, when a voltage of +3 V was applied, a current of $1.3 \times 10^{-10}$ A was flowed, and when a voltage of +6 V was applied, a current of $2.0 \times 10^{-10}$ A was flowed. The obtained results are shown in Table 4.

TABLE 4

| | Step | Laminated structure | Voltage applied (V) | Current (A) |
|---|---|---|---|---|
| Example 9 | B | Laminated structure 5 | +3 | $1.1 \times 10^{-8}$ |
| | | | +6 | $1.0 \times 10^{-7}$ |
| Comparative Example 3 | — | No laminated structure | +3 | $1.3 \times 10^{-10}$ |
| | | | +6 | $2.0 \times 10^{-10}$ |

<Evaluation>

As is clear from the results shown in Table 4, it is found that the laminated structure of the present invention supplied a larger amount of current than the polymer film for comparison use, which was not a laminated structure.

Example 10

Production of Electroluminescent Device Using Laminated Structure 6 (Method (B))

Two silver substrates were each immersed in an ethanol solution (4 mM) of a compound H represented by the following formula:

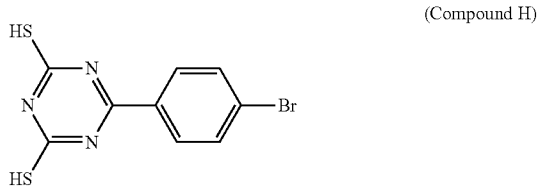 [SMILES: Sc1nc(S)nc(-c2ccc(Br)cc2)n1]
(Compound H)

Thereafter, these substrates were removed from the solution, and were washed with ethanol and were then dried. Subsequently, these substrates were each immersed in a toluene solution (15 mM) of bis(tri-t-butylphosphine)palladium, and were heated at 70° C. for 2 hours. Thereafter, the substrates were removed from the solution, and were washed with toluene and were then dried. Thereafter, these substrates were each immersed in a solution, in which a THF solution (25 mM) of a compound I represented by the following formula:

(Compound I)

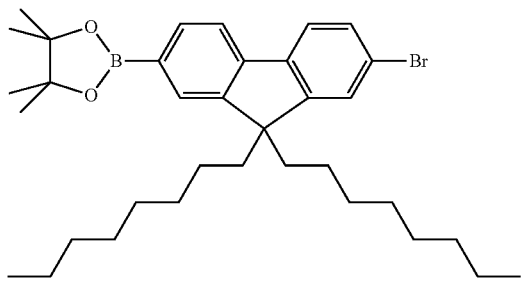

was mixed with a sodium carbonate aqueous solution (2 M) at a volume ratio of 2:1, and this mixed solution was then stirred at a room temperature for 2 hours. Thereafter, these substrates were removed from the solution, and were washed with toluene, methanol and distilled water and were then dried, so as to form a polymer binding layer on each silver substrate. The film thickness of this polymer binding layer was 152 nm.

From one of the two substrates, on each of which the polymer binding layer was produced, an aromatic polymer compound which constituted the polymer binding layer on the silver substrate was recovered by supplying chloroform onto it. This recovery operation was repeatedly carried out while applying a UV lamp to the substrate, until light emission from the aromatic polymer compound could not be confirmed. The recovered washing solution was concentrated, and the molecular weight of the obtained aromatic polymer compound was analyzed using gel permeation chromatography (GPC) (manufactured by Shimadzu Corporation; LC-10 series) equipped with a fluorescence detector (manufactured by Agilent Technologies; trade name: Agilent 1100 Series). As a result, it was found that the aromatic polymer compound had a polystyrene equivalent number average molecular weight Mn of $8.5 \times 10^4$ and a polystyrene equivalent weight average molecular weight Mw of $1.57 \times 10^5$. Moreover, the orbital energies of the LUMO and HOMO of the aromatic polymer compound, which were calculated by the above described B3LYP/6-31G* method, were −1.70 eV and −4.97 eV, respectively.

Subsequently, the polymer binding layer of the other substrate was spin-coated with a conductive organic material consisting of the polymer the orbital energies of the LUMO and HOMO of which, calculated by the aforementioned method, were −1.70 eV and −4.97 eV, respectively, so that the film thickness of the conductive organic material became approximately 500 nm. Thereafter, the substrate was further coated with 200 nm of aluminum via evaporation, and the current-voltage measurement of the obtained laminated structure 6 was then carried out. As a result, when a voltage of −4 V was applied, a current of $4.8 \times 10^{-10}$ A was flowed. The obtained results are shown in Table 5.

Comparative Example 4

Production of Electroluminescent Device Consisting of Polymer Film 4 for Comparison Use (which is not Laminated Structure)

A silver substrate was spin-coated with a conductive organic material consisting of the polymer G the orbital energies of the LUMO and HOMO of which, calculated by the aforementioned B3LYP/6-31G* method, were −1.70 eV and −4.97 eV, respectively, so that the film thickness of the conductive organic material became approximately 500 nm. Subsequently, the resultant substrate was further coated with approximately 200 nm of aluminum via evaporation, and the current-voltage measurement of the obtained polymer film 4 for comparison use was then carried out. As a result, when a voltage of −4 V was applied, a current of $1.1 \times 10^{-11}$ A was flowed. The obtained results are shown in Table 5.

TABLE 5

| | Step | Laminated structure | Voltage applied (V) | Current (A) |
|---|---|---|---|---|
| Example 10 | B | Laminated structure 6 | −4 | $4.8 \times 10^{-10}$ |
| Comparative Example 4 | — | Non laminated structure | −4 | $1.1 \times 10^{-11}$ |

<Evaluation>

As is clear from the results shown in Table 5, it is found that the laminated structure of the present invention supplied a larger amount of current than the polymer film for comparison use, which was not a laminated structure.

INDUSTRIAL APPLICABILITY

As described above, according to the compound of the present invention, there can be formed a polymer binding layer, to which electricity is efficiently supplied from an electrode. Moreover, according to the laminated structure of the present invention, electricity can be efficiently supplied from an electrode to a polymer binding layer through a bonding portion of an aromatic polymer compound that is bonded to the electrode. Furthermore, electricity can be efficiently supplied from a polymer binding layer to a conductive organic material layer through the terminal portion of an aromatic polymer compound.

Therefore, the laminated structure of the present invention is useful as an electroluminescent device, which requires a low voltage for driving it and low power consumption.

The invention claimed is:

1. A laminated structure comprising an electrode, a polymer binding layer disposed on the electrode, and a conductive organic material layer disposed on the polymer binding layer, wherein the polymer binding layer is composed of an aromatic polymer compound having a structure represented by the following formula (V):

wherein G is an r+p valent group having an aromatic ring; $X^1$ is a terminal group; r is an integer of 1 or greater and 10 or smaller, n and p are each independently an integer of 1 or greater, and if r is 2 or greater, the plurality of E present may be identical to or different from one another, and if n is 2 or greater, the plurality of $Ar^1$ present may be identical to or different from one another, and if p is 2 or greater, the plurality of $X^1$ present may be identical to or different from one another, wherein E is a binding group formed by a chemical bond between a monovalent group selected from the group consisting of a mercapto group, a hydroxy group, a carboxyl group, a sulfonic acid group, a phosphonic acid group, a trialkoxysilyl group, a trihydroxysilyl group, a chlorocarbonyl group, a chlorophosphonic acid group, a chlorosulfonic acid group, a cyanate group, an isocyanate group, an amino group, a substituted amino group and a substituted disulfide group, and a reactive group which is present on an Electrode Surface, wherein $Ar^1$ comprises a repeating unit represented by the following formula (VI):

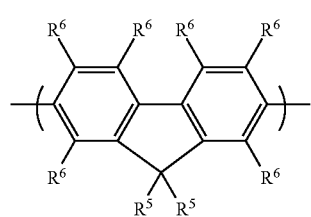

(VI)

wherein $R^5$ is a hydrogen atom, an alkyl group, an aryl group, an arylalkyl group or a monovalent heterocyclic group, wherein the alkyl group, the aryl group, the arylalkyl group and the monovalent heterocyclic group each may optionally have a substituent, and $R^6$ is a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, a carbamoyl group, an imide residue, a monovalent heterocyclic group, a carboxyl group, a substituted carboxyl group or a cyano group, wherein the alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the acyl group, the acyloxy group, the carbamoyl group and the monovalent heterocyclic group each may optionally have a substituent, wherein the plurality of $R^5$ and $R^6$ present may be identical to or different from one another, and if $R^5$ and $R^6$, which are alkyl groups optionally having a substituent, are each present in a plural number, they may be bonded to each other to form a ring in an amount of 0.1% by mass or more with respect to the total mass of the number of all repeating units in the aromatic polymer compound which constitutes the polymer binding layer, and/or comprises a repeating unit represented by the following formula (VII):

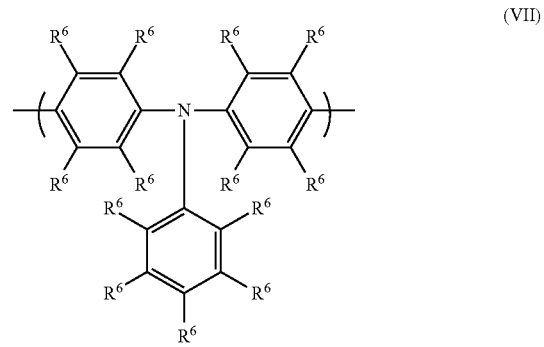

(VII)

wherein $R^6$ has the same definitions as in the formula (VI):
in an amount of 0.1% by mass or more with respect to the total mass of the number of all repeating units in the aromatic polymer compound which constitutes the polymer binding layer, and having a polystyrene equivalent number average molecular weight of $1 \times 10^3$ or more and $1 \times 10^8$ or less, the polymer binding layer is connected to the electrode via a chemical bond between the aromatic polymer compound and the Electrode Surface.

2. The laminated structure according to claim 1, wherein a film thickness of the polymer binding layer is from 0.1 nm to 100 µm, and a film thickness of the layer in the conductive organic material layer adjacent to the polymer binding layer is from 0.1 nm to 1 cm.

3. The laminated structure according to claim 1, wherein an orbital energy of the lowest unoccupied molecular orbital (LUMO) of the aromatic polymer compound is −4.0 eV or more and −0.5 eV or less, and/or an orbital energy of the highest occupied molecular orbital (HOMO) of the aromatic polymer compound is −6.0 eV or more and −4.0 eV or less.

4. The laminated structure according to claim 1, wherein a difference between the orbital energy of the LUMO of the aromatic polymer compound and an orbital energy of the LUMO of the conductive organic material which constitutes the layer in the conductive organic material layer adjacent to the polymer binding layer is −2.5 eV or more and +2.5 eV or less, and/or a difference between the orbital energy of the HOMO of the aromatic polymer compound and an orbital energy of the HOMO of the conductive organic material which constitutes the layer in the conductive organic material layer adjacent to the polymer binding layer is −1.5 eV or more and +1.5 eV or less.

5. The laminated structure according to claim 1, wherein the electrode comprises at least one electroconductive compound selected from the group consisting of a base metal, a noble metal and an oxide thereof.

6. The laminated structure according to claim 1, wherein the polymer binding layer is formed by immersing the electrode in a solution containing a conjugated polymer represented by the following formula (II) at a concentration of 0.0001% by mass or more, and/or by coating the electrode with the solution:

(II)

wherein $Ar^1$, G, $X^1$, r, n, p, and r are as defined previously, wherein if r is 2 or greater, the plurality of $E^a$ present may be identical to or different from one another, and wherein $E^a$ is a monovalent group selected from the group consisting of a mercapto group, a hydroxy group, a carboxyl group, a sulfonic acid group, a phosphonic acid group, a trialkoxysilyl group, a trihydroxysilyl group, a chlorocarbonyl group, a chlorophosphonic acid group, a chlorosulfonic acid group, a cyanate group, an isocyanate group, an amino group, a substituted amino group, and a substituted disulfide group.

7. The laminated structure according to claim 1, wherein the binding group E in the formula (V) is a binding group formed by at least one selected from the group consisting of a covalent bond, a coordinate bond, a hydrogen bond and an ionic bond, which are formed between the monovalent group and the reactive group which is present on the Electrode Surface.

8. The laminated structure according to claim 1, wherein the monovalent group is a monovalent group selected from the group consisting of a mercapto group, a carboxyl group, a sulfonic acid group, a phosphonic acid group, a chlorocarbonyl group, a chlorophosphonic acid group and a chlorosulfonic acid group.

9. The laminated structure according to claim 1, wherein r in the formula (V) is an integer of 1 or greater and 3 or smaller (provided that if G in the formula (V) is a monocyclic aromatic ring structure and the number of carbon atoms that constitute the ring structure is 2, r is 1, and if the number of the carbon atoms is 3, r is 1 or 2).

10. The laminated structure according to claim 1, wherein a total of the molar percentage of the repeating unit represented by the formula (VI) and the molar percentage of the repeating unit represented by the formula (VII) is 10 mole % or more and 100 mole % or less, with respect to a total of all repeating units in the aromatic polymer compound which constitutes the polymer binding layer.

11. The laminated structure according to claim 1, wherein G in the formula (V) is at least one r+p valent group selected from the group consisting of a monocycle optionally having a substituent, a condensed ring optionally having a substituent, a ring assembly optionally having a substituent, and a bridged polycycle optionally having a substituent.

12. The laminated structure according to claim 11, wherein the r+p valent group comprises at least one from among heterocyclic rings and aromatic rings represented by the following formulae (1) to (16):

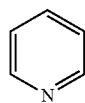

1

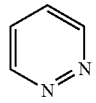

2

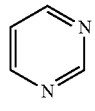

3

4

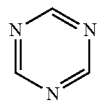

5

6

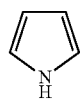

7

8

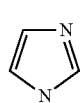

9

10

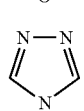

11

12

13

14

15

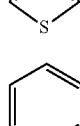

16

13. The laminated structure according to claim 12, wherein the r+p valent group comprises one heterocyclic ring represented by the formula (5).

14. An electronic device comprising the laminated structure according to claim 1.

15. The electronic device according to claim 14, which is an electroluminescent device.

16. The electronic device according to claim 14, which is a photoelectric conversion device.

17. A laminated structure comprising an electrode, a polymer binding layer disposed on the electrode, and a conductive organic material layer disposed on the polymer binding layer, wherein the polymer binding layer is composed of an aromatic polymer compound having a structure represented by the following formula (I):

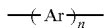 (I)

wherein Ar is a conjugated divalent group optionally having a substituent, and if a plurality of Ar are present, the Ar may be identical to or different from one another; and n is an integer of 1 or greater, and having a polystyrene equivalent number average molecular weight of $1 \times 10^3$ or more and $1 \times 10^8$ or less, the polymer binding layer is connected to the electrode via a chemical bond between the aromatic polymer compound and a surface of the electrode (hereinafter referred to as Electrode Surface), and a conductive organic material which constitutes a layer in the conductive organic material layer adjacent to the polymer binding layer has a polystyrene equivalent number average molecular weight of $3 \times 10^2$ or more and $1 \times 10^8$ or less wherein, in a solution, in the presence of an electrode, to a surface of which a group represented by the following formula (III) is bonded:

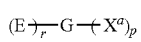 (III)

wherein G is an r+p valent group having an aromatic ring; $X^a$ is a halogen atom or a group represented by $-SO_3Q^a$ (wherein $Q^a$ represents an alkyl group or an aryl group, and the alkyl group and the aryl group may optionally have a substituent); r is an integer of 1 or greater and 10 or smaller, p is an integer of 1 or greater, and if p is 2 or greater, the plurality of $X^a$ present may be identical to or different from one another; E is a binding group formed by a chemical bond between a monovalent group selected from the group consisting of a mercapto group, a hydroxy group, a carboxyl group, a sulfonic acid group, a phosphonic acid group, a trialkoxysilyl group, a trihydroxysilyl group, a chlorocarbonyl group, a chlorophosphonic acid group, a chlorosulfonic acid group, a cyanate group, an isocyanate group, an amino group, a substituted amino group and a substituted disulfide group, and a reactive group which is present on the Electrode Surface, the polymer binding layer is formed by polycondensing an aromatic compound represented by the following formula (IV):

 (IV)

wherein $Ar^1$ is a divalent group having an aromatic ring; M is a halogen atom, a hydrogen atom, or a group represented by $-B(OQ^1)_2$ (wherein $Q^1$ are each independently a hydrogen atom, an alkyl group or an aryl group, or they may be bonded to each other to form a ring, and the alkyl group and the aryl group may optionally have a substituent), $-Si(Q^2)_3$ (wherein $Q^2$ is an alkyl group or an alkoxy group, and the alkyl group and the alkoxy group may optionally have a substituent), $-Sn(Q^3)_3$ (wherein $Q^3$ is an alkyl group optionally having a substituent) or $-SO_3Q^a$ (wherein $Q^a$ is an alkyl group or an aryl group, and the alkyl group and the aryl group may optionally have a substituent), or $-Z^1(Z^2)_m$ (wherein $Z^1$ is a metallic atom or a metallic ion, $Z^2$ is a counteranion), wherein two M present may be identical to or different from each other, using a polymerization catalyst or an equivalently reactive reactant.

18. A method for producing a laminated structure comprising:

a step of forming, on an electrode, a polymer binding layer, which is composed of an aromatic polymer compound having a structure represented by the following formula (V):

 (I)

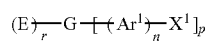 (V)

wherein G is an r+p valent group having an aromatic ring; $X^1$ is a terminal group; r is an integer of 1 or greater and 10 or smaller, n and p are each independently an integer of 1 or greater, and if r is 2 or greater, the plurality of E present may be identical to or different from one another, and if n is 2 or greater, the plurality of $Ar^1$ present may be identical to or different from one another, and if p is 2 or greater, the plurality of $X^1$ present may be identical to or different from one another, wherein E is a binding group formed by a chemical bond between a monovalent group selected from the group consisting of a mercapto group, a hydroxy group, a carboxyl group, a sulfonic acid group, a phosphonic acid group, a trialkoxysilyl group, a trihydroxysilyl group, a chlorocarbonyl group, a chlorophosphonic acid group, a chlorosulfonic acid group, a cyanate group, an isocyanate group, an amino group, a substituted amino group and a substituted disulfide group, and a reactive group which is present on an Electrode Surface, wherein $Ar^1$ comprises a repeating unit represented by the following formula (VI):

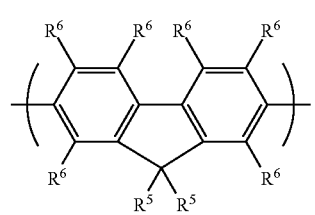 (VI)

wherein $R^5$ is a hydrogen atom, an alkyl group, an aryl group, an arylalkyl group or a monovalent heterocyclic group, wherein the alkyl group, the aryl group, the arylalkyl group and the monovalent heterocyclic group each may optionally have a substituent; and $R^6$ is a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, a carbamoyl group, an imide residue, a monovalent heterocyclic group, a carboxyl group, a substituted carboxyl group or a cyano group, wherein the alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the acyl group, the acyloxy group, the carbamoyl group and the monovalent heterocyclic group each may optionally have a sub stituent, wherein the plurality of $R^5$ and $R^6$ present may be identical to or different from one another, and if $R^5$ and $R^6$, which are alkyl groups optionally having a substituent, are each present in a plural number, they may be bonded to each other to form a ring in an amount of 0.1% by mass or more with respect to the total mass of the number of all repeating units in the aromatic polymer compound which constitutes the polymer binding layer, and/or comprises a repeating unit represented by the following formula (VII):

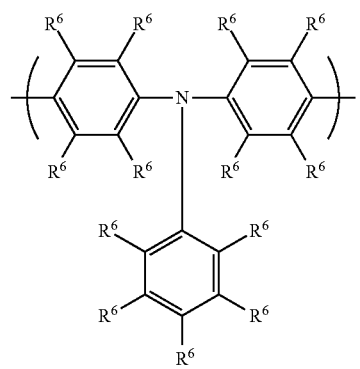

(VII)

wherein $R^6$ has the same definitions as in the formula (VI):
in an amount of 0.1% by mass or more with respect to the total mass of the number of all repeating units in the aromatic polymer compound which constitutes the polymer binding layer,
and having a polystyrene equivalent number average molecular weight of $1\times10^3$ or more and $1\times10^8$ or less, wherein the aromatic polymer compound is chemically bonded to the Electrode Surface, and
a step of forming a layer composed of a conductive organic material having a polystyrene equivalent number average molecular weight of $3\times10^2$ or more and $1\times10^8$ or less on the polymer binding layer.

* * * * *